United States Patent
Uchida et al.

(10) Patent No.: US 6,829,266 B2
(45) Date of Patent: Dec. 7, 2004

(54) OPTICAL SEMICONDUCTOR DEVICE INCREASING PRODUCTIVITY AND METHOD OF FABRICATING THE SAME

(75) Inventors: Kenji Uchida, Kanagawa (JP); Koki Hirasawa, Kanagawa (JP)

(73) Assignee: NEC Compound Semiconductor Devices, Ltd. (JP)

( * ) Notice: Subject to any disclaimer, the term of this patent is extended or adjusted under 35 U.S.C. 154(b) by 28 days.

(21) Appl. No.: 10/406,719

(22) Filed: Apr. 3, 2003

(65) Prior Publication Data

US 2003/0231673 A1 Dec. 18, 2003

(30) Foreign Application Priority Data

Apr. 3, 2002 (JP) .................................... 2002-100767

(51) Int. Cl.[7] .............................. H01S 3/04; H01S 5/00
(52) U.S. Cl. ......................................... 372/36; 372/43
(58) Field of Search ..................................... 372/36, 43

(56) References Cited

U.S. PATENT DOCUMENTS 5,309,460 A  * 5/1994 Fujimaki et al. ............. 372/36
5,945,891 A  * 8/1999 Emrick et al. ................ 333/26
6,020,632 A  * 2/2000 Barone et al. ............... 257/704

FOREIGN PATENT DOCUMENTS

| JP | 02-125688 | * 5/1990 | .................. 372/43 |
| JP | 03-188692 | * 8/1991 | .................. 372/36 |
| JP | 2001-068778 | 3/2001 | ........... H01S/5/022 |
| JP | 2001-077262 | 3/2001 | ........... H01L/23/48 |

* cited by examiner

Primary Examiner—Quyen Leung
(74) Attorney, Agent, or Firm—Hayes Soloway P.C.

(57) ABSTRACT

An optical semiconductor device includes: an insulating base; and a lead structure which further includes: a flange supported on a first surface of the insulating base; at least a first type lead supported by the insulating base; at least an island for mounting at least an optical semiconductor element thereon, which is electrically connected to the at least first type lead; and at least a connection part extending between the at least island and the flange. The flange, the at least connection part, and the at least island comprise a single united part of the lead structure. The flange, the at least connection part, the at least island, and the at least first type lead comprise a same conductive material.

33 Claims, 48 Drawing Sheets

US 6,829,266 B2

OPTICAL SEMICONDUCTOR DEVICE INCREASING PRODUCTIVITY AND METHOD OF FABRICATING THE SAME

BACKGROUND OF THE INVENTION

1. Field of the Invention

The present invention relates to an optical semiconductor device which packages or contains an optical semiconductor element therein, and more particularly to an optical semiconductor device which allows an increase in productivity thereof through a possible simplification to assembling processes, and a method of fabricating the same.

All of patents, patent applications, patent publications, scientific articles and the like, which will hereinafter be cited or identified in the present application, will, hereby, be incorporated by references in their entirety in order to describe more fully the state of the art, to which the present invention pertains.

2. Description of the Related Art

One of the typical optical semiconductor devices is a semiconductor laser device, which has such a structure as packaging a laser diode which is supplied with a current through leads for allowing the laser diode to emit a laser beam. FIG. 1 is a schematic perspective view illustrative of a conventional general structure of a semiconductor laser device. The semiconductor laser device includes a stem 201 having an upper surface united with a post 202, and a plurality of lead 204, which penetrate the stem 201 and are separated by insulation materials 203 from the stem 201, as well as a laser diode LD mounted on one side face of the post 202 and a photo-diode PD mounted on a part of the upper surface of the stem 201.

The laser diode LD and the photo-diode PD are mounted thereon by die-bonding processes. The united structure of the stem 201 and the post 202 may be formed by processing a metal material. Each of the plural leads 204 is electrically connected through a metal wiring 205 to either one of the laser diode LD and the photo-diode PD. The laser diode LD is also electrically connected through the metal wiring 205 to the post 202 or indirectly connected to the stem 201. The semiconductor laser device also includes a cap 206 placed on the upper surface of the stem 201 for covering the above elements mounted over the upper surface of the stem 201. The stem 201 has a generally disk-like shape. The cap 206 has a generally cylinder shape. A periphery of the cap 206 is fusion-spliced with the stem 201. The cap 206 also has a circular-shaped opening window. The metal wirings 205 are provided by a wire bonding process.

The united structure of the stem 201 and the post 202 may be formed by a machining or cutting process for a metal material or by welding the post 202 to the stem 201. Since the stem 201 is made of the metal material, it is necessary to provide the insulating material 203 which electrically isolates the each lead 204 from the stem 201, wherein the each lead 204 is supported via the insulating material 203 to the stem 201. There are many fabrication steps for forming the stem assembly. This makes it difficult to realize desired batch-fabrication processes for processing and assembling plural semiconductor laser devices concurrently. This provides bars to realize desired cost reduction and to improve the accuracy in dimension of the device.

It is further necessary to mount the laser diode LD and the photo-diode PD on the stem assembly, for which purposes, the stem assembly is subjected to the die-bonding process, the wire-bonding process and the fusion-splicing process. In each of those process, the stem assembly is loaded into and unloaded from as well as positioned in each of equipments for taking place those processes. Those processes lower the productivity and make it difficult to realize the desired cost reduction. Lowering the accuracy in positioning of the stem assembly in the equipment causes lowering respective accuracy in the die-bonding process and the wire-bonding process, thereby making it difficult to obtain a high quality semiconductor laser device.

FIG. 2 is a schematic perspective view illustrative of another conventional structure of a semiconductor laser device disclosed in Japanese laid-open patent publication 2001-77262. This conventional technique is to simplify the fabrication processes for the stem assembly. The semiconductor laser device includes a stem 301 which further comprises a cylindrically shaped body 302 with a top narrow rim, a flange 303 united with a bottom peripheral edge of the cylindrically shaped body 302, and an extension strip extending from an inside peripheral edge of the top narrow rim of the cylindrically shaped body 302, wherein the extension strip 304 is bent at a right angle, so that a top of the extension strip extends in a vertical direction to form a vertical plate or a vertical wall which serves as a mount 304. This stem 301 may be formed by a press working from a metal sheet or a metal plate. Further, an insulating material 305 such as a resin material is filled into an inner space of the cylindrically shaped body 302. Plural leads 306 penetrate the insulating material 305, so that the plural leads 306 are supported by the insulating material 305 and electrically separated from the stem 301 by the insulating material 305. A submount 307 is attached onto the mount 304. A laser diode LD and a photodiode PD are mounted on the submount 307. The laser diode LD and the photo-diode PD are electrically connected by a wire-bonding process through metal wirings 308 to the leads 306.

This conventional technique shown in FIG. 2 is advantageous as compared to the above-described conventional technique shown in FIG. 1 in view of simplifying the fabrication processes for the stem and improving the dimensional accuracy of the device. Further, a cap is attached to the stem 301 by the fusion-splicing process, even the illustration of the cap is not omitted in FIG. 2.

Accordingly, the conventional technique shown in FIG. 2 still need the die-bonding process, the wire-bonding process and the fusion-splicing process. In each of those process, the stem assembly is loaded into and unloaded from as well as positioned in each of equipments for taking place those processes. Those processes lower the productivity and make it difficult to realize the desired cost reduction. Lowering the accuracy in positioning of the stem assembly in the equipment causes lowering respective accuracy in the die-bonding process and the wire-bonding process, thereby making it difficult to obtain a high quality semiconductor laser device.

FIG. 3 is a schematic perspective view illustrative of still another conventional structure of a semiconductor laser device disclosed in Japanese laid-open patent publication 2001-68778. Plural leads 301 comprising lead frames are encapsulated with a resin package 302 which has a generally thin box-shape. A sub-mount 303 is provided on a part of one of the leads 301. A photo-diode PD and a laser diode LD are mounted on the sub-mount 303. The photo-diode PD and the laser diode LD are further electrically connected to other ones of the leads 301 through flexible wirings 304. Each of the lead frames may be formed by a press working from a metal sheet or a metal plate. This simplifies the fabrication processes and allows arty improvement in the dimensional accuracy of the lead frames. In this case, the package 302 should have a flat-box-shape as shown in FIG. 3. It is, however, difficult to realize this conventional technique by a can-shaped or cylinder-shaped semiconductor laser device as shown in FIGS. 1 and 2. This flat-box-shaped semiconductor laser device as shown in FIG. 3 is inferior in heat radiation capability as compared to the above-described cylinder-shaped semiconductor laser device as shown in FIGS. 1 and 2. This conventional technique is not applicable to any optical devices including the cylinder-shaped semiconductor laser. It is necessary for applying this conventional technique to change in design of the device.

In the above circumstances, the development of a novel optical semiconductor device free from the above problems is desirable.

SUMMARY OF THE INVENTION

Accordingly, it is an object of the present invention to provide a novel optical semiconductor device free from the above problems.

It is a further object of the present invention to provide a novel optical semiconductor device which allows for realizing a high productivity thereof.

It is a still further object of the present invention to provide a novel optical semiconductor device which has a high quality and exhibits high performances.

It is yet a further object of the present invention to provide a novel optical semiconductor device which has a package of a canned-shape or cylinder shape.

It is moreover object of the present invention to provide a novel optical semiconductor device which has a high heat radiation capability.

It is moreover object of the present invention to provide a novel optical semiconductor device which allows for positioning the optical semiconductor device at a high accuracy with reference to a light source position of an optical equipment.

It is still more object of the present invention to provide a novel optical semiconductor device which allows batch fabrication processes for a plurality of the optical semiconductor devices.

It is yet more object of the present invention to provide a novel optical semiconductor device which allows an automated assembling processes for a plurality of the optical semiconductor devices concurrently.

It is another object of the present invention to provide a novel method of forming an optical semiconductor device free from the above problems.

It is further another object of the present invention to provide a novel method of forming an optical semiconductor device which allows for realizing a high productivity thereof.

It is still another object of the present invention to provide a novel method of forming an optical semiconductor device which has a high quality and exhibits high performances.

It is yet another object of the present invention to provide a novel method of forming an optical semiconductor device which has a package of a canned-shape or cylinder shape.

It is an additional object of the present invention to provide a novel method of forming an optical semiconductor device which has a high heat radiation capability.

It is a further additional object of the present invention to provide a novel method of forming an optical semiconductor device which allows for positioning the optical semiconductor device at a high accuracy with reference to a light source position of an optical equipment.

It is a still additional object of the present invention to provide a novel method of forming an optical semiconductor device which allows batch fabrication processes for a plurality of the optical semiconductor devices.

It is yet an additional object of the present invention to provide a novel method of forming an optical semiconductor device which allows an automated assembling processes for a plurality of the optical semiconductor devices concurrently.

The present invention provides an optical semiconductor device includes: an insulating base; and a lead structure which further includes: a flange supported on a first surface of the insulating base; at least a first type lead supported by the insulating base; at least an island for mounting at least an optical semiconductor element thereon, which is electrically connected to the at least first type lead; and at least a connection part extending between the at least island and the flange. The flange, the at least connection part, and the at least island comprise a single united part of the lead structure. The flange, the at least connection part, the at least island, and the at least first type lead comprise a same conductive material.

The above and other objects, features and advantages of the resent invention will be apparent from the following descriptions.

BRIEF DESCRIPTION OF THE DRAWINGS

Preferred embodiments according to the present invention will be described in detail with reference to the accompanying drawings.

DETAILED DESCRIPTION OF THE PREFERRED EMBODIMENTS

Figure 1:
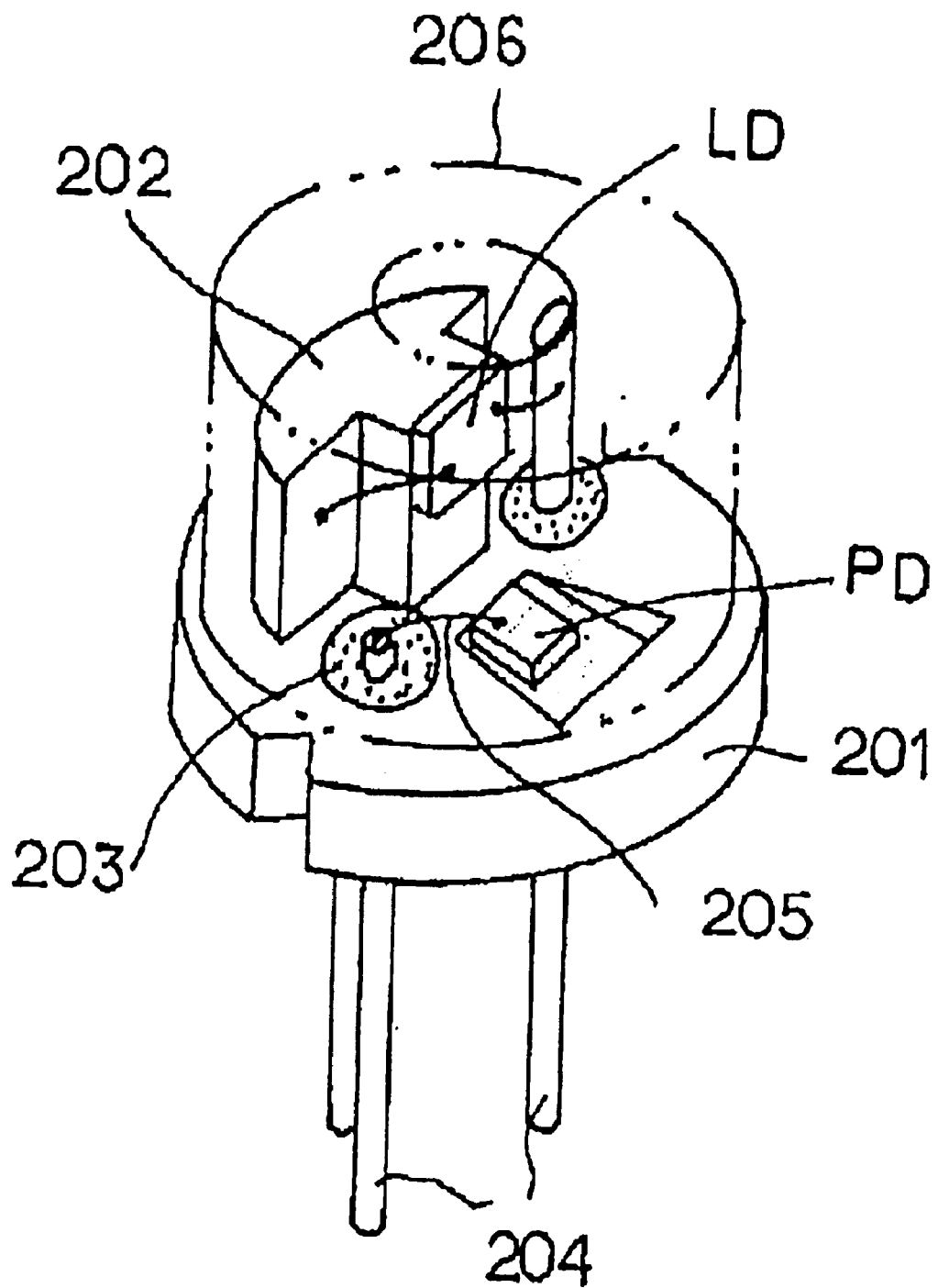
FIG. 1 is a schematic perspective view illustrative of a conventional general structure of a semiconductor laser device.
Figure 2:
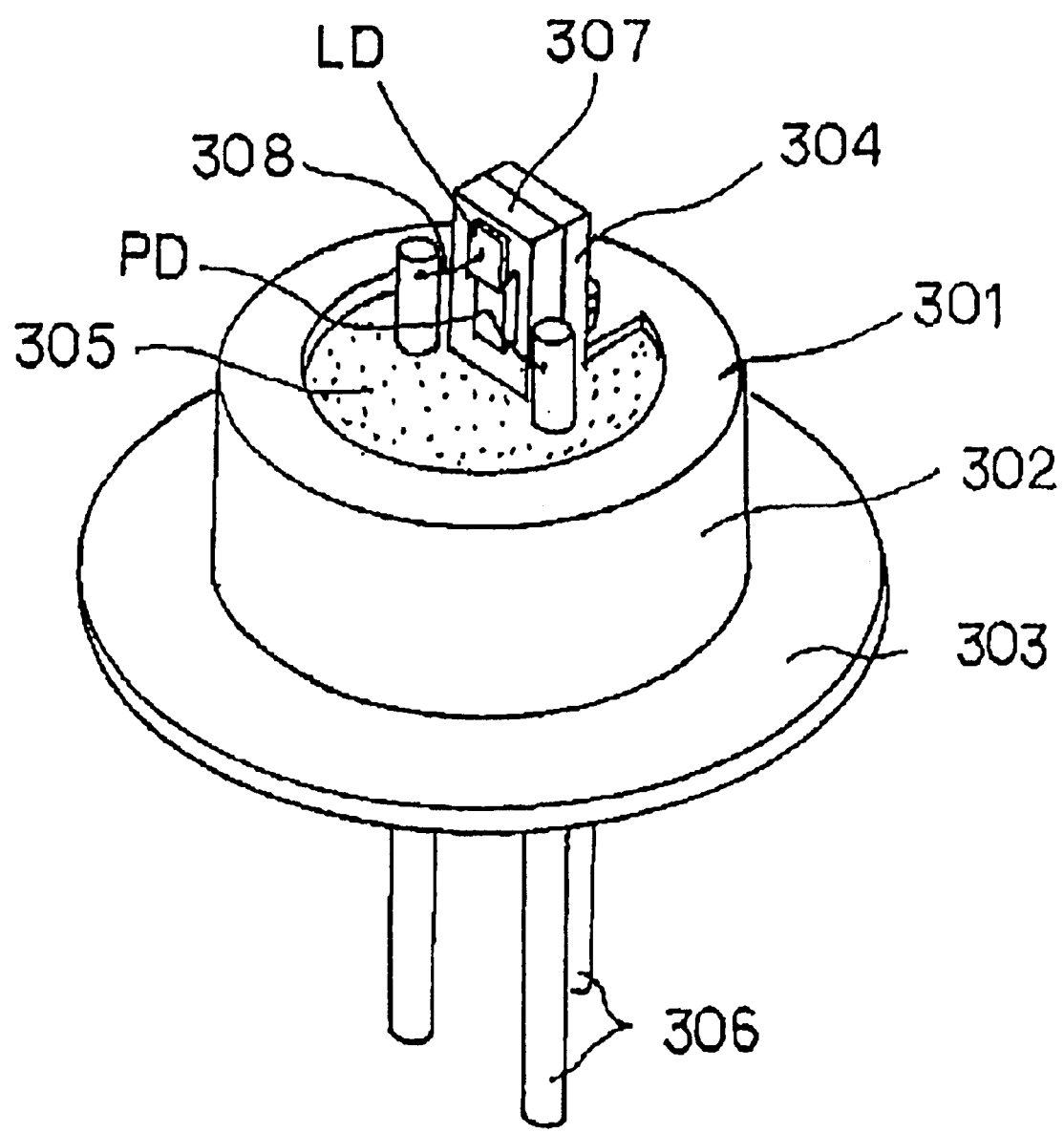
FIG. 2 is a schematic perspective view illustrative of another conventional structure of a semiconductor laser device.
Figure 3:
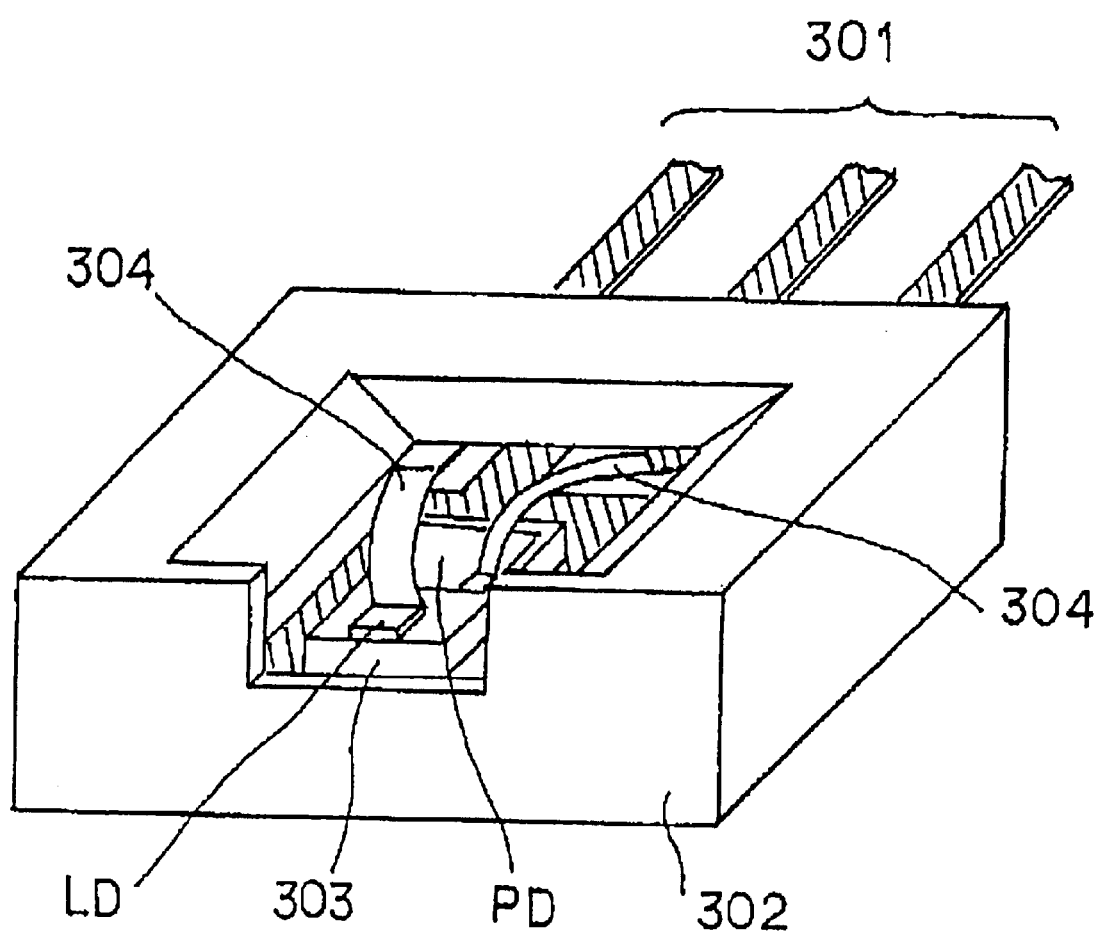
FIG. 3 is a schematic perspective view illustrative of still another conventional structure of a semiconductor laser device.

A first aspect of the present invention is a semiconductor device including: an insulating base; and a lead structure which further includes: a flange supported on a first surface of the insulating base; at least a first type lead supported by the insulating base; at least an island for mounting at least a semiconductor element thereon, and the semiconductor element being electrically connected to the at least first type lead; and at least a connection part extending between the at least island and the flange, wherein the flange, the at least connection part, and the at least island comprise a single united part of the lead structure, and wherein the flange, the at least connection part, the at least island, and the at least first type lead comprise a same conductive material.

It is possible that the at least first type lead extends in a first plane which is different from a second plane, in which the flange extends.

It is also possible that the at least island extends in a first plane which is different from a second plane, in which the flange extends.

It is also possible that the at least first type lead and the at least island extend in a first plane which is different from a second plane, in which the flange extends.

It is possible to further include at least a second type lead which extends from the at least island, wherein the at least second type lead, the flange, the at least connection part, and the at least island comprise a single united part of the lead structure, and wherein the at least second type lead, the flange, the at least connection part, the at least island, and the at least first type lead comprise a same conductive material.

It is further possible that the at least second type lead, the at least first type lead, and the at least island extend in the first plane.

It is further possible that the first plane is generally vertical to the second plane.

It is further possible that each of the at least first type lead and the at least second type lead completely penetrates the insulating base, so that each of the at least first type lead and the at least second type lead has an inner projecting part which projects from the first surface of the insulating base and an outer projecting part which projects from a second surface of the insulating base.

It is further possible that the inner projection part of the at least second type lead extends from one side of the at least island, and the inner projection part of the at least first type lead is wire-bonded to the at least semiconductor element mounted on the at least island.

It is further possible that the flange has a peripheral shape which comprises a modified circle with a single straight side.

It is further possible that the flange has a peripheral shape which comprises a modified circle with two straight sides which are positioned at diametrically opposite sides.

It is further possible to further include a cap having a peripheral edge which is positioned inside of a peripheral region of the flange.

It is further possible that the at least semiconductor device is an optical semiconductor device, and the cap has a window on an optical axis of the optical semiconductor device for allows a transmission of light from or to the optical semiconductor device.

It is further possible that the cap has a cylinder shape.

It is further possible that the cap has a half cylinder shape.

It is also possible that the insulating base comprises a resin material, and the lead structure comprises a metal material.

It is also possible that the at least semiconductor element includes at least one of a light emitting diode, a laser diode and a photo-diode.

A second aspect of the present invention is a semiconductor device including: an insulating base; and a three-dimensional lead structure which has been processed from a two-dimensional lead structure comprising a single electrically conductive plate. The three-dimensional lead structure further includes: a flange supported on a first surface of the insulating base; at least a first type lead supported by the insulating base; at least an island for mounting at least a semiconductor element thereon, and the semiconductor element being electrically connected to the at least first type lead; and at least a connection part extending between the at least island and the flange, wherein the flange, the at least connection part, and the at least island comprise a single united part of the lead structure, wherein the flange, the at least connection part, the at least island, and the at least first type lead comprise a same conductive material, and wherein the at least first type lead and the at least island extend in a first plane which is different from a second plane, in which the flange extends.

It is also possible to further include at least a second type lead which extends from the at least island, wherein the at least second type lead, the flange, the at least connection part, and the at least island comprise a single united part of the lead structure, and wherein the at least second type lead, the flange, the at least connection part, the at least island, and the at least first type lead comprise a same conductive material.

It is also possible that the at least second type lead, the at least first type lead, and the at least island extend in the first plane.

It is further possible that the first plane is generally vertical to the second plane.

It is further possible that each of the at least first type lead and the at least second type lead completely penetrates the insulating base, so that each of the at least first type lead and the at least second type lead has an inner projecting part which projects from the first surface of the insulating base and an outer projecting part which projects from a second surface of the insulating base.

It is further possible that the inner projection part of the at least second type lead extends from one side of the at least island, and the inner projection part of the at least first type lead is wire-bonded to the at least semiconductor element mounted on the at least island.

A third aspect of the present invention is a lead frame including: a frame; and a plurality of lead structure which further includes: a flange; at least a first type lead; at least an island; and at least a connection part extending between the at least island and the flange, wherein the flange, the at least connection part, the at least island, and the at least first type lead comprise a single united pattern of a same conductive material.

A fourth aspect of the present invention is a method of forming a lead structure supported by an insulating base of a semiconductor device, and the lead structure which further includes: a flange supported on a first surface of the insulating base; at least a first type lead supported by the insulating base; at least an island for mounting at least a semiconductor element thereon, and the semiconductor element being electrically connected to the at least first type lead; and at least a connection part extending between the at least island and the flange, wherein the flange, the at least connection part, the at least island, and the at least first type lead are processed from a single two-dimensional united lead pattern of a same conductive material, which is supported in a lead frame.

A fifth aspect of the present invention is a method of forming a semiconductor device, including the steps of: forming a lead frame which includes a plurality of lead structures, each of which includes a flange, an island, plural leads and at least a connection part; mounting at least one semiconductor element on the island; bending the lead structure so that the plural leads extend in a first plane generally vertical to a second plane in which the flange extends; forming an insulating base in contact with one face of the flange, whereby the plural leads are supported by the insulating base, and each of the plural leads having an inner projecting part which projects from a first surface of the insulating base and an outer projecting part which projects from a second surface of the insulating base; separating at least one of the plural leads from the island and the flange; wire-bonding the semiconductor element to the inner projecting part of the separated one of the plural leads; and separating the lead structures with the insulating bases from the lead frame.

It is also possible that the insulating base is formed by a resin molding process.

It is also possible to further include the step of: mounting a cap on each of the lead structure with the insulating base after the separating step.

It is also possible to further include the step of: mounting caps on the lead structures with the insulating bases engaged with the lead frame before the separating step.

A sixth aspect of the present invention is a method of forming a semiconductor device, including the steps of: forming a lead frame which includes a plurality of lead structures, each of which includes a flange, an island, plural leads and at least a connection part; bending the lead structure so that the plural leads extend in a first plane generally vertical to a second plane in which the flange extends; mounting at least one semiconductor element on the island; forming an insulating base in contact with one face of the flange, whereby the plural leads are supported by the insulating base, and each of the plural leads having an inner projecting part which projects from a first surface of the insulating base and an outer projecting part which projects from a second surface of the insulating base; separating at least one of the plural leads from the island and the flange; wire-bonding the semiconductor element to the inner projecting part of the separated one of the plural leads; and separating the lead structures with the insulating bases from the lead frame.

It is also possible that the insulating base is formed by a resin molding process.

It is also possible to further include the step of: mounting a cap on each of the lead structure With the insulating base after the separating step.

It is also possible to further include the step of: mounting caps on the lead structures with the insulating bases engaged with the lead frame before the separating step.

The following embodiments are typical examples for practicing the foregoing aspects of the present invention. Although the subject matters of the present invention have been described in details, the following additional descriptions in one or more typical preferred embodiments or examples will be made with reference to the drawings for making it easy to understand the typical modes for practicing the foregoing aspects of the present invention.

Figure 4:
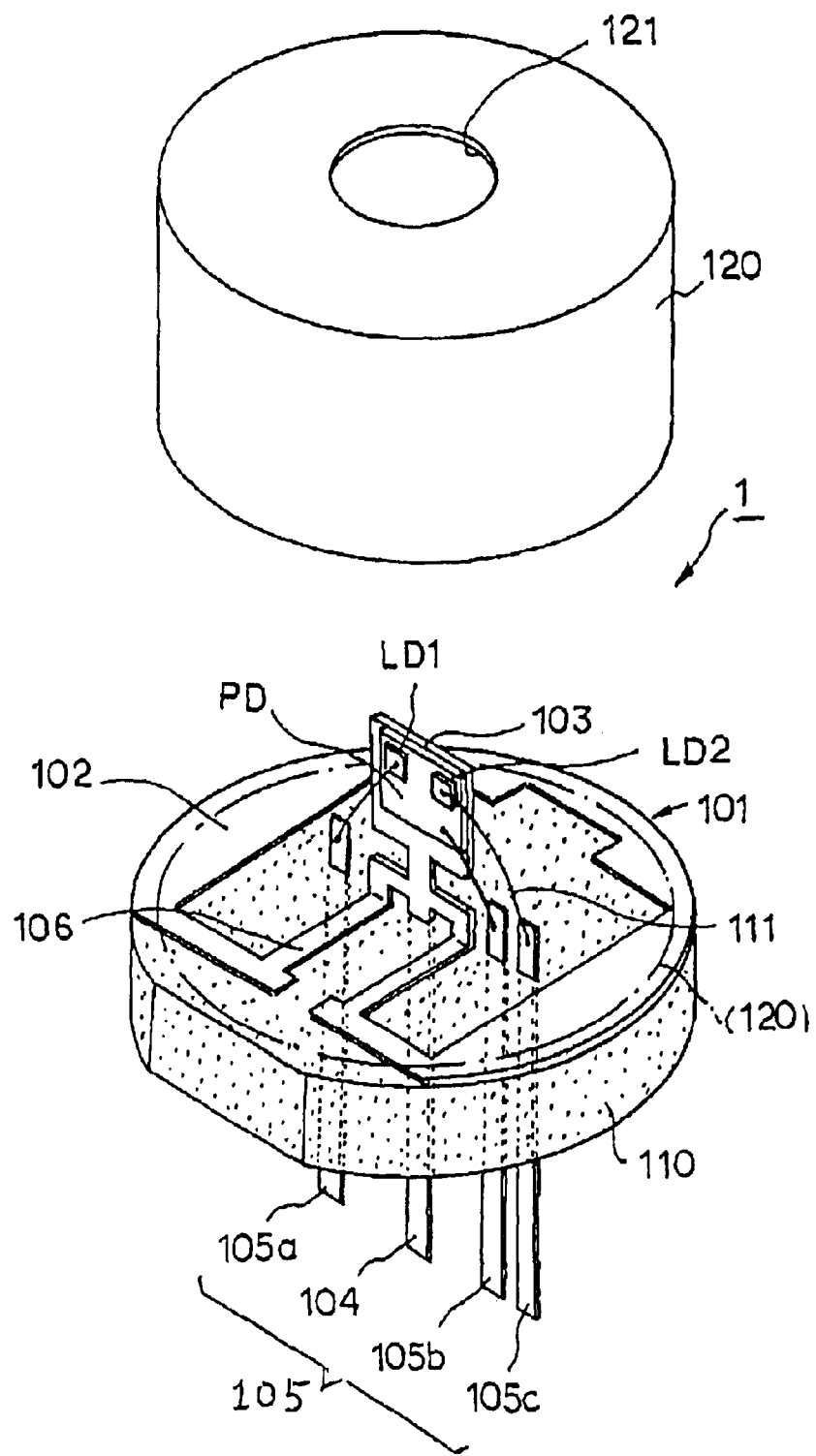
FIG. 4 is a schematic perspective view illustrative of a novel structure of a semiconductor laser device of a first embodiment in accordance with the present invention.

First Embodiment:

A first embodiment according to the present invention will be described in detail with reference to the drawings. FIG. 4 is a schematic perspective view illustrative of a novel structure of a semiconductor laser device of this first embodiment in accordance with the present invention.

The semiconductor laser device includes an insulating base 110, a lead structure 101, first and second laser diodes LD1 and LD2, a photo-diode PD and a cap 120. The resin base 110 may have a generally disk shape or a flat cylinder shape with an orientation flat which is parallel to a first horizontal direction. The insulating base 110 serves to support the lead structure 101 or provides a mechanical strength to the lead structure 101, and also provide an electrical insulation to the lead structure 101. The insulating base 110 may comprise an insulation resin material. The insulating base 110 may be formed by a molding process.

The lead structure 101 is formed from a metal plate or a metal sheet through either a press working process or an etching process. A copper plate may be available as the metal plate, from which the lead structure is formed. The metal plate or the metal sheet are proceeded to form a lead frame, from which the lead structure 101 is cut.

The lead structure 101 comprises a flange 102, an island 103, a single center lead 104, plural side leads 105a, 105b and 105c and connection parts 106. The flange 102, the island 103, the single center lead 104 and the connection parts 106 comprise a single united part of the lead structure 101. Namely, the flange 102, the island 103, the single center lead 104 and the connection parts 106 are unitary formed and made of the same conductive material such as a metal, for example, copper.

The flange 102 horizontally extends on a peripheral region of an upper surface of the insulating base 110. The flange 102 has a periphery of generally circle-shape with a single flat side in parallel to the first horizontal direction. The periphery of the flange 102 is aligned to a periphery of the insulating base 110 except for the single flat side. The island 103 is positioned over at almost the center position of the flange 102 or the insulating base 110. The island 103 extends vertically and upwardly over the center position of the flange 102 or the insulating base 110. The island 103 extends also in the first horizontal direction, and thus faces in a second horizontal direction perpendicular to the first horizontal direction. The island 103 may have a rectangle-shape. The single center lead 104 extends vertically and upwardly from a bottom side of the island 103 and penetrates the insulating base 110 and further projects upwardly from a bottom surface of the insulating base 110. A vertical center axis of the single center lead 104 is generally aligned to a vertical center axis of the island 103.

The connection parts 106 horizontally extends on the upper surface of the insulating base 110 for providing connections between the flange 102 and an inner projecting part of the single center lead 104, wherein the inner projecting part of the single center lead 104 projects from the inner surface of the insulating base 110. The connection parts 106 are provided in both sides of the single center lead 104. Each of the connection parts 106 further comprises a first part inwardly and horizontally extending from one inside end of the flange 102 in the first horizontal direction, and a second part inwardly and horizontally extending from the first part in the second horizontal direction, and a third part inwardly and vertically extending from one end of the second part to the inner projecting part of the single center lead 104. The first and second parts of each of the connection parts 106 forms a generally L-shaped connection route.

The plural side leads 105a, 105b and 105c extend vertically and penetrate the insulating base, so that each of the plural side leads 105a, 105b and 105c has an inner projecting part projecting upwardly from the upper surface of the insulating base 110 and an outer projecting part projecting downwardly from the bottom surface of the insulating base 110. Each of the plural side leads 105a, 105b and 105c is supported by the insulating base 110. The plural side leads 105a, 105b and 105c are distanced from each other and also from the single center lead 104 and the connection parts 106 as well as the flange 102, so that each of the plural side leads 105a, 105b and 105c is electrically isolated by the insulating base 110 from each other and also from the single center lead 104 and the connection parts 106 as well as the flange 102. The single center lead 104, the plural side leads 105a, 105b and 105c and the third part of the connection parts 106 as well as the island 103 are aligned in the first horizontal direction and included in a single two-dimensional space extending in the vertical direction and the first horizontal direction, wherein the single two-dimensional space has a normal directed to the second horizontal direction. The side lead 105a is positioned in one side of the single center lead 104 or the island 103, while the side leads 105b and 105c are positioned in the opposite side of the single center lead 104 or the island 103.

The two laser diodes LD1 and LD2 and the single photo-diode PD are mounted on the island 103 by die-bonding processes. The laser diode LD1 is electrically connected to the inner projecting part of the side lead 105a through a metal wiring by a wire-bonding process. The laser diode LD2 is also electrically connected to the inner projecting part of the side lead 105c through another metal wiring by the wire-bonding process. The single photo-diode PD is also electrically connected to the inner projecting part of the side lead 105b through still another metal wiring by the wire-bonding process. In this embodiment, the two laser diodes LD1 and LD2 are mounted on the single photo-diode PD which is mounted on the island 103. The two laser diodes LD1 and LD2 emit laser beams different in wavelength from each other. For example, the laser diode LD1 emits a laser beam for a CD, while the laser diode LD2 emits another laser beam for a DVD. The photo-diode PD receives the laser beams emitted from the two laser diodes LD1 and LD2 for monitoring the same.

The cap 120 is provided over the upper surface of the insulating base 110 for covering the lead structure 101 over the insulating base 110. The cap 120 may have a cylinder shape with an opening side periphery which is aligned to the inside of the periphery of the insulating base 110, so that the opening side periphery of the cap 120 is adhered to the inside of the periphery of the flange 102 via an adhesive, whereby the periphery of the flange 102 or the periphery of the insulating base 110 is present outside the cap 120. The inside of the periphery of the flange 102 or the periphery of the insulating base 110 is represented by a broken circle line in FIG. 4. The periphery of the flange 102 or the periphery of the insulating base 110 serves as a reference edge for mounting the semiconductor laser device 1 onto an optical equipment. The cap 120 also has an opening window 121 which has a circle-shape. The opening window 121 allows transmissions of the laser beams emitted from the laser diodes LD1 and LD2.

Figure 5:
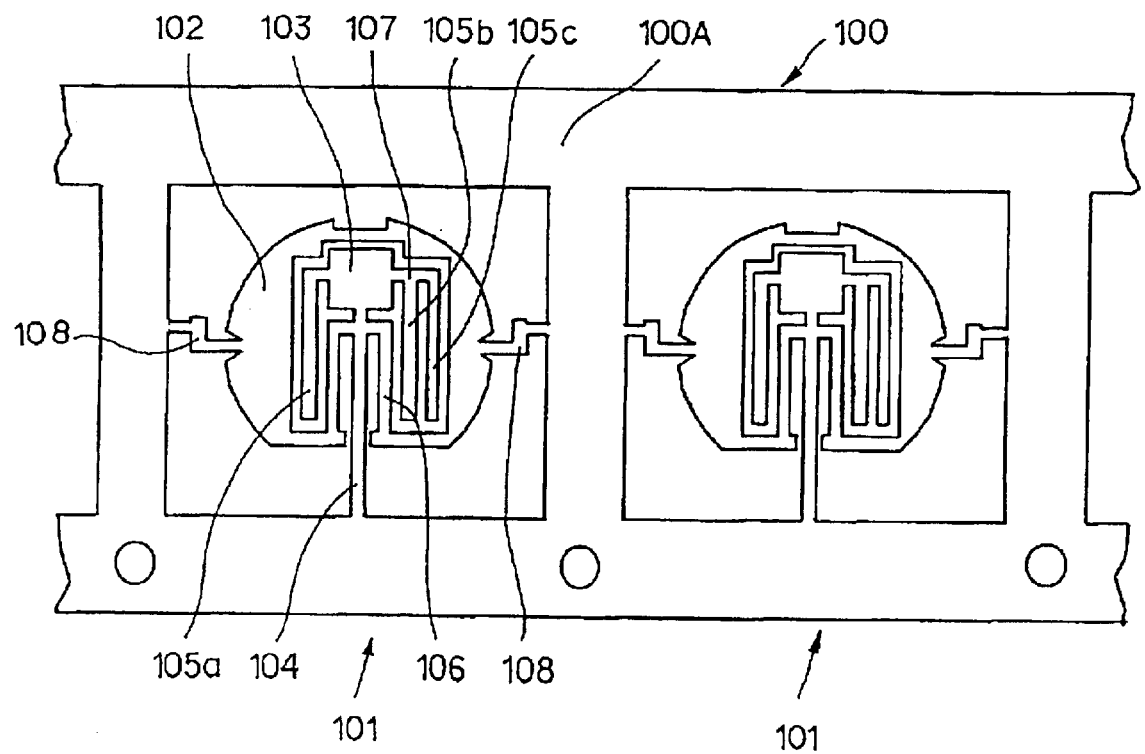
FIG. 5 is a fragmentary plan view of a lead frame including a plurality of the original form of the above-described lead structure shown in FIG.4.

The above-described semiconductor laser device 1 may be fabricated as follows. The above unique structure of the semiconductor laser device 1 allows batch-fabrication-processes for a plurality of the semiconductor laser device 1 by using a lead frame. FIG. 5 is a fragmentary plan view of a lead frame including a plurality of the original form of the above-described lead structure 101 shown in FIG. 4. A lead frame 100 extends in a two-dimensional space. The lead frame 100 may be formed through a press-working process or an etching process from a metal plate or a metal sheet such as a copper plate. The lead frame 100 includes a ladder-shaped frame 100A, and an alignment of plural original forms of the above-described lead structure 101, each of which is supported by the frame 100A via temporary supporting connections 108 which connects the original form of the lead structure 101 to the frame 100A. The original form of the lead structure 101 also extends in the two-dimensional space.

The original form of the lead structure 101 includes the flange 102, the island 103, the single center lead 104, the plural side leads 105a, 105b and 105c, and the connection parts 106, and further temporary connection parts 107 which connect the plural side leads 105a, 105b and 105c to the island 103 but only when the lead structure 101 is engaged with the lead frame 100. The original form of the lead structure 101 of the two-dimensional structure is deformed into the three-dimensional structure as shown in FIG. 4. The island 103 is positioned inside the flange 102. The single center lead 104 extends from the bottom side of the island 103 to one side of the frame 100A of the lead frame 100. The connection parts 106 connect two ends of the flange 102 to the single center lead 104. The temporary connection parts 107 connect the plural side leads 105a, 105b and 105c to the island 103. The plural side leads 105a, 105b and 105c extend in parallel to each other and also to the single center lead 104. The plural side leads 105a, 105b and 105c are terminated so as to form a gap or a distance from the first parts of the connection parts 106. The flange 102 is connected to or supported by the lead frame 100 through a pair of the temporary supporting connections 108, each of which has a generally crank-shape. After the lead structure 101 of the three-dimensional structure is established over the insulating base 110, then the temporary connection parts 107 are then cut or removed from the lead structure 101, so that the plural side leads 105a, 105b and 105c are separated from the island 103. As well illustrated in FIG. 5, the original form of the lead structure 101 is just the two-dimensional pattern.

Figure 6:
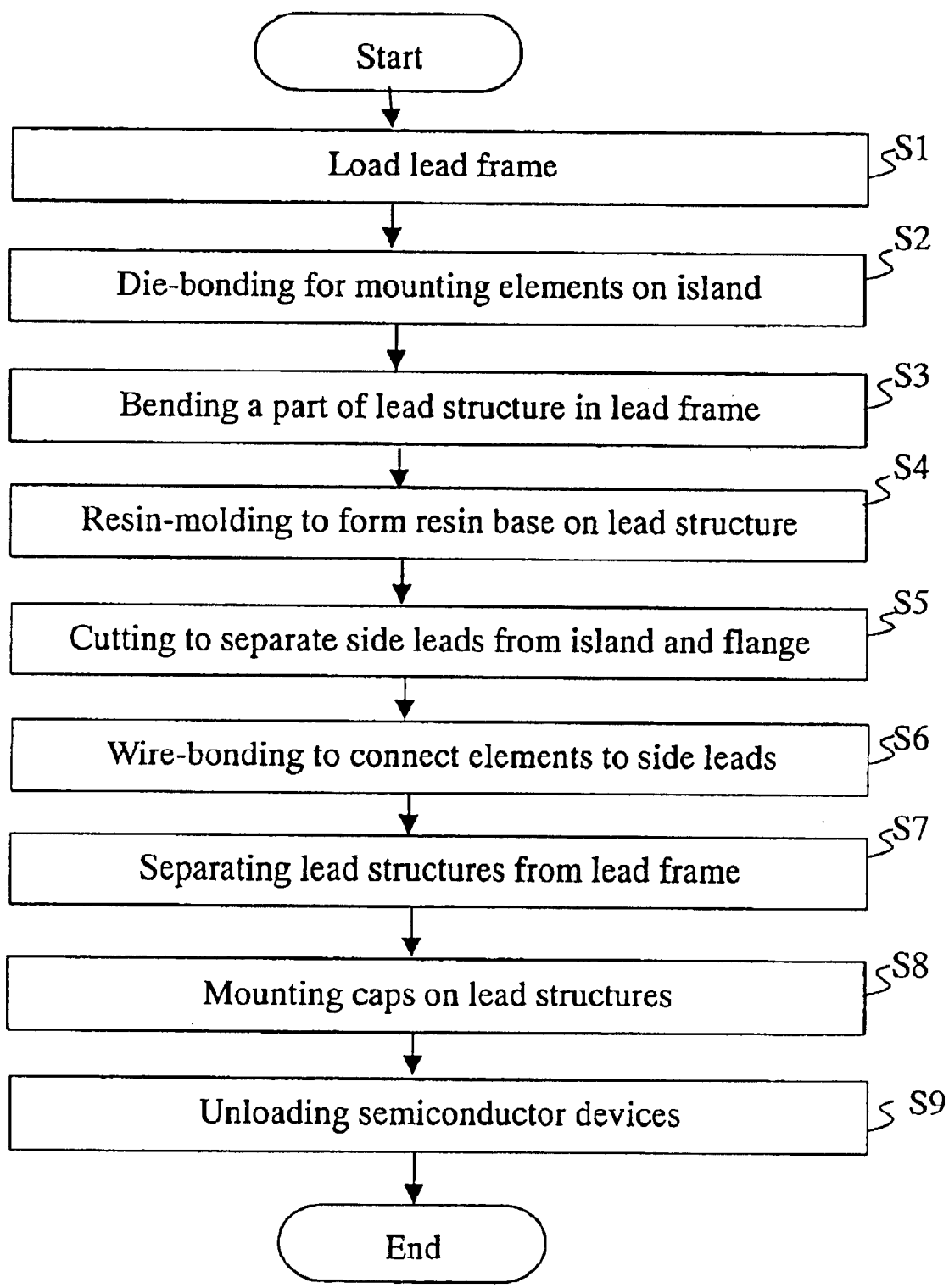
FIG. 6 is a flow chart illustrative of fabrication processes for the semiconductor laser device of FIG. 4.

FIG. 6 is a flow chart illustrative of fabrication processes for the semiconductor laser device of FIG. 4. The fabrication apparatus for fabricating the semiconductor laser devices also include plural units which perform respective processes as follows. The fabrication apparatus includes a loader unit which supplies the lead frame 100 shown in FIG. 5. In a step S1, the lead frame 100 is loaded by the loader unit to the fabrication apparatus.

The fabrication apparatus also includes a die-bonding unit taking place a die-bonding process for mounting the laser diodes LD1 and LD2 and the single photo-diode PD onto the island 103 of the original form of the lead structure 101 engaged within the lead frame 100. In a step S2, the laser diodes LD1 and LD2 and the single photo-diode PD are mounted by the die-bonding unit onto the island 103 of the original form of the lead structure 101 engaged within the lead frame 100.

The fabrication apparatus also includes a bending work unit for bending a part of the original form of the lead structure 101 mounted with the laser diodes LD1 and LD2 and the single photo-diode PD to form a three-dimensional lead structure 101. In a step S3, a part of the original form of the lead structure 101 mounted with the laser diodes LD1 and LD2 and the single photo-diode PD is bent by the bending work unit to form a three-dimensional lead structure 101.

The fabrication apparatus also includes a resin molding unit for taking place a resin molding process to form the insulating base 110 which supports the three-dimensional lead structure 101. In a step S4, a resin molding process is taken place by the resin molding unit to form the insulating base 110 which supports the three-dimensional lead structure 101.

The fabrication apparatus also includes a cutting unit for cutting off or removing the temporary connection parts 107 from the three-dimensional lead structure 101 supported on the insulating base 110, so that the plural side leads 105a, 105b and 105c are separated from the island 103. In a step S5, the temporary connection parts 107 are cut off or removed by the cutting unit from the three-dimensional lead structure 101 supported on the insulating base 110, so that the plural side leads 105a, 105b and 105c are separated from the island 103.

The fabrication apparatus also includes a wire-bonding unit for taking place a wire-bonding process for connecting the laser diodes LD1 and LD2 and the photo-diode PD through metal wirings to the plural side leads 105a, 105b and 105c. In a step S6, the laser diodes LD1 and LD2 and the photo-diode PD are wire-bonded by the wire-bonding unit through metal wirings to the plural side leads 105a, 105b and 105c.

The fabrication apparatus also includes a separating unit for separating the three-dimensional lead structure 101 with the wire-bondings from the frame 100A of the lead frame 100. In a step S7, the three-dimensional lead structure 101 with the wire-bondings are separated by the separating unit from the frame 100A of the lead frame 100.

The fabrication apparatus also includes a cap mounting unit for mounting and adhering the cap 120 onto the separated lead structure 101 with the insulating base 110, thereby to form a semiconductor laser device assembly. In a step S8, the cap 120 is mounted or adhered by the cap mounting unit onto the lead structure 101 with the insulating base 110 as separated from the frame 100A of the lead fame 100, thereby to form a semiconductor laser device assembly.

The fabrication apparatus also includes an unloader unit for unloading or picking up the semiconductor laser device assembly from the fabrication apparatus. In a step S9, the semiconductor laser device assembly is unloaded or picked up by the unloader unit from the fabrication apparatus.

The above sequential processes will be described again but more details with reference to drawings.

In the step S1, the lead frame 100 shown in FIG. 5 is loaded by the loader unit to the die-bonding unit.

Figure 7A:
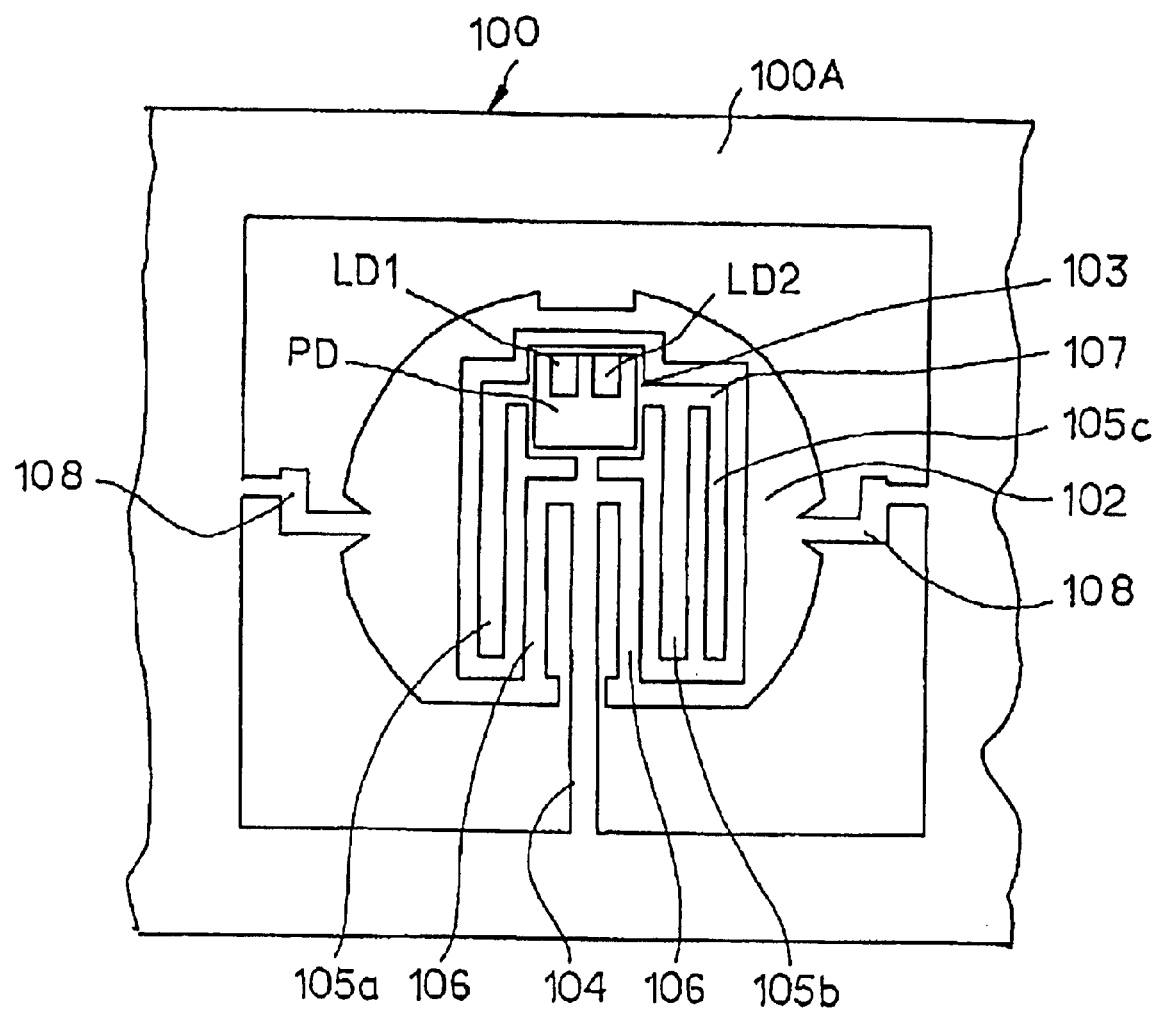
FIG. 7A is a fragmentary plan view illustrative of the two-dimensional original form of the lead structure engaged within the lead frame, wherein the laser diodes and the single photo-diode are mounted on the island in the first embodiment in accordance with the present invention.
Figure 7B:
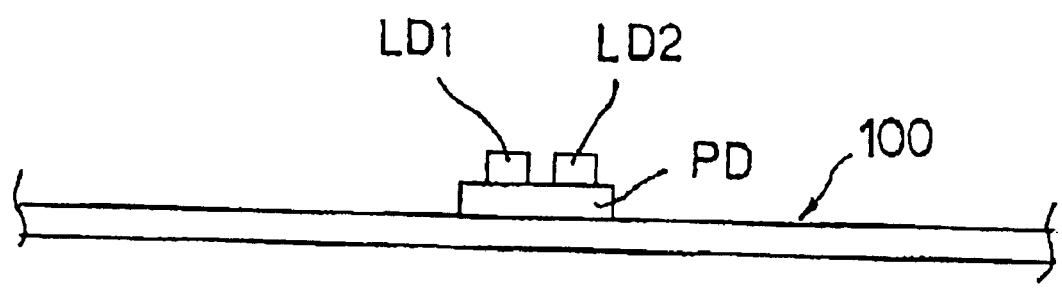
FIG. 7B is a fragmentary side view of the lead frame of FIG. 7A.

In the step S2, the laser diodes LD1 and LD2 and the single photo-diode PD are mounted by the die-bonding unit onto the island 103 of the two-dimensional original form of the lead structure 101 engaged within the lead frame 100. FIG. 7A is a fragmentary plan view illustrative of the two-dimensional original form of the lead structure 101 engaged within the lead frame 100, wherein the laser diodes LD1 and LD2 and the single photo-diode PD are mounted on the island 103. FIG. 7B is a fragmentary side view of the lead frame of FIG. 7A The photo-diode PD is directly mounted on the island 103, and the laser diodes LD1 and LD2 are mounted on the photo-diode PD. In this embodiment, the die-boning process is taken place using a hard soldering material for reducing a heat resistance.

Figure 8A:
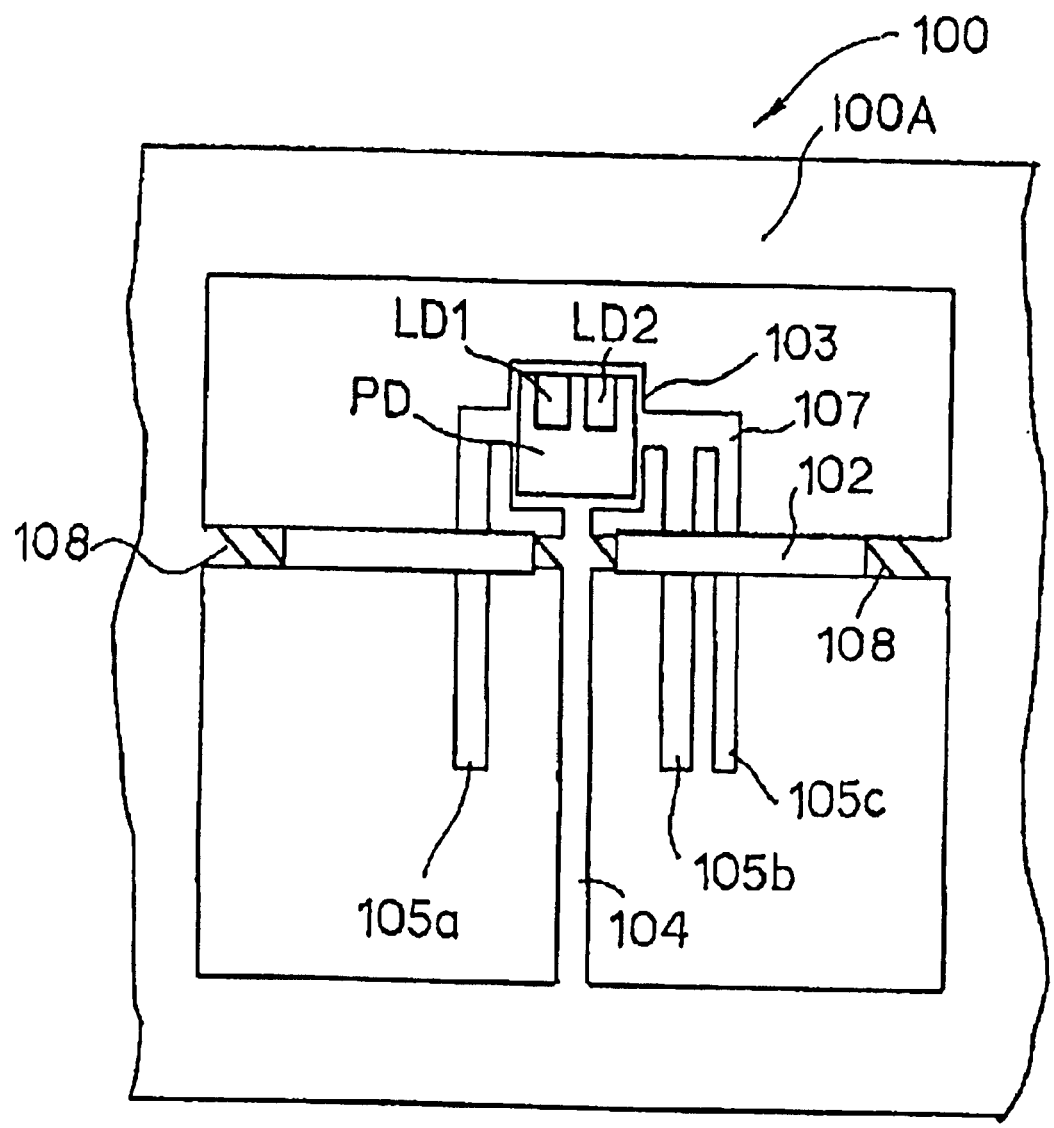
FIG. 8A is a fragmentary plan view illustrative of the lead frame having the three-dimensional original form of the lead structure in the first embodiment in accordance with the present invention.
Figure 8B:
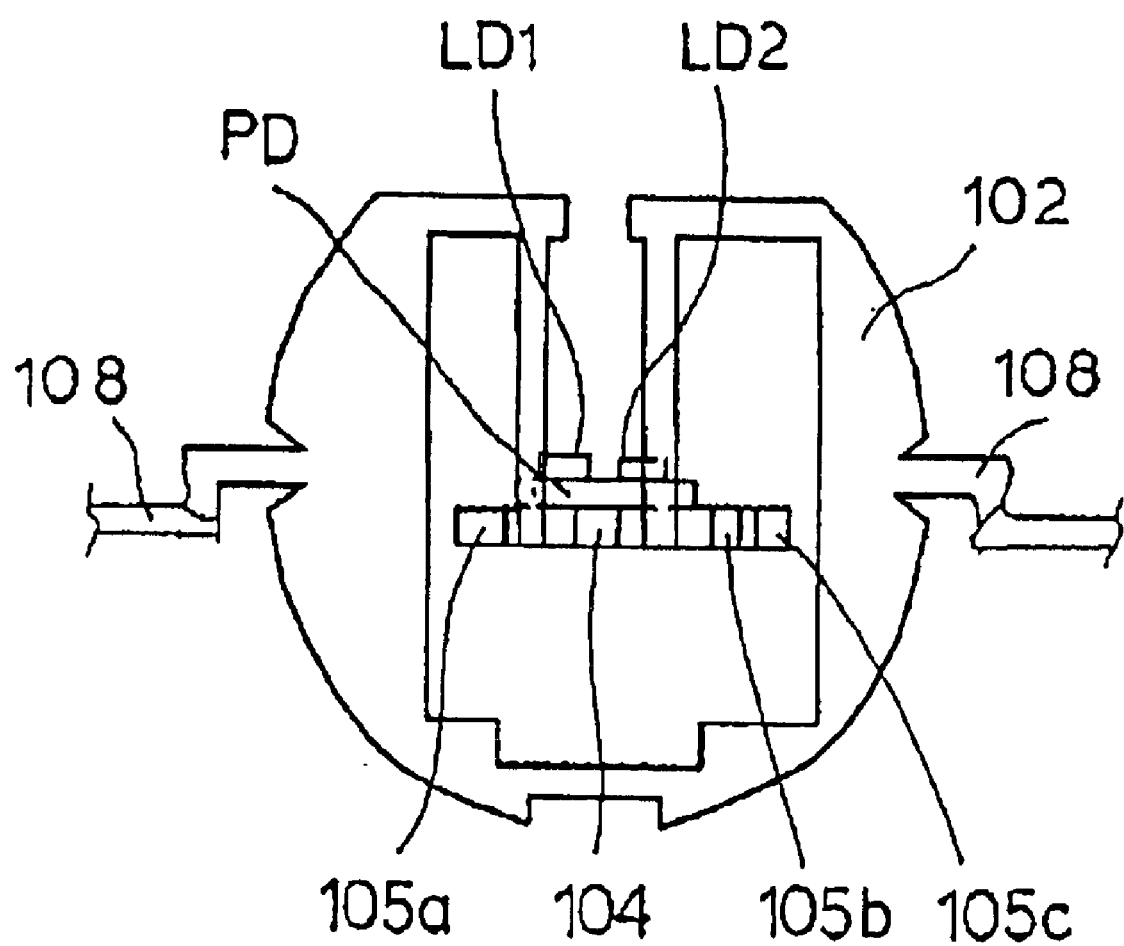
FIG. 8B is a fragmentary side view of the lead frame of FIG. 8A

In the step S3, the lead frame 100 is transferred from the die-boning unit to the bending work unit, so that a part of the original form of the lead structure 101 mounted with the laser diodes LD1 and LD2 and the single photo-diode PD is bent by the bending work unit to form a three-dimensional lead structure 101. FIG. 8A is a fragmentary plan view illustrative of the lead frame 100 having the three-dimensional original form of the lead structure 101. FIG. 8B is a fragmentary side view of the lead frame of FIG. 8A. The bending work unit twists the temporary supporting connections 108 by a right angle and also bends boundaries between the second and third parts of the connection parts 106 by the right angle, so that the flange 102 and the first and second parts of the connection parts 106 become extending in a plan vertical to the plan of the lead frame 100, while the island 103, the single center lead 104, the plural side leads 105a, 105b and 105c, the third parts of the connection parts 106 and the temporary connection parts 107 remain extending in the same plan as the lead frame 100.

Figure 9A:
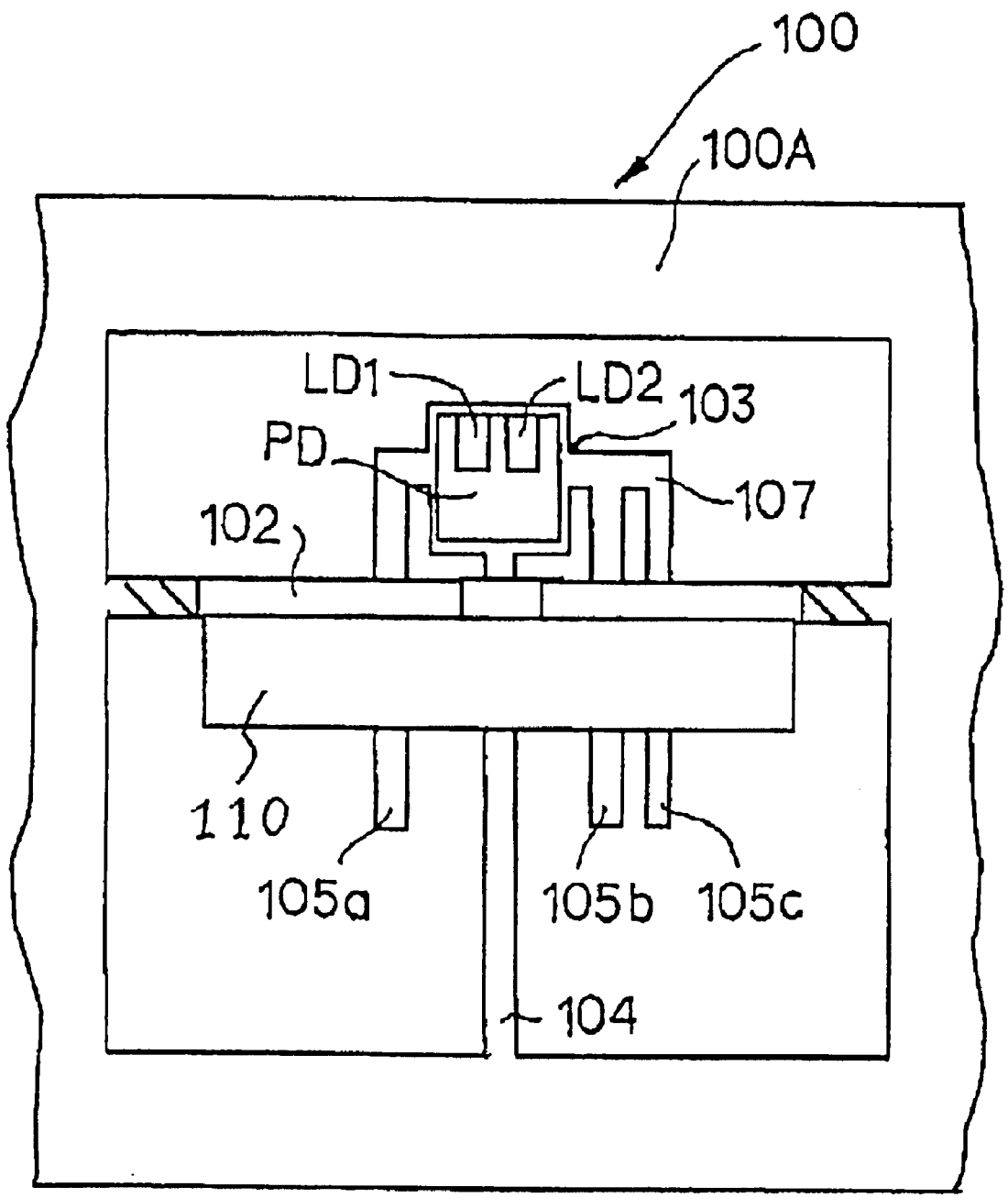
FIG. 9A is a fragmentary plan view illustrative of the lead frame having the three-dimensional original form of the lead structure with the insulating base in the first embodiment in accordance with the present invention.
Figure 9B:
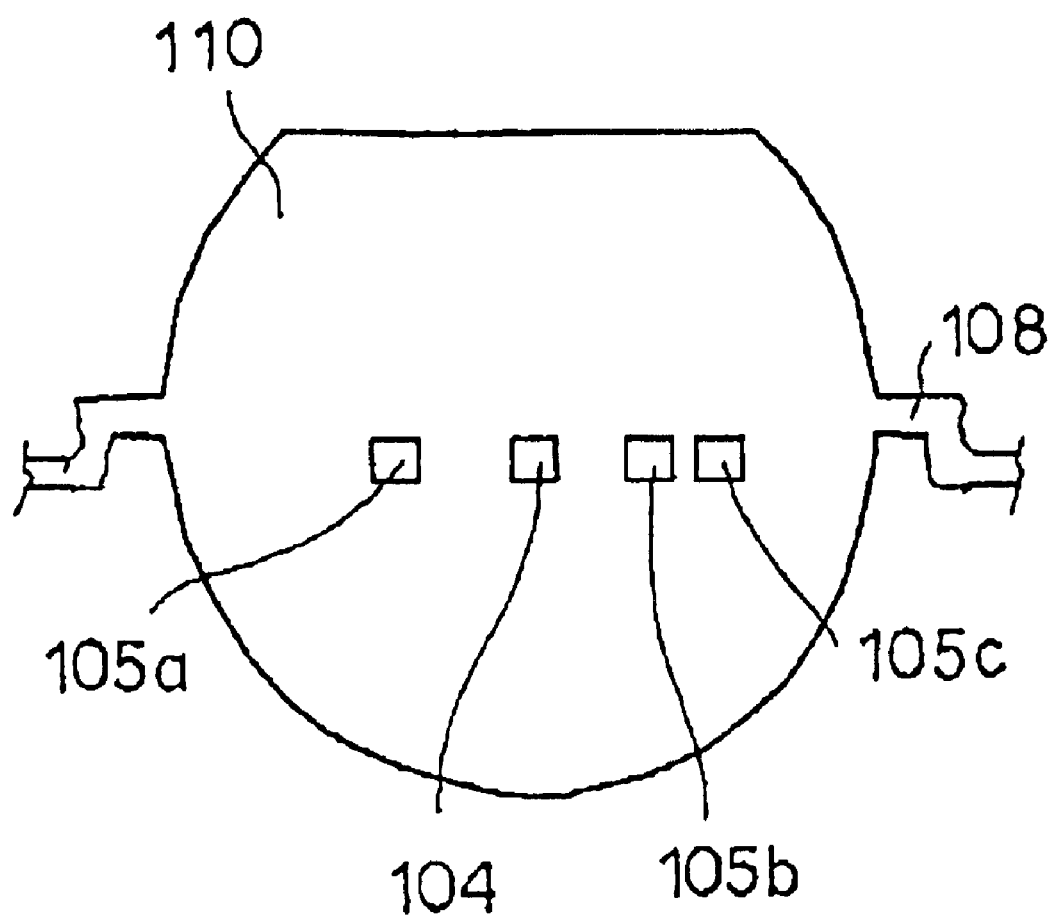
FIG. 9B is a fragmentary side view of the lead frame of FIG. 9A.

In the step S4, the lead frame 100 with the three dimensional lead structure 101 is transferred from the bending work unit to the resin molding unit, so that a resin molding process is taken place by the resin molding unit to form the insulating base 110 which supports the three-dimensional lead structure 101. FIG. 9A is a fragmentary plan view illustrative of the lead frame 100 having the three-dimensional original form of the lead structure 101 with the insulating base 110. FIG. 9B is a fragmentary side view of the lead frame of FIG. 9A. The lead frame 100 with the three dimensional lead structure 101 is set in molding dies for taking place a molding process with an electrically insulating resin. A pair of the molding dies move in opposite directions which are parallel to the plan of the lead frame 100 and perpendicular to a longitudinal direction of the lead frame 100 without causing any physical interference with the lead frame 100, so that the paired molding dies sandwich the flange 102, thereby to form a cavity in one side of the flange 102, while the island 103 is positioned in the opposite side thereto.

An electrically insulating resin is injected into a cavity defined by the paired molding dies which sandwich the flange 102 for carrying out the resin molding process, whereby the insulating base 110 of the electrically insulating resin material is formed on the one side of the flange 102 as shown in FIG. 9A. The insulating base 110 has the generally flat cylinder shape with the orientation flat. The flange 102 is present on the surface of the insulating base 110. The insulating base 110 provides a sufficient mechanical strength to the flange 102. Further, the insulating base 110 supports the single center lead 104 and the plural side leads 105a, 105b and 105c, so that the single center lead 104 and the plural side leads 105a, 105b and 105c are electrically separated by the insulating base 110 from each other and from the flange 102, wherein each of the single center lead 104 and the plural side leads 105a, 105b and 105c has an inner projecting part which projects from the one surface of the insulating base 110 toward the same side as the island 103 and also an outer projecting part which projects from the opposite surface of the insulating base 110 toward the opposite side to the island 103. One face of the flange 120 is in contact directly with the one face of the insulating base 110, while the opposite face of the flange 120 is exposed.

Figure 10:
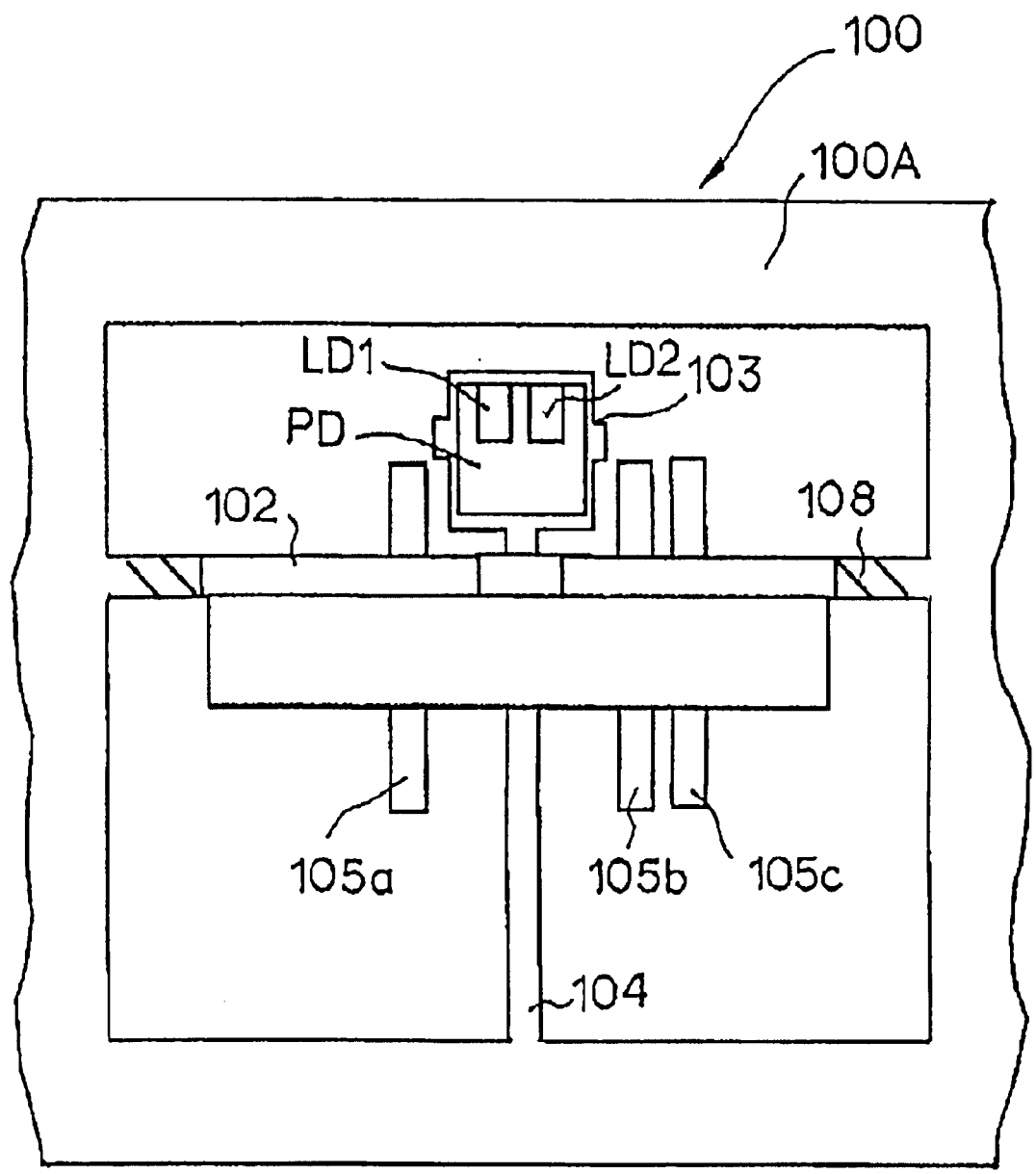
FIG. 10 is a fragmentary plan view illustrative of the lead frame having the three-dimensional original form of the lead structure with the insulating base after the temporary connection parts are cut off or removed in the first embodiment in accordance with the present invention.

In the step S5, the lead frame 100 is further transferred from the resin molding unit to the cutting unit, so that the temporary connection parts 107 are cut off or removed from the three-dimensional lead structure 101 supported on the insulating base 110. FIG. 10 is a fragmentary plan view illustrative of the lead frame 100 having the three-dimensional original form of the lead structure 101 with the insulating base 110 after the temporary connection parts 107 are cut off or removed. The plural side leads 105a, 105b and 105c are mechanically and electrically separated from the island 103, while the plural side leads 105a, 105b and 105c remain supported by the insulating base 110. The single center lead 104 remains connected with the island 103 and also connected through the connection parts 106 to the flange 102.

Figure 11:
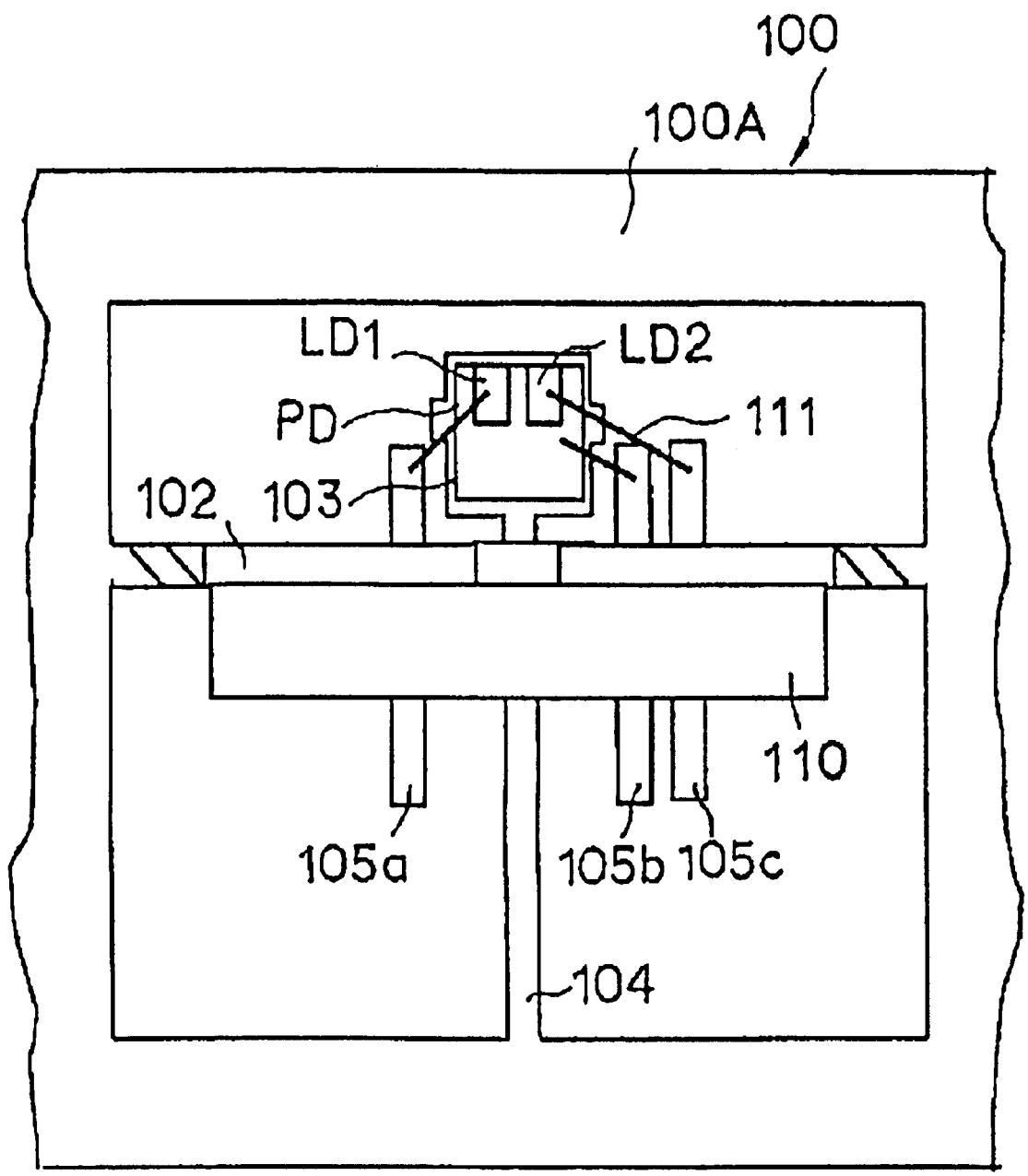
FIG. 11 is a fragmentary plan view illustrative of the lead frame having the three-dimensional original form of the lead structure with the insulating base and the wire-bondings in the first embodiment in accordance with the present invention.

In the step S6, the lead frame 100 is further transferred from the cutting unit to the wire-bonding unit, so that the laser diodes LD1 and LD2 and the photo-diode PD are wire-bonded through metal wirings to the plural side leads 105a, 105b and 105c. FIG. 11 is a fragmentary plan view illustrative of the lead frame 100 having the three-dimensional original form of the lead structure 101 with the insulating base 110 and the wire-bondings. The plural side leads 105a, 105b and 105c extend in the same plan as the island 103. This allows the existent wire-bonding technique to be applied. The laser diode LD1 is electrically connected to the inner projecting part of the side lead 105a through a metal wiring 111 by a wire-bonding process. The laser diode LD2 is also electrically connected to the inner projecting part of the side lead 105c through another metal wiring 111 by the wire-bonding process. The single photo-diode PD is also electrically connected to the inner projecting part of the side lead 105b through still another metal wiring 111 by the wire-bonding process.

Figure 12:
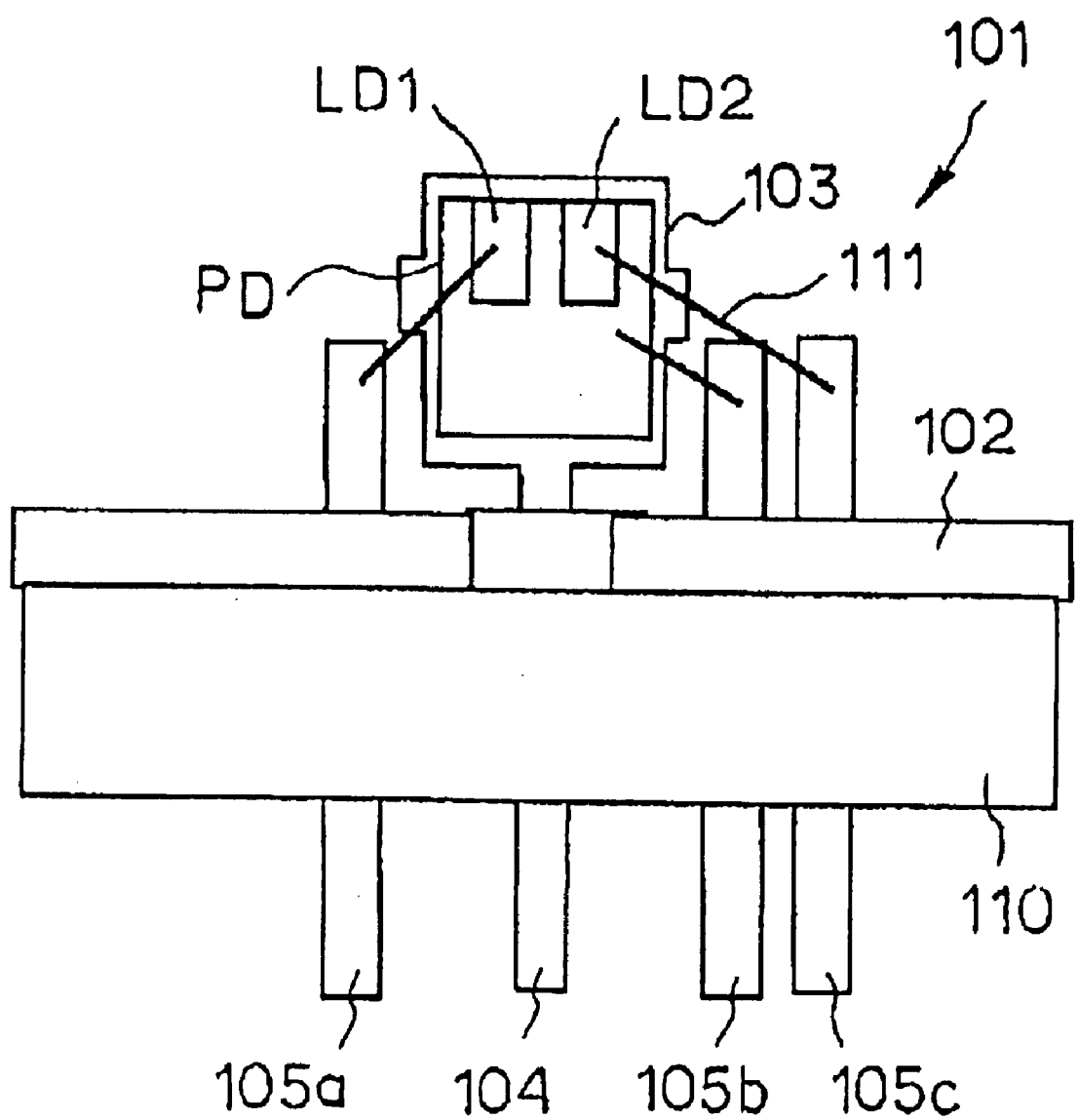
FIG. 12 is a fragmentary plan view illustrative of the lead structure with the insulating base and the wire-bondings separated from the lead frame in the first embodiment in accordance with the present invention.

In the step S7, the lead frame 100 is further transferred from the wire-bonding unit to the separating unit, so that the three-dimensional lead structure 101 with the wire-bondings and the insulating base 110 are separated from the frame 100A of the lead frame 100. FIG. 12 is a fragmentary plan view illustrative of the lead structure 101 with the insulating base 110 and the wire-bondings separated from the lead frame 100. The temporary supporting connections 108 are cut off or removed from the lead frame 100, so that the three-dimensional lead structure 101 with the wire-bondings and the insulating base 110 are separated from the frame 100A of the lead frame 100. The foregoing descriptions have focused onto only one of the lead structures 101 engaged with the lead frame 100, even the plural lead structures 101 are concurrently formed in the above batch-processes.

Figure 13:
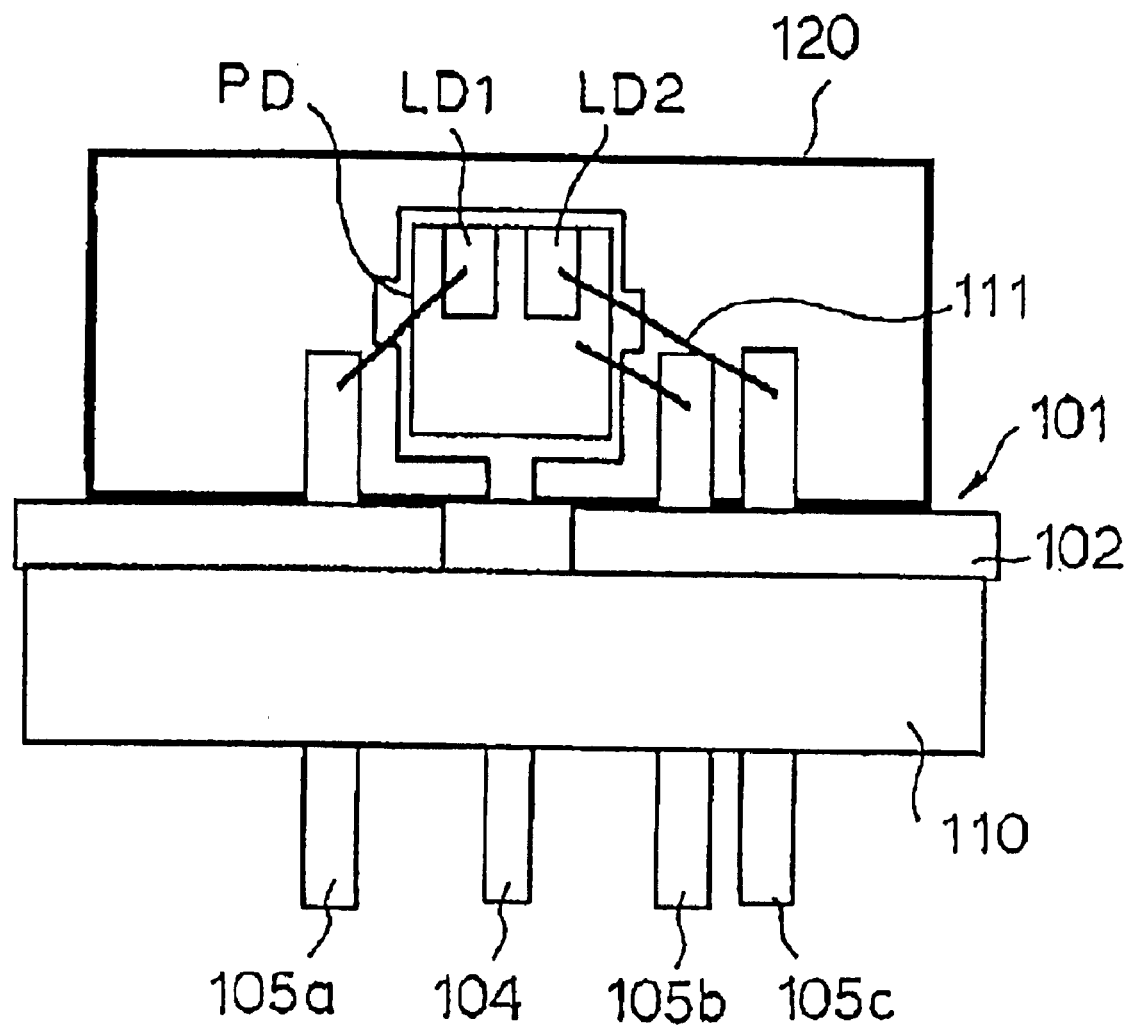
FIG. 13 is one side view of the semiconductor laser device assembly in the first embodiment in accordance with the present invention.

In the step S8, each of the plural lead structures 101 is transferred into the cap mounting unit, so that the cap 120 is mounted or adhered by the cap mounting unit onto the lead structure 101 with the insulating base 110 as separated from the frame 100A of the lead frame 100, thereby to form a semiconductor laser device assembly. FIG. 13 is one side view of the semiconductor laser device assembly. The cap 120 is provided over the upper surface of the insulating base 110 for covering the lead structure 101 over the insulating base 110. The cap 120 may have a cylinder shape with an opening side periphery which is aligned to the inside of the periphery of the insulating base 110, so that the opening side periphery of the cap 120 is adhered to the inside of the periphery of the flange 102 via an adhesive, whereby the periphery of the flange 102 or the periphery of the insulating base 110 is present outside the cap 120. The cap 120 also has an opening window 121 which has a circle-shape. The opening window 121 allows transmissions of the laser beams emitted from the laser diodes LD1 and LD2.

In the step S9, the optical semiconductor laser device assembly is transferred from the cap mounting unit to the unloader unit, so that the semiconductor laser device assembly is unloaded or picked up from the unloader unit.

As described above, in accordance with the fabrication processes of the present invention, the lead frame 100 including the plural lead structures 101 is subjected to the sequential batch-processes, for example, the die-bonding process, the bending process, the resin-molding process, the cutting process, the wire-bonding process and the separating process, while each of the plural lead structures 101 is then subjected to the cap-mounting process. The above sequential batch-processes are taken place by using alignment holes of the lead frame 100 for carrying the lead frame and positioning the lead structures 101. This allows an almost automated batch-assembling process for assembling the semiconductor laser devices. This automated batch-assembling process realizes a desired increase in the productivity of the semiconductor laser device of the high quality or the high performances.

The assembled semiconductor laser device has a can-shaped package. This allows applications of the semiconductor laser device to a variety of the existent optical equipments.

Further, the assembled semiconductor laser device has the above-described single-united lead structure which comprises the island 103, the single center lead 104, the connection parts 106 and the flange 102. The single-united lead structure is processed from the single metal plate or sheet through the above-described sequential batch-processes. Namely, the island 103, the single center lead 104, the connection parts 106 and the flange 102 are in the single-united from. This single-united from provides an effective heat radiation path. For example, a heat generated by the laser diodes LD1 and LD2 may be conducted through the island 103, the inner projecting part of the single center lead 104, the connection parts 106 and the flange 102 to the cap 120, from which the conducted heat is radiated.

Furthermore, the island 103 and the flange 102 are in the single-united form. This makes it easy to realize a highly accurate relative-positioning of the laser diodes LD1 and LD2 with reference to the flange 102. A peripheral surface of the flange 102 is made into contact directly with a reference plane of the optical equipment for mounting the assembled semiconductor laser device on the optical equipment. This realizes a highly accurate positioning of the semiconductor laser device with reference to a position of the light source of the optical equipment.

In this embodiment, the cap 120 has the cylinder-shape. The available shape of the cap 120 should not be limited to the cylinder-shape. For example, a cubic or rectangle shape is also available. The cap 120 is provided in order to mechanically protect the optical semiconductor elements and the lead structure 101 as well as the bonding wires from an externally applied mechanical force. The shape of the cap 120 may be optional, provided that the cap 120 is mounted on the island-existing-side of the assembled semiconductor laser device for covering at least the island-mounting-face, on which the laser diodes LD1 and LD2 and the photo-diode PD are mounted.

Figure 14:
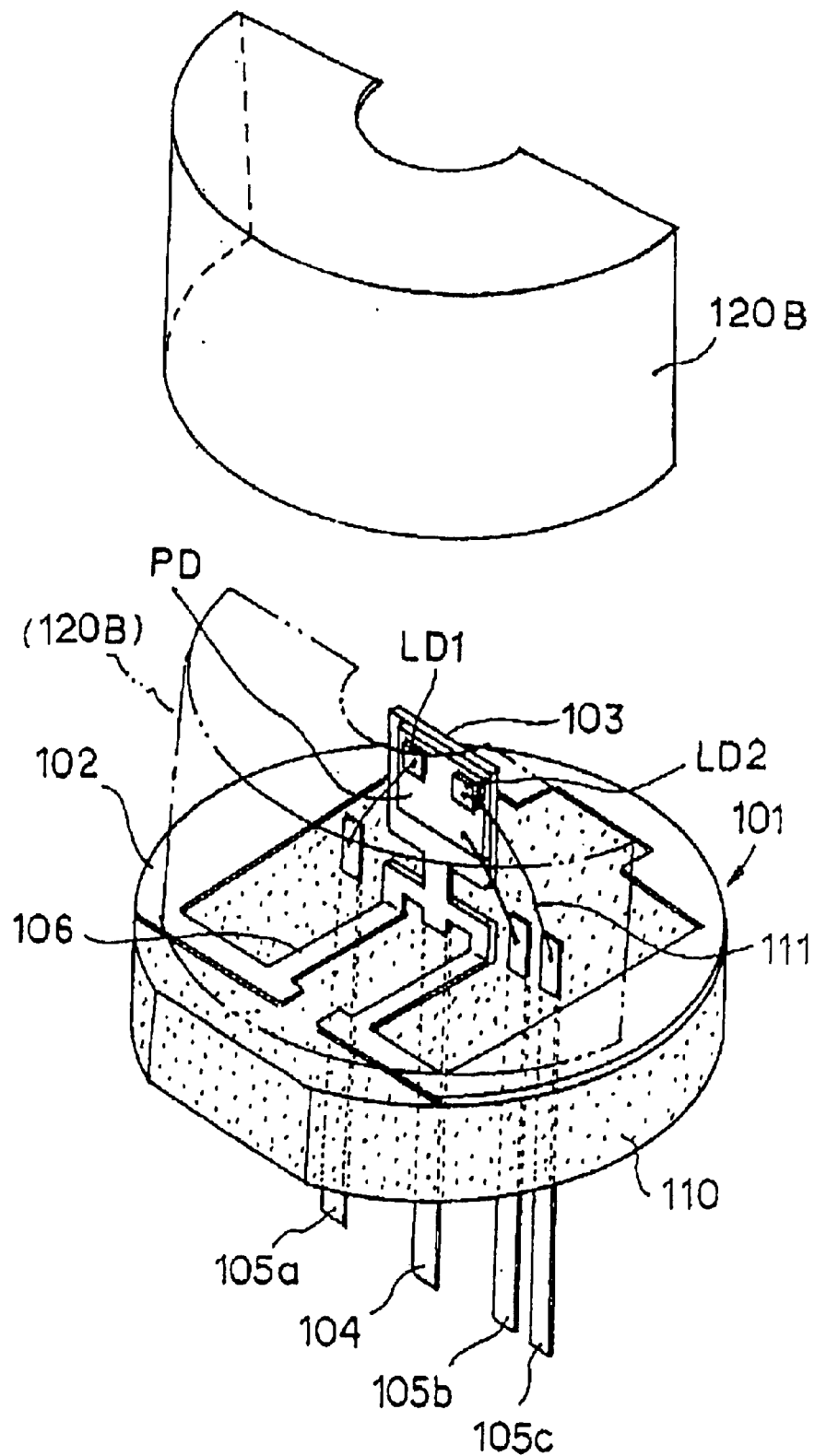
FIG. 14 is a schematic perspective view of the semiconductor laser device with another cap with a modified shape in a modification of the first embodiment of the present invention.

FIG. 14 is a schematic perspective view of the semiconductor laser device with another cap with a modified shape in a modification of the first embodiment of the present invention. A modified cap 120B has a half-cylinder-shape which covers only the island-mounting-face, on which the laser diodes LD1 and LD2 and the photo-diode PD are mounted, as shown in FIG. 14. The modified cap 120B covers the laser diodes LD1 and LD2 and the photo-diode PD on the island-mounting-face, and the bonding wires 111 as well as the respective inner projecting parts of the single center lead 104 and the plural side leads 105a, 105b and 105c.

This modified cap 120B allows that following to the wire-bonding process shown in FIG. 11, a batch-cap-mounting process can be taken place to mount a plurality of the modified caps 120B onto a plurality of the lead structures 101 engaged with the lead frame 100 to assemble a plurality of the semiconductor laser devices, before the plural semiconductor laser devices are separated from the lead frame 100. This allows that the semiconductor laser devices are assembled through the sequential batch-processes.

In this embodiment, the lead frame 100 is subjected to the bending process for bending a part of the two-dimensional original form of the lead structure 101 to form the three-dimensional lead structure 101. A metal material for the lead frame 100 or the lead structure 101 should be selected in consideration of preventing any disconnection or break at the bent part of the lead structure 101. Typical examples of the available metal materials for the lead structure 101 or the lead frame 100 may include, but not limited to, 42-alloy, aluminum, and aluminum alloys, in addition to copper.

The respective shapes and dimensions of the lead frame 100, the flange 102, the island 103, the single center lead 104, and the plural side leads 105a, 105b and 105c are optional.

The cap 120 may optionally have a condensing lens on the opening window 121 to seal an inner space of the cap 120.

The semiconductor laser device may optionally be free of any cap.

One or more optical semiconductor elements mounted on the island 103 should not be limited to the photo-diode PD and the laser diodes LD.

Second Embodiment:

A second embodiment according to the present invention will be described in detail with reference to the drawings. The semiconductor laser device of this embodiment has the same structure as that in the first embodiment and shown in FIG. 4. Namely, the semiconductor laser device includes the insulating base 110, the lead structure 101, the first and second laser diodes LD1 and LD2, the photodiode PD and the cap 120. The resin base 110 may have the generally disk shape or the flat cylinder shape with the orientation flat which is parallel to the first horizontal direction. The insulating base 110 serves to support the lead structure 101 or provides the mechanical strength to the lead structure 101, and also provide the electrical insulation to the lead structure 101. The insulating base 110 may comprise the insulation resin material. The insulating base 110 may be formed by the molding process.

The lead structure 101 is formed from the metal plate or the metal sheet through either the press working process or the etching process. The metal plate or the metal sheet are proceeded to form a lead frame, from which the lead structure 101 is cut.

The lead structure 101 comprises the flange 102, the island 103, the single center lead 104, the plural side leads 105a, 105b and 105c and the connection parts 106. The flange 102, the island 103, the single center lead 104 and the connection parts 106 comprise a single united part of the lead structure 101. Namely, the flange 102, the island 103, the single center lead 104 and the connection parts 106 are unitary formed and made of the same conductive material such as a metal. Detailed descriptions of the respective structures of the flange 102, the island 103, the single center lead 104, the plural side leads 105a, 105b and 105c and the connection parts 106 are the same as made in the first embodiment.

Figure 15:
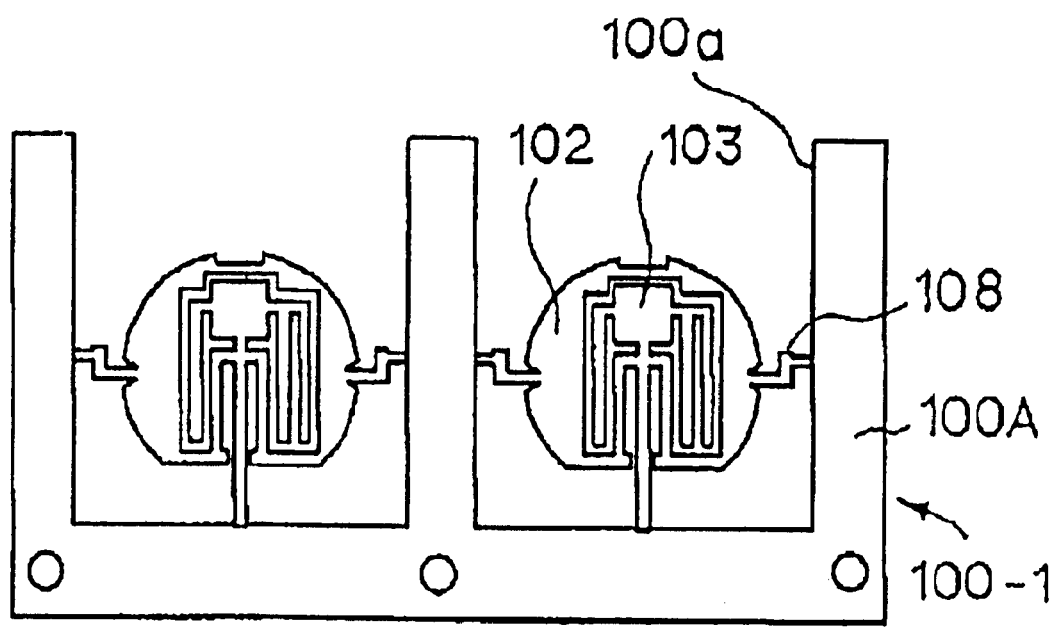
FIG. 15 is a fragmentary plan view of a modified lead frame including a plurality of the original form of the above-described lead structure shown in FIG. 4 in the second embodiment in accordance with the present invention.

The above-described semiconductor laser device 1 may be fabricated as follows. The above unique structure of the semiconductor laser device 1 allows batch-fabrication-processes for a plurality of the semiconductor laser device 1 by using a lead frame. FIG. 15 is a fragmentary plan view of a modified lead frame including a plurality of the original form of the above-described lead structure 101 shown in FIG. 4. This lead frame 100-1 is different from the lead frame 100 described in the first embodiment. A lead frame 100-1 extends in a two-dimensional space. The lead frame 100-1 may be formed through a press-working process or an etching process from a metal plate or a metal sheet. The lead frame 100-1 includes a comb-shaped frame 100A, and an alignment of plural original forms of the above-described lead structure 101, each of which is supported by the frame 100A via temporary supporting connections 108 which connects the original form of the lead structure 101 to the frame 100A. The original form of the lead structure 101 also extends in the two-dimensional space. The comb-shaped frame 100A has an open-side 100a along the longitudinal direction of the lead frame 100-1 as shown in FIG. 15. The open side 100a is closer to the island 103 rather than the single center lead 104. Namely, each of the original form of the lead structure 101 is supported or surrounded by three sides of the comb-shaped frame 100A.

The original form of the lead structure 101 is the same as that in the first embodiment. Namely, the original form of the lead structure 101 includes the flange 102, the island 103, the single center lead 104, the plural side leads 105a, 105b and 105c, and the connection parts 106, and further temporary connection parts 107. The original form of the lead structure 101 of the two-dimensional structure is deformed into the three-dimensional structure as shown in FIG. 4.

Figure 16:
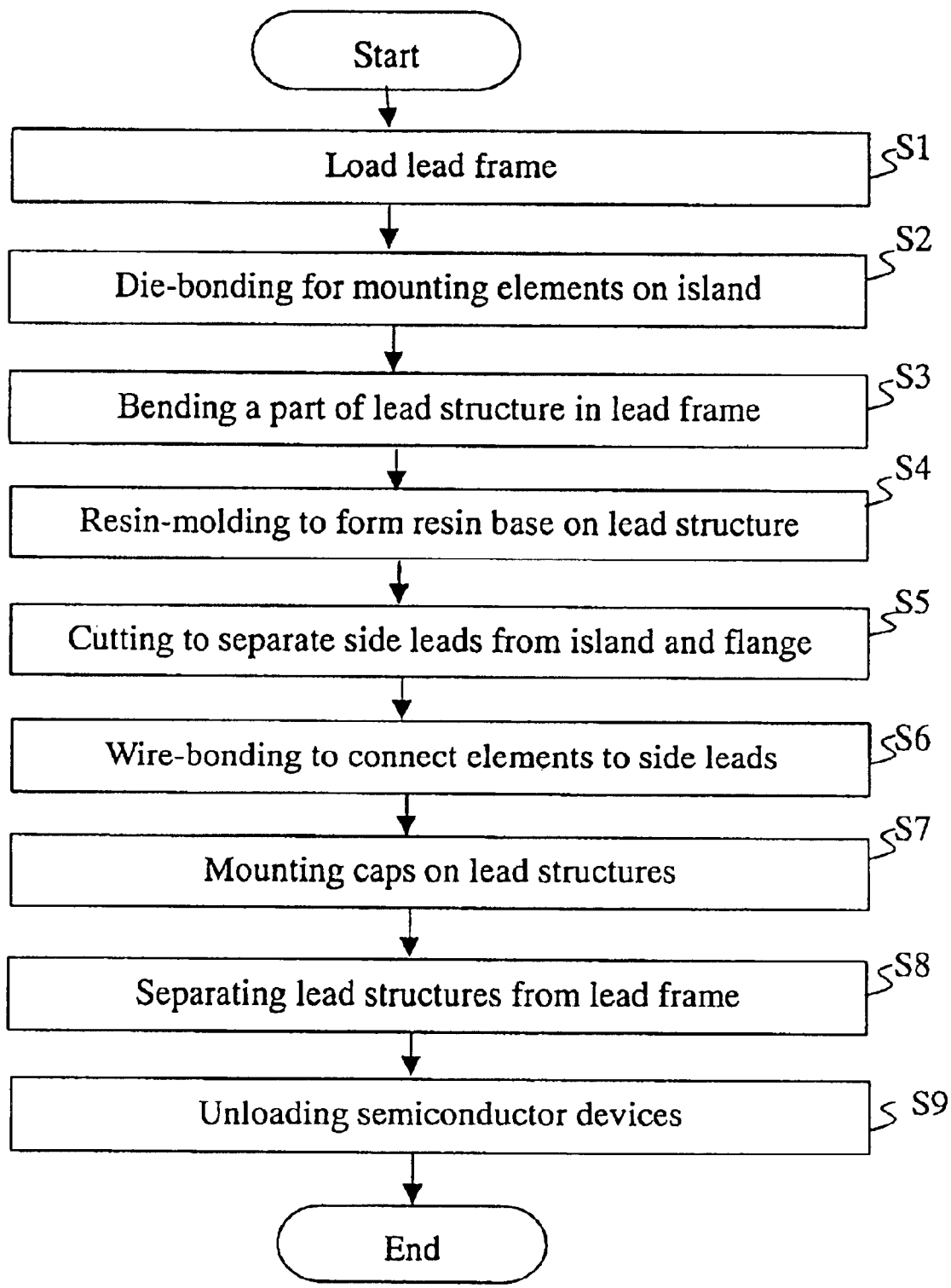
FIG. 16 is a flow chart illustrative of fabrication processes for the semiconductor laser device of the second embodiment in accordance with the present invention.

FIG. 16 is a flow chart illustrative of fabrication processes for the semiconductor laser device of the second embodiment in accordance with the present invention. The fabrication apparatus for fabricating the semiconductor laser devices also include plural units which perform respective processes as follows. The fabrication apparatus includes a loader unit which supplies the lead frame 100-1 shown in FIG. 15. In a step S1, the lead frame 100-1 is loaded by the loader unit to the fabrication apparatus.

The fabrication apparatus also includes a die-bonding unit taking place a die-bonding process for mounting the laser diodes LD1 and LD2 and the single photo-diode PD onto the island 103 of the original form of the lead structure 101 engaged within the lead frame 100-1. In a step S2, the laser diodes LD1 and LD2 and the single photo-diode PD are mounted by the die-bonding unit onto the island 103 of the original form of the lead structure 101 engaged within the lead frame 100-1.

The fabrication apparatus also includes a bending work unit for bending a part of the original form of the lead structure 101 mounted with the laser diodes LD1 and LD2 and the single photo-diode PD to form a three-dimensional lead structure 101. In a step S3, a part of the original form of the lead structure 101 mounted with the laser diodes LD1 and LD2 and the single photo-diode PD is bent by the bending work unit to form a three-dimensional lead structure 101.

The fabrication apparatus also includes a resin molding unit for taking place a resin molding process to form the insulating base 110 which supports the three-dimensional lead structure 101. In a step S4, a resin molding process is taken place by the resin molding unit to form the insulating base 110 which supports the three-dimensional lead structure 101.

The fabrication apparatus also includes a cutting unit for cutting off or removing the temporary connection parts 107 from the three-dimensional lead structure 101 supported on the insulating base 110, so that the plural side leads 105*a*, 105*b* and 105*c* are separated from the island 103. In a step S5, the temporary connection parts 107 are cut off or removed by the cutting unit from the three-dimensional lead structure 101 supported on the insulating base 110, so that the plural side leads 105*a*, 105*b* and 105*c* are separated from the island 103.

The fabrication apparatus also includes a wire-bonding unit for taking place a wire-bonding process for connecting the laser diodes LD1 and LD2 and the photo-diode PD through metal wirings to the plural side leads 105*a*, 105*b* and 105*c*. In a step S6, the laser diodes LD1 and LD2 and the photo-diode PD are wire-bonded by the wire-bonding unit through metal wirings to the plural side leads 105*a*, 105*b* and 105*c*.

The fabrication apparatus also includes a cap mounting unit for mounting and adhering the cap 120 onto the lead structure 101 engaged with the lead 100A of the lead frame 100-1, thereby to form a semiconductor laser device assembly. In a step S7, the cap 120 is mounted or adhered by the cap mounting unit onto the lead structure 101 with the insulating base 110 as separated from the frame 100A of the lead frame 100-1, thereby to form a semiconductor laser device assembly.

The fabrication apparatus also includes a separating unit for separating the three-dimensional lead structure 101 with the wire-bondings from the frame 100A of the lead frame 100-1. In a step S8, the three-dimensional lead structure 101 with the wire-bondings are separated by the separating unit from the frame 100A of the lead frame 100-1.

The fabrication apparatus also includes an unloader unit for unloading or picking up the semiconductor laser device assembly from the fabrication apparatus. In a step S9, the semiconductor laser device assembly is unloaded or picked up by the unloader unit from the fabrication apparatus.

The above sequential processes will be described again but more details with reference to drawings.

In the step S1, the lead frame 100-1 shown in FIG. 15 is loaded by the loader unit to the die-bonding unit.

In the step S2, the laser diodes LD1 and LD2 and the single photo-diode PD are mounted by the die-bonding unit onto the island 103 of the two-dimensional original form of the lead structure 101 engaged within the lead frame 100-1. The photo-diode PD is directly mounted on the island 103, and the laser diodes LD1 and LD2 are mounted on the photo-diode PD. In this embodiment, the die-boning process is taken place using a hard soldering material for reducing a heat resistance.

In the step S3, the lead frame 100-1 is transferred from the die-boning unit to the bending work unit, so that a part of the original form of the lead structure 101 mounted with the laser diodes LD1 and LD2 and the single photo-diode PD is bent by the bending work unit to form a three-dimensional lead structure 101. The bending work unit twists the temporary supporting connections 108 by a right angle and also bends boundaries between the second and third parts of the connection parts 106 by the right angle, so that the flange 102 and the first and second parts of the connection parts 106 become extending in a plan vertical to the plan of the lead frame 100-1, while the island 103, the single center lead 104, the plural side leads 105*a*, 105*b* and 105*c*, the third parts of the connection parts 106 and the temporary connection parts 107 remain extending in the same plan as the lead frame 100-1.

In the step S4, the lead frame 100-1 with the three dimensional lead structure 101 is transferred from the bending work unit to the resin molding unit, so that a resin molding process is taken place by the resin molding unit to form the insulating base 110 which supports the three-dimensional lead structure 101. The lead frame 100-1 with the three dimensional lead structure 101 is set in molding dies for taking place a molding process with an electrically insulating resin. A pair of the molding dies move in opposite directions which are parallel to the plan of the lead frame 100-1 and perpendicular to a longitudinal direction of the lead frame 100-1 without causing any physical interference with the lead frame 100-1, so that the paired molding dies sandwich the flange 102, thereby to form a cavity in one side of the flange 102, while the island 103 is positioned in the opposite side thereto.

An electrically insulating resin is injected into a cavity defined by the paired molding dies which sandwich the flange 102 for carrying out the resin molding process, whereby the insulating base 110 of the electrically insulating resin material is formed on the one side of the flange 102. The insulating base 110 has the generally flat cylinder shape with the orientation flat. The flange 102 is present on the surface of the insulating base 110. The insulating base 110 provides a sufficient mechanical strength to the flange 102. Further, the insulating base 110 supports the single center lead 104 and the plural side leads 105*a*, 105*b* and 105*c*, so that the single center lead 104 and the plural side leads 105*a*, 105*b* and 105*c* are electrically separated by the insulating base 110 from each other and from the flange 102, wherein each of the single center lead 104 and the plural side leads 105*a*, 105*b* and 105*c* has an inner projecting part which projects from the one surface of the insulating base 110 toward the same side as the island 103 and also an outer projecting part which projects from the opposite surface of the insulating base 110 toward the opposite side to the island 103. One face of the flange 120 is in contact directly with the one face of the insulating base 110, while the opposite face of the flange 120 is exposed.

In the step S5, the lead frame 100-1 is further transferred from the resin molding unit to the cutting unit, so that the temporary connection parts 107 are cut off or removed from the three-dimensional lead structure 101 supported on the insulating base 110. The plural side leads 105*a*, 105*b* and 105*c* are mechanically and electrically separated from the island 103, while the plural side leads 105*a*, 105*b* and 105*c* remain supported by the insulating base 110. The single center lead 104 remains connected with the island 103 and also connected through the connection parts 106 to the flange 102.

Figure 17:
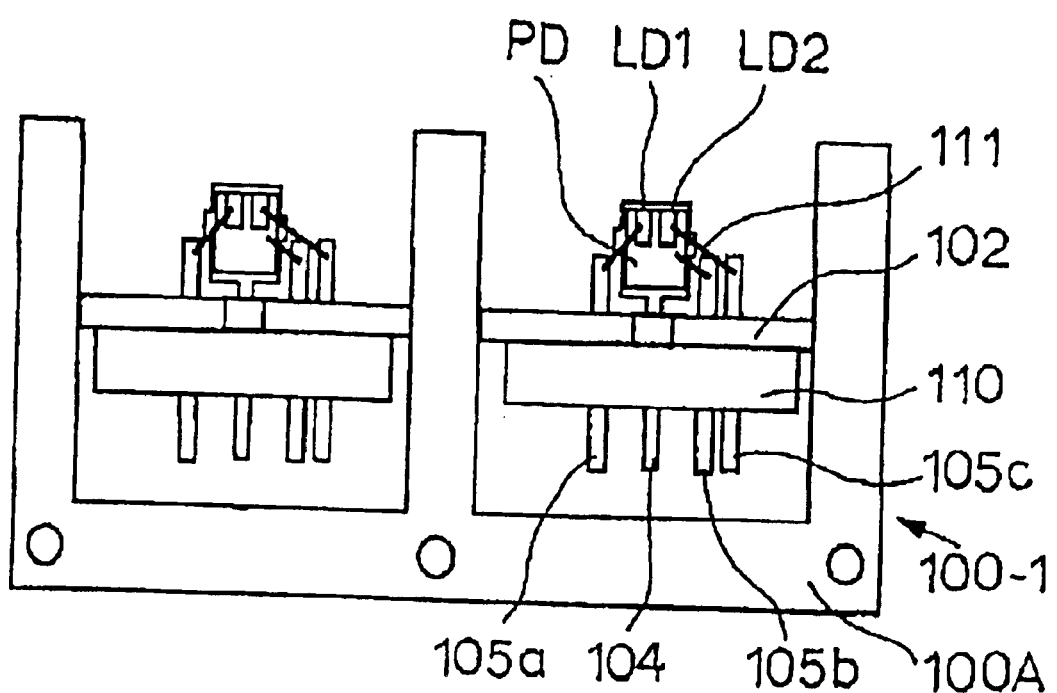
FIG. 17 is a fragmentary plan view illustrative of the lead frame having the three-dimensional original form of the lead structure with the insulating base and the wire-bondings in the second embodiment in accordance with the present invention.

In the step S6, the lead frame 100-1 is further transferred from the cutting unit to the wire-bonding unit, so that the laser diodes LD1 and LD2 and the photodiode PD are wire-bonded through metal wirings to the plural side leads 105*a*, 105*b* and 105*c*. FIG. 17 is a fragmentary plan view illustrative of the lead frame 100-1 having the three-dimensional original form of the lead structure 101 with the insulating base 110 and the wire-bondings. The plural side leads 105a, 105b and 105c extend in the same plan as the island 103. This allows the existent wire-bonding technique to be applied. The laser diode LD1 is electrically connected to the inner projecting part of the side lead 105a through a metal wiring 111 by a wire-bonding process. The laser diode LD2 is also electrically connected to the inner projecting part of the side lead 105c through another metal wiring 111 by the wire-bonding process. The single photo-diode PD is also electrically connected to the inner projecting part of the side lead 105b through still another metal wiring 111 by the wire-bonding process.

Figure 18:
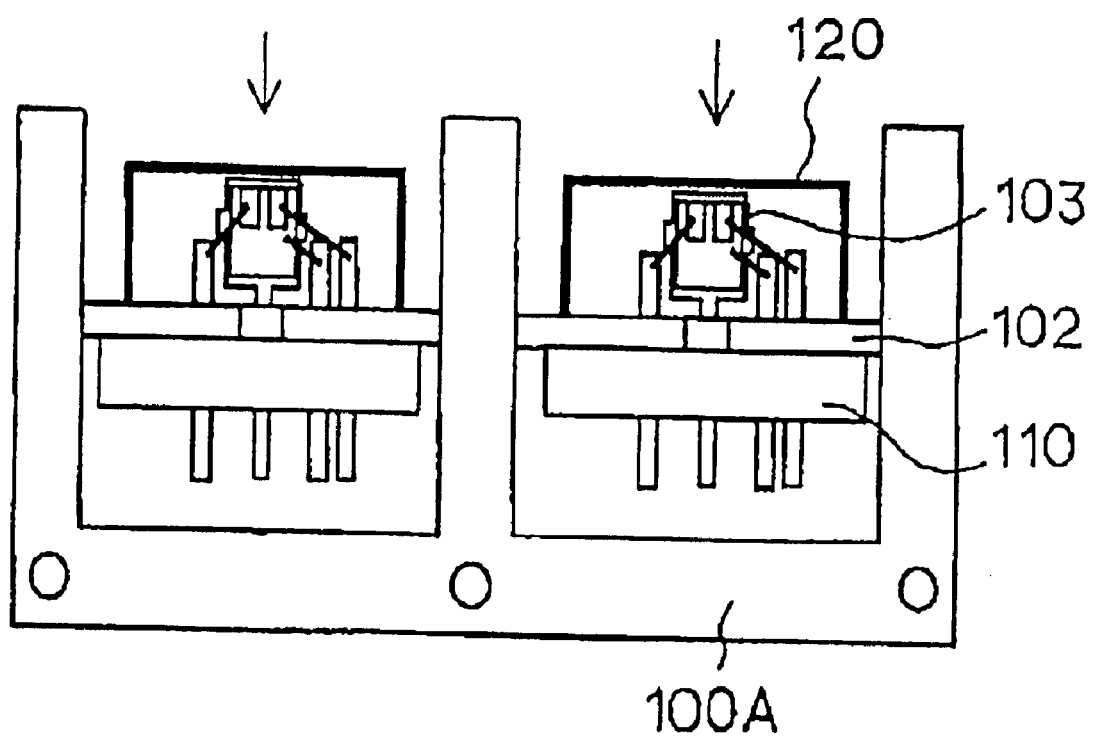
FIG. 18 is one side view of a plurality of the semiconductor laser device assembly engaged with the frame of the lead frame in the second embodiment in accordance with the present invention.

In the step S7, the lead frame 100-1 is transferred into the cap mounting unit, so that the cap 120 is mounted or adhered by the cap mounting unit onto the lead structure 101 with the insulating base 110 still engaged with the frame 100A of the lead frame 100-1, thereby to form a plurality of semiconductor laser device assembly engaged with the frame 100A of the lead frame 100-1. FIG. 18 is one side view of a plurality of the semiconductor laser device assembly engaged with the frame 100A of the lead frame 100-1. The cap 120 is moved through the open side 100a of the frame 100A to a position over the lead structure 101, and then is provided over the upper surface of the insulating base 110 for covering the lead structure 101 over the insulating base 110. The cap 120 may have a cylinder shape with an opening side periphery which is aligned to the inside of the periphery of the insulating base 110, so that the opening side periphery of the cap 120 is adhered to the inside of the periphery of the flange 102 via an adhesive, whereby the periphery of the flange 102 or the periphery of the insulating base 110 is present outside the cap 120. The cap 120 also has an opening window 121 which has a circle-shape. The opening window 121 allows transmissions of the laser beams emitted from the laser diodes LD1 and LD2.

In the step S8, the lead frame 100-1 with a plurality of the semiconductor laser device assembly is further transferred from the cap-mounting unit to the separating unit, so that a plurality of the semiconductor laser device assembly are separated from the frame 100A of the lead frame 100-1. The temporary supporting connections 108 are cut off or removed from the lead frame 100-1, so that the plural semiconductor laser device assemblies are separated from the frame 100A of the lead frame 100-1.

In the step S9, the plural semiconductor laser device assemblies are transferred from the separating unit to the unloader unit, so that a plurality of the semiconductor laser device assembly is unloaded or picked up from the unloader unit.

As described above, in accordance with the fabrication processes of the present invention, the lead frame 100 including the plural lead structures 101 is subjected to the sequential batch-processes, for example, the die-bonding process, the bending process, the resin-molding process, the cutting process, the wire-bonding process, the cap-mounting process and the separating process. This allows a completely automated batch-assembling process for assembling the semiconductor laser devices. This complete automated batch-assembling process realizes a desired increase in the productivity of the semiconductor laser device of the high quality or the high performances.

The assembled semiconductor laser device has a can-shaped package. This allows applications of the semiconductor laser device to a variety of the existent optical equipments.

Further, the assembled semiconductor laser device has the above-described single-united lead structure which comprises the island 103, the single center lead 104, the connection parts 166 and the flange 102. The single-united lead structure is processed from the single metal plate or sheet through the above-described sequential batch-processes. Namely, the island 103, the single center lead 104, the connection tarts 106 and the flange 102 are in the single-united from. This single-united from provides an effective heat radiation path. For example, a heat generated by the laser diodes LD1 and LD2 may be conducted through the island 103, the inner projecting part of the single center lead 104, the connection parts 106 and the flange 102 to the cap 120, from which the conducted heat is radiated.

Furthermore, the island 103 and the flange 102 are in the single-united form. This makes it easy to realize a highly accurate relative-positioning of the laser diodes LD1 and LD2 with reference to the flange 102. A peripheral surface of the flange 102 is made into contact directly with a reference plane of the optical equipment for mounting the assembled semiconductor laser device on the optical equipment. This realizes a highly accurate positioning of the semiconductor laser device with reference to a position of the light source of the optical equipment.

In this embodiment, the lead frame 100 is subjected to the bending process for bending a part of the two-dimensional original form of the lead structure 101 to form the three-dimensional lead structure 101. A metal material for the lead frame 100 or the lead structure 101 should be selected in consideration of preventing any disconnection or break at the bent part of the lead structure 101. Typical examples of the available metal materials for the lead structure 101 or the lead same 100 may include, but not limited to, 42-alloy, aluminum, and aluminum alloys, in addition to copper.

The respective shapes and dimensions of the lead frame 100, the flange 102, the island 103, the single center lead 104, and the plural side leads 105a, 105b and 105c are optional.

The cap 120 may optionally have a condensing lens on the opening window 121 to seal an inner space of the cap 120.

The semiconductor laser device may optionally be free of any cap.

One or more optical semiconductor elements mounted on the island 103 should not be limited to the photo-diode PD and the laser diodes LD.

Third Embodiment:

A third embodiment according to the present invention will be described in detail with reference to the drawings. The semiconductor laser device of this embodiment has the same structure as that in the first embodiment and shown in FIG. 4. Namely, the semiconductor laser device includes the insulating base 110, the lead structure 101, the first and second laser diodes LD1 and LD2, the photo-diode PD and the cap 120. The resin base 110 may have the generally disk shape or the flat cylinder shape with the orientation flat which is parallel to the first horizontal direction. The insulating base 110 serves to support the lead structure 101 or provides the mechanical strength to the lead structure 101, and also provide the electrical insulation to the lead structure 101. The insulating base 110 may comprise the insulation resin material. The insulating base 110 may be formed by the molding process.

The lead structure 101 is formed from the metal plate or the metal sheet through either the press working process or the etching process. The metal plate or the metal sheet are proceeded to form a lead frame, from which the lead structure 101 is cut.

The lead structure 101 comprises the flange 102, the island 103, the single center lead 104, the plural side leads 105a, 105b and 105c and the connection parts 106. The flange 102, the Island 103, the single center lead 104 and the connection parts 106 comprise a single united part of the lead structure 101. Namely, the flange 102, the island 103, the single center lead 104 and the connection parts 106 are unitary formed and made of the same conductive material such as a metal. Detailed descriptions of the respective structures of the flange 102, the island 103, the single center lead 104, the plural side leads 105a, 105b and 105c and the connection parts 106 are the same as made in the first embodiment.

Figure 19:
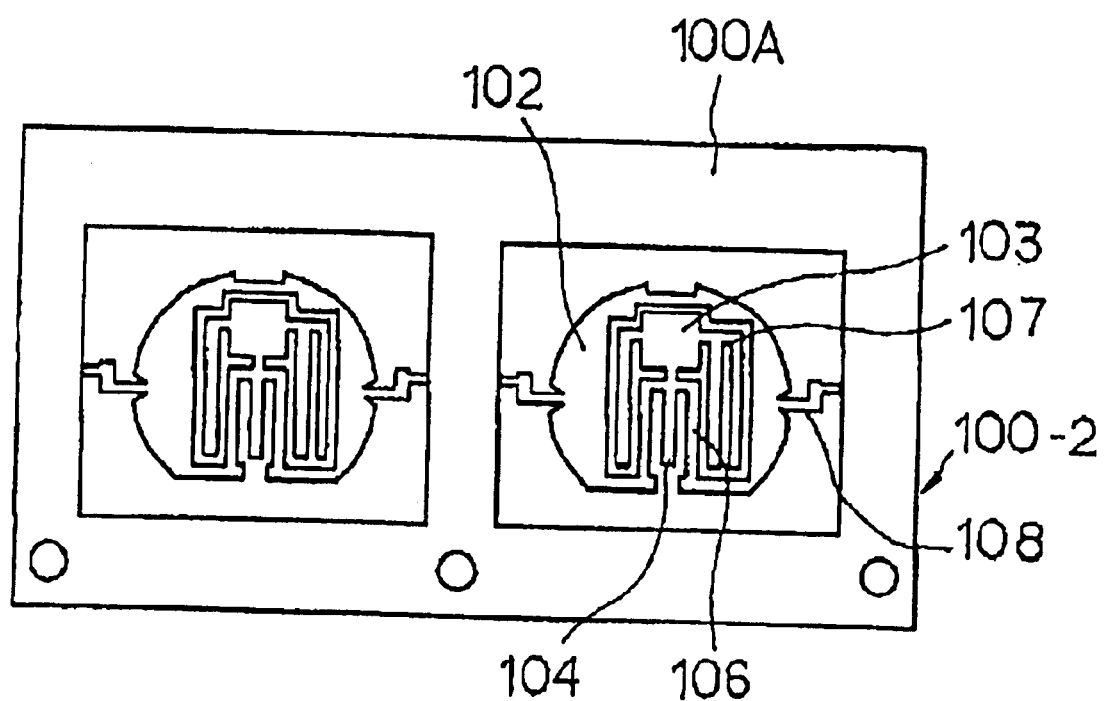
FIG. 19 is a fragmentary plan view of a lead frame including a plurality of the original form of the above-described lead structure 101 shown in FIG. 4 in the third embodiment in accordance with the present invention.

The above-described semiconductor laser device 1 may be fabricated as follows. The above unique structure of the semiconductor laser device 1 allows batch-fabrication-processes for a plurality of the semiconductor laser device 1 by using a lead frame. FIG. 19 is a fragmentary plan view of a lead frame including a plurality of the original form of the above-described lead structure 101 shown in FIG. 4. This lead frame 100-2 is different from the lead frame 100 described in the first embodiment in that the single center lead 104 is separated from the frame 100A of the lead frame 100-2. A lead frame 100-2 extends in a two-dimensional space. The lead frame 100-2 may be formed through a press-working process or an etching process from a metal plate or a metal sheet. The lead frame 100-2 includes a ladder-shape frame 100A, and an alignment of plural original forms of the above-described lead structure 101, each of which is supported by the frame 100A via temporary supporting connections 108 which connects the original form of the lead structure 101 to the frame 100A. The original form of the lead structure 101 also extends in the two-dimensional space. Namely, each of the original form of the lead structure 101 is supported or surrounded by four sides of the ladder-shaped frame 100A.

The original form of the lead structure 101 is the same as that in the first embodiment except that the single center lead 104 is separated from the frame 100A of the lead frame 100-2. Namely, the original form of the lead structure 101 includes the flange 102, the island 103, the single center lead 104, the plural side leads 105a, 105b and 105c, and the connection parts 106, and further temporary connection parts 107. The original form of the lead structure 101 of the two-dimensional structure is deformed into the three-dimensional structure as shown in FIG. 4.

Fabrication processes for the semiconductor laser device of this embodiment are the same as the above-described processes shown in FIG. 16 in the second embodiment, except for the bending process. The fabrication apparatus for fabricating the semiconductor laser devices also include plural units which perform respective processes as follows. The fabrication apparatus includes a loader unit which supplies the lead frame 100-2 shown in FIG. 19. In a step S1, the lead frame 100-2 is loaded by the loader unit to the fabrication apparatus.

The fabrication apparatus also includes a die-bonding unit taking place a die-bonding process for mounting the laser diodes LD1 and LD2 and the single photo-diode PD onto the island 103 of the original form of the lead structure 101 engaged within the lead frame 100-2. In a step S2, the laser diodes LD1 and LD2 and the single photo-diode. PD are mounted by the die-bonding unit onto the island 103 of the original form of the lead structure 101 engaged within the lead frame 100-2.

The fabrication apparatus also includes a bending work unit for bending a part of the original form of the lead structure 101 mounted with the laser diodes LD1 and LD2 and the single photo-diode PD to form a three-dimensional lead structure 101. In a step S3, a part of the original form of the lead structure 101 mounted with the laser diodes LD1 and LD2 and the single photo-diode PD is bent by the bending work unit to form a three-dimensional lead structure 101.

The fabrication apparatus also includes a resin molding unit for taking place a resin molding process to form the insulating base 110 which supports the three-dimensional lead structure 101. In a step S4, a resin molding process is taken place by the resin molding unit to form the insulating base 110 which supports the three-dimensional lead structure 101.

The fabrication apparatus also includes a cutting unit for cutting off or removing the temporary connection parts 107 from the three-dimensional lead structure 101 supported on the insulating base 110, so that the plural side leads 105a, 105b and 105c are separated from the island 103. In a step S5, the temporary connection parts 107 are cut off or removed by the cutting unit from the three-dimensional lead structure 101 supported on the insulating base 110, so that the plural side leads 105a, 105b and 105c are separated from the island 103.

The fabrication apparatus also includes a wire-bonding unit for taking place a wire-bonding process for connecting the laser diodes LD1 and LD2 and the photo-diode PD through metal wirings to the plural side leads 105a, 105b and 105c. In a step S6, the laser diodes LD1 and LD2 and the photo-diode PD are wire-bonded by the wire-bonding unit through metal wirings to the plural side leads 105a, 105b and 105c.

The fabrication apparatus also includes a cap mounting unit for mounting and adhering the cap 120 onto the lead structure 101 with the insulating base 110, thereby to form a semiconductor laser device assembly. In a step S7, the cap 120 is mounted or adhered by the cap mounting unit onto the lead structure 101 with the insulating base 110 as separated from the frame 100A of the lead frame 100-2, thereby to form a semiconductor laser device assembly.

The fabrication apparatus also includes a separating unit for separating the three-dimensional lead structure 101 with the wire-bondings from the frame 100A of the lead frame 100-2. In a step S8, the three-dimensional lead structure 101 with the wire-bondings are separated by the separating unit from the frame 100A of the lead frame 100-2.

The fabrication apparatus also includes an unloader unit for unloading or picking up the semiconductor laser device assembly from the fabrication apparatus. In a step S9, the semiconductor laser device assembly is unloaded or picked up by the unloader unit from the fabrication apparatus.

The above sequential processes will be described again but more details with reference to drawings.

In the step S1, the lead frame 100-2 shown in FIG. 19 is loaded by the loader unit to the die-bonding unit.

In the step S2, the laser diodes LD1 and LD2 and the single photo-diode PD are mounted by the die-bonding unit onto the island 103 of the two-dimensional original form of the lead structure 101 engaged within the lead frame 100-2. The photo-diode PD is directly mounted on the island 103, and the laser diodes LD1 and LD2 are mounted on the photo-diode PD. In this embodiment, the die-boning process is taken place using a hard soldering material for reducing a heat resistance.

Figure 20:
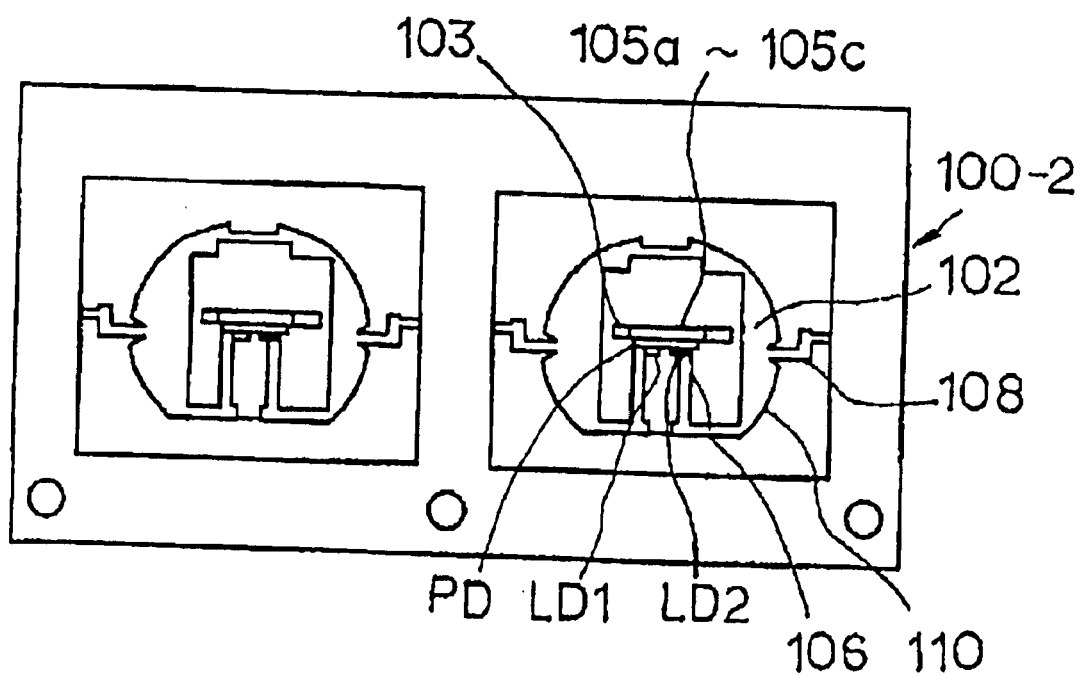
FIG. 20 is a fragmentary plan view illustrative of the lead frame having the three-dimensional original form of the lead structure in the third embodiment in accordance with the present invention.

In the step S3, the lead frame 100-2 is transferred from the die-boning unit to the bending work unit, so that a part of the original form of the lead structure 101 mounted with the laser diodes LD1 and LD2 and the single photo-diode PD is bent by the bending work unit to form a three-dimensional lead structure 101. FIG. 20 is, a fragmentary plan view illustrative of the lead frame 100 having the three-dimensional original form of the lead structure 101 in the third embodiment in accordance with the present invention. The bending work unit does not twist the temporary supporting connections 108, but does bend boundaries between the second and third parts of the connection parts 106 by the right angle, so that the island 103, the single center lead 104, the plural side leads 105a, 105b and 105c, the third parts of the connection parts 106 and the temporary connection parts 107 become extending in a plan vertical to the plan of the lead frame 100-2, while the flange 102 and the first and second parts of the connection parts 106 remain extending in the same plan as the lead frame 100-2.

In the step S4, the lead frame 100-2 with the three dimensional lead structure 101 is transferred from the bending work unit to the resin molding unit, so that a resin molding process is taken place by the resin molding unit to form the insulating base 110 which supports the three-dimensional lead structure 101. The lead frame 100-2 with the three-dimensional lead structure 101 is set in molding dies for taking place a molding process with an electrically insulating resin. A pair of the molding dies move in opposite directions which are vertical to the plan of the lead frame 100-2 and perpendicular to a longitudinal direction of the lead frame 100-2 without causing any physical interference with the lead frame 100-2, so that the paired molding dies sandwich the flange 102, thereby to form a cavity in one side of the flange 102, while the island 103 is positioned in the opposite side thereto.

An electrically insulating resin is injected into a cavity defined by the paired molding dies which sandwich the flange 102 for carrying out the resin molding process, whereby the insulating base 110 of the electrically insulating resin material is formed on the one side of the flange 102. The insulating base 110 has the generally flat cylinder shape with the orientation flat. The flange 102 is present on the surface of the insulating base 110. The insulating base 110 provides a sufficient mechanical strength to the flange 102. Further, the insulating base 110 supports the single center lead 104 and the plural side leads 105a, 105b and 105c, so that the single center lead 104 and the plural side leads 105a, 105b and 105c are electrically separated by the insulating base 110 from each other and from the flange 102, wherein each of the single center lead 104 and the plural side leads 105a, 105b and 105c has an inner protecting part which projects from the one surface of the insulating base 110, toward the same side as the island 103 and also an outer projecting part which projects from the opposite surface of the insulating base 110 toward the opposite side to the island 103. One face of the flange 120 is in contact directly with the one face of the insulating base 110, while the opposite face of the flange 120 is exposed.

In the step S5, the lead frame 100-2 is further transferred from the resin molding unit to the cutting unit, so that the temporary connection parts 107 are cut off or removed from the three-dimensional lead structure 101 supported on the insulating base 110. The plural side leads 105a, 105b and 105c are mechanically and electrically separated from the island 103, while the plural side leads 105a, 105b and 105c remain supported by the insulating base 110. The single center lead 104 remains connected with the island 103 and also connected through the connection parts 106 to the flange 102.

In the step S6, the lead frame 100-2 is further transferred from the cutting unit to the wire-bonding unit, so that the laser diodes LD1 and LD2 and the photo-diode PD are wire-bonded through metal wirings to the plural side leads 105a, 105b and 105c. The plural side leads 105a, 105b and 105c extend in the same plan as the island 103. This allows the existent wire-bonding technique to be applied. The laser diode LD1 is electrically connected to the inner projecting part of the side lead 105a through a metal wiring 111 by a wire-bonding process. The laser diode LD2 is also electrically connected to the inner projecting part of the side lead 105c through another metal wiring 111 by the wire-bonding process. The single photo-diode PD is also electrically connected to the inner projecting part of the side lead 105b through still another metal wiring 111 by the wire-bonding process.

Figure 21:
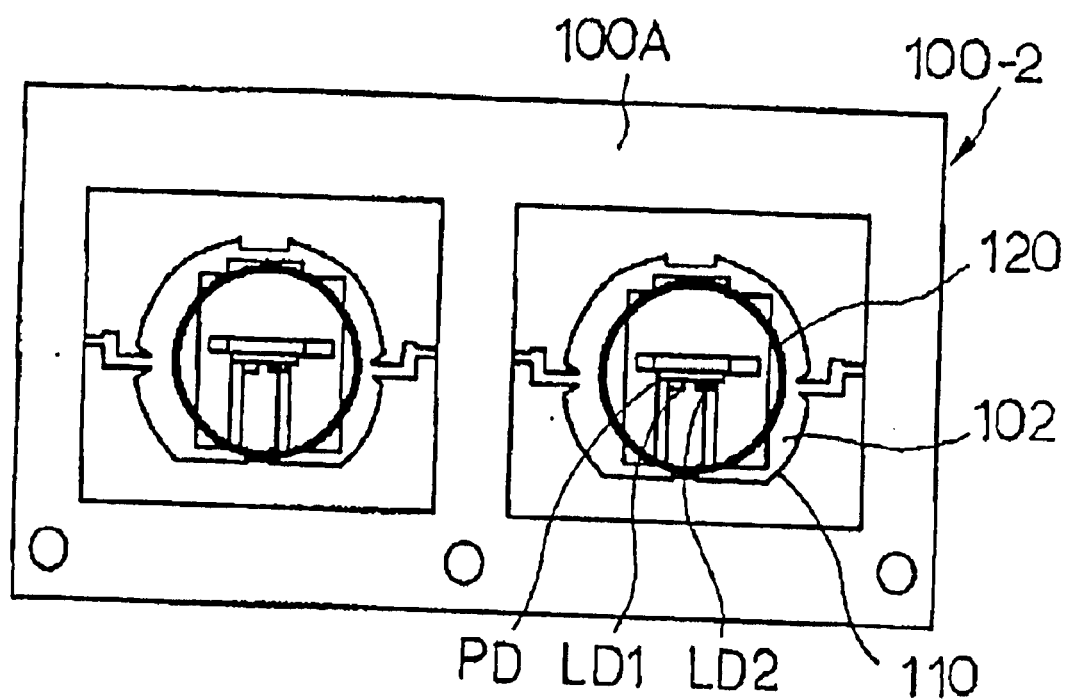
FIG. 21 is one side view of a plurality of the semiconductor laser device assembly engaged with the frame of the lead frame in the third embodiment in accordance with the present invention.

In the step S7, the lead frame 100-2 is transferred into the cap mounting unit, so that the cap 120 is mounted or adhered by the cap mounting unit onto the lead structure 101 with the insulating base 110 still engaged with the frame 100A of the lead frame 100-2, thereby to form a plurality of semiconductor laser device assembly engaged with the frame 100A of the lead frame 100-2. FIG. 21 is one side view of a plurality of the semiconductor laser device assembly engaged with the frame 100A of the lead frame 100-2. Since the flange 102 with the insulating base 110 face to a vertical direction to the plane of the lead frame 100. The cap 120 is moved downwardly and placed over the upper surface of the insulating base 110 for covering the lead structure 101 over the insulating base 110. The cap 120 may have a cylinder shape with an opening side periphery which is aligned to the inside of the periphery of the insulating base 110, so that the opening side periphery of the cap 120 is adhered to the inside of the periphery of the flange 102 via an adhesive, whereby the periphery of the flange 102 or the periphery of the insulating base 110 is present outside the cap 120. The cap 120 also has an opening window 121 which has a circle-shape. The opening window 121 allows transmissions of the laser beams emitted from the laser diodes LD1 and LD2.

In the step S8, the lead frame 100-2 with a plurality of the semiconductor laser device assembly is further transferred from the cap-mounting unit to the separating unit, so that a plurality of the semiconductor laser device assembly are separated from the frame 100A of the lead frame 100-2. The temporary supporting connections 108 are cut off or removed from the lead frame 100-2, so that the plural semiconductor laser device assemblies are separated from the frame 100A of the lead frame 100-2.

In the step S9, the plural semiconductor laser device assemblies are transferred from the separating unit to the unloader unit, so that a plurality of the semiconductor laser device assembly is unloaded or picked up from the unloader unit.

As described above, in accordance with the fabrication processes of the present invention, the lead frame 100 including the plural lead structures 101 is subjected to the sequential batch-processes, for example, the die-bonding process, the bending process, the resin-molding process, the cutting process, the wire-bonding process, the cap-mounting process and the separating process. This allows a completely automated batch-assembling process for assembling the semiconductor laser devices. This complete automated batch-assembling process realizes a desired increase in the productivity of the semiconductor laser device of the high quality or the high performances.

The assembled semiconductor laser device has a can-shaped package. This allows applications of the semiconductor laser device to a variety of the existent optical equipments.

Further, the assembled semiconductor laser device has the above-described single-united lead structure which comprises the island 103, the single center lead 104, the connection parts 106 and the flange 102. The single-united lead structure is processed from the single metal plate or sheet through the above-described sequential batch-processes. Namely, the island 103, the single center lead 104, the connection parts 106 and the flange 102 are in the single-united from. This single-united from provides an effective heat radiation path. For example, a heat generated by the laser diodes LD1 and LD2 may be conducted through the island 103, the inner projecting part of the single center lead 104, the connection parts 106 and the flange 102 to the cap 120, from which the conducted heat is radiated.

Furthermore, the island 103 and the flange 102 are in the single-united form. This makes it easy to realize a highly accurate relative-positioning of the laser diodes LD1 and LD2 with reference to the flange 102. A peripheral surface of the flange 102 is made into contact directly with a reference plane of the optical equipment for mounting the assembled semiconductor laser device on the optical equipment. This realizes a highly accurate positioning of the semiconductor laser device with reference to a position of the light source of the optical equipment.

In this embodiment, the lead frame 100 is subjected to the bending process for bending a part of the two-dimensional original form of the lead structure 101 to form the three-dimensional lead structure 101. A metal material for the lead frame 100 or the lead structure 101 should be selected in consideration of preventing any disconnection or break at the bent part of the lead structure 101. Typical examples of the available metal materials for the lead structure 101 or the lead frame 100 may include, but not limited to, 42-alloy, aluminum, and aluminum alloys, in addition to copper.

The respective shapes and dimensions of the lead frame 100, the flange 102, the island 103, the single center lead 104, and the plural side leads 105*a*, 105*b* and 105*c* are optional.

The cap 120 may optionally have a condensing lens on the opening window 121 to seal an inner space of the cap 120.

The semiconductor laser device may optionally be free of any cap.

One or more optical semiconductor elements mounted on the island 103 should not be limited to the photo-diode PD and the laser diodes LD.

Fourth Embodiment:

A fourth embodiment according to the present invention will be described in detail with reference to the drawings. The semiconductor laser device of this embodiment has the same structure as that in the first embodiment and shown in FIG. 4. Namely, the semiconductor laser device includes the insulating base 110, the lead structure 101, the first and second laser diodes LD1 and LD2, the photo-diode PD and the cap 120. The resin base 110 may have the generally disk shape or the flat cylinder shape with the orientation flat which is parallel to the first horizontal direction. The insulating base 110 serves to support the lead structure 101 or provides the mechanical strength to the lead structure 101, and also provide the electrical insulation to the lead structure 101. The insulating base 110 may comprise the insulation resin material. The insulating base 110 may formed by the molding process.

The lead structure 101 is formed from the metal plate or the metal sheet through either the press working process or the etching process. The metal plate or the metal sheet are proceeded to form a lead frame, from which the lead structure 101 is cut.

The lead structure 101 comprises the flange 102, the island 103, the single center lead 104, the plural side leads 105*a*, 105*b* and 105*c* and the connection parts 106. The flange 102, the island 103, the single center lead 104 and the connection parts 106 comprise a single united part of the lead structure 101. Namely, the flange 102, the island 103, the single center lead 104 and the connection parts 106 are unitary formed and made of the same conductive material such as a metal. Detailed descriptions of the respective structures of the flange 102, the island 103, the single center lead 104, the plural side leads 105*a*, 105*b* and 105*c* and the connection parts 106 are the same as made in the first embodiment.

The above-described semiconductor laser device 1 may be fabricated as follows. The above unique structure of the semiconductor laser device 1 allows batch-fabrication-processes for a plurality of the semiconductor laser device 1 by using a lead frame. FIG. 15 is a fragmentary plan view of a modified lead frame including a plurality of the original form of the above-described lead structure 101 shown in FIG. 4. This lead frame 100 is different from the lead frame 100 described in the first embodiment. A lead frame 100 extends in a two-dimensional space. The lead frame 100 may be formed through a press-working process or an etching process from a metal plate or a metal sheet. The lead frame 100 includes a comb-shaped frame 100A, and an alignment of plural original forms of the above-described lead structure 101, each of which is supported by the frame 100A via temporary supporting connections 108 which connects the original form of the lead structure 101 to the frame 100A. The original form of the lead structure 101 also extends in the two-dimensional space.

The original form of the lead structure 101 is the same as that in the first embodiment. Namely, the original form of the lead structure 101 includes the flange 102, the island 103, the single center lead 104, the plural side leads 105*a*, 105*b* and 105*c*, and the connection parts 106, and further temporary connection parts 107. The original form of the lead structure 101 of the two-dimensional structure is deformed into the three-dimensional structure as shown in FIG. 4.

Figure 22:
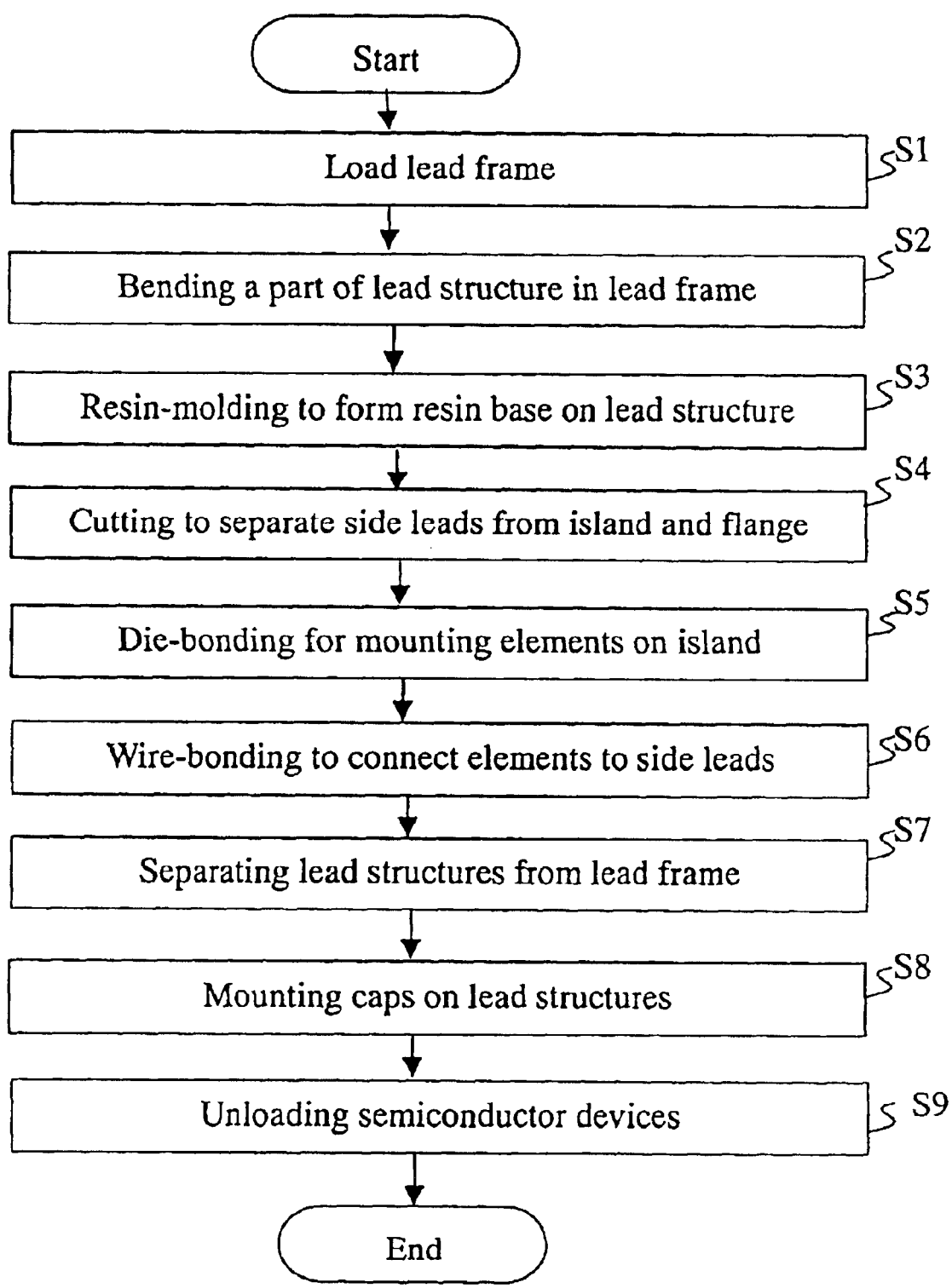
FIG. 22 is a flow chart illustrative of fabrication processes for the semiconductor laser device of the fourth embodiment in accordance with the present invention.

FIG. 22 is a flow chart illustrative of fabrication processes for the semiconductor laser device of the fourth embodiment in accordance with the present invention. The fabrication apparatus for fabricating the semiconductor laser devices also include plural units which perform respective processes as follows. The fabrication apparatus includes a loader unit which supplies the lead frame 100 shown in FIG. 5. In a step S1, the lead frame 100 is loaded by the loader unit to the fabrication apparatus.

The fabrication apparatus also includes a bending work unit for bending a part of the original form of the lead structure 101 mounted with the laser diodes LD1 and LD2 and the single photo-diode PD to form a three-dimensional lead structure 101. In a step S2, a part of the original form of the lead structure 101 is bent by the bending work unit to form a three-dimensional lead structure 101.

The fabrication apparatus also includes a resin molding unit for taking place a resin molding process to form the insulating base 110 which supports the three-dimensional lead structure 101. In a step S3, a resin molding process is taken place by the resin molding unit to form the insulating base 110 which supports the three-dimensional lead structure 101.

The fabrication apparatus also includes a cutting unit for cutting off or removing the temporary connection parts 107 from the three-dimensional lead structure 101 supported on the insulating base 110, so that the plural side leads 105*a*, 105b and 105c are separated from the island 103. In a step S4, the temporary connection parts 107 are cut off or removed by the cutting unit from the three-dimensional lead structure 101 supported on the insulating base 110, so that the plural side leads 105a, 105b and 105c are separated from the island 103.

The fabrication apparatus also includes a die-bonding unit taking place a die-bonding process for mounting the laser diodes LD1 and LD2 and the single photo-diode PD onto the island 103 of the original form of the lead structure 101 engaged within the lead frame 100. In a step S5, the laser diodes LD1 and LD2 and the single photo-diode PD are mounted by the die-bonding unit onto the island 103 of the original form of the lead structure 101 engaged within the lead frame 100.

The fabrication apparatus also includes a wire-bonding unit for taking place a wire-bonding process for connecting the laser diodes LD1 and LD2 and the photo-diode PD through metal wirings to the plural side leads 105a, 105b and 105c. In a step S6, the laser diodes LD1 and LD2 and the photo-diode PD are wire-bonded by the wire-bonding unit through metal wirings to the plural side leads 105a, 105b and 105c.

The fabrication apparatus also includes a separating unit for separating the three-dimensional lead structure 101 with the wire-bondings from the frame 100A of the lead frame 100. In a step S7, the three-dimensional lead structure 101 with the wire-bondings are separated by the separating unit from the frame 100A of the lead frame 100.

The fabrication apparatus also includes a cap mounting unit for mounting and adhering the cap 120 onto the lead structure 101 as separated from the lead 100A of the lead frame 100, thereby to form a semiconductor laser device assembly. In a step S8, the cap 120 is mounted or adhered by the cap mounting unit onto the lead structure 101 with the insulating base 110 as separated from the frame 100A of the lead frame 100, thereby to form a semiconductor laser device assembly.

The fabrication apparatus also includes an unloader unit for unloading or picking up the semiconductor laser device assembly from the fabrication apparatus. In a step S9, the semiconductor laser device assembly is unloaded or picked up by the unloader unit from the fabrication apparatus.

The above sequential processes will be described again but more details with reference to drawings.

In the step S1, the lead frame 100 shown in FIG. 5 is loaded by the loader unit to the die-bonding unit.

Figure 23:
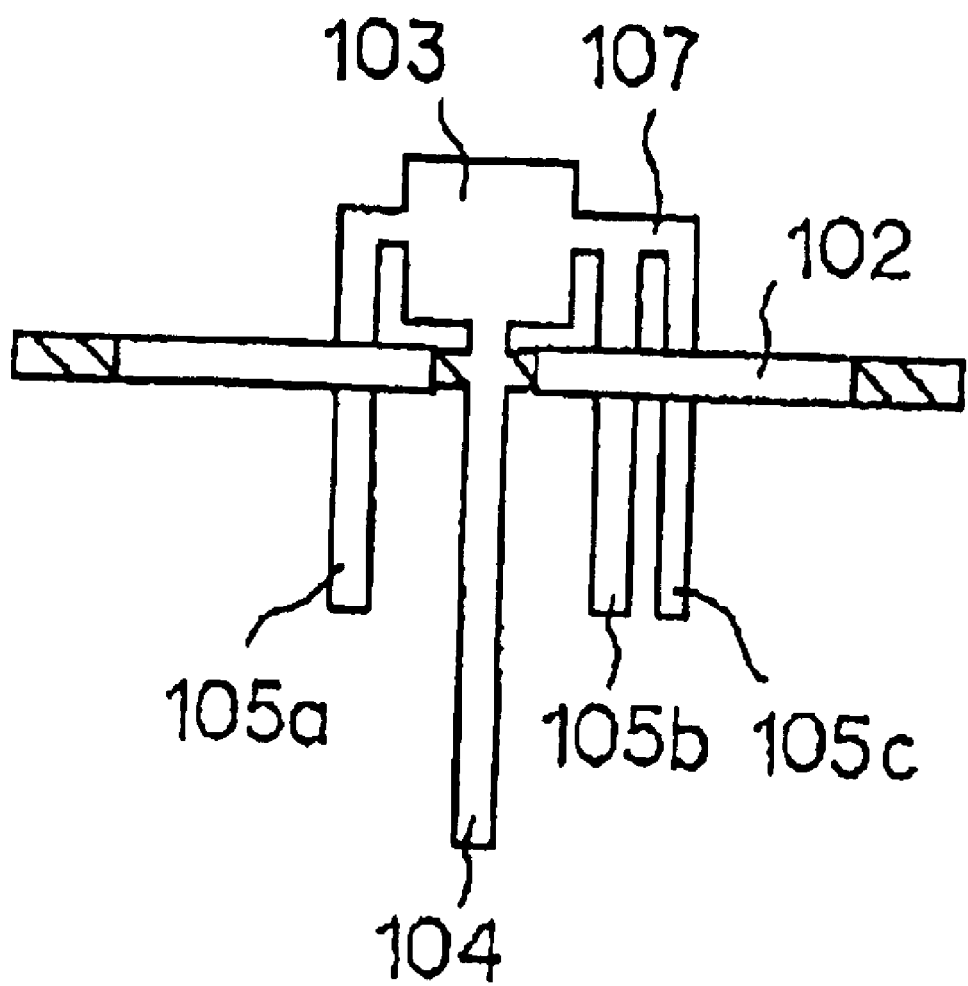
FIG. 23 is a fragmentary plan view illustrative of the lead frame having the three-dimensional original form of the lead structure in the fourth embodiment in accordance with the present invention.

In the step S2, the lead frame 100 is transferred from the loader unit to the bending work unit, so that a part of the original form of the lead structure 101 is bent by the bending work unit to form a three-dimensional lead structure 101. FIG. 23 is a fragmentary plan view illustrative of the lead frame 100 having the three-dimensional original form of the lead structure 101. The bending work unit twists the temporary supporting connections 108 by a right angle and also bends boundaries between the second and third parts of the connection parts 106 by the right angle, so that the flange 102 and the first and second parts of the connection parts 106 become extending in a plan vertical to the plan of the lead frame 100, while the island 103, the single center lead 104, the plural side leads 105a, 105b and 105c, the third parts of the connection parts 106 and the temporary connection parts 107 remain extending in the same plan as the lead frame 100.

Figure 24:
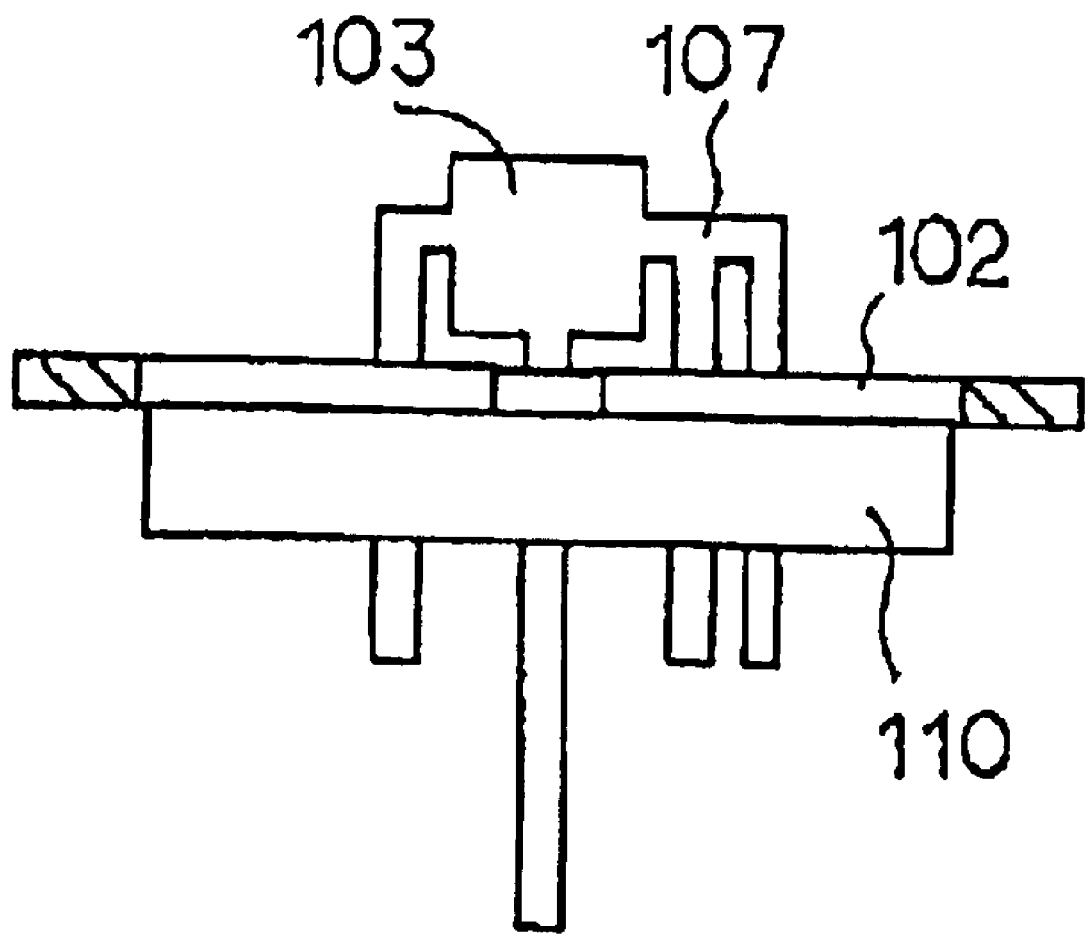
FIG. 24 is a fragmentary plan view illustrative of the lead frame having the three-dimensional original form of the lead structure with the insulating base in the fourth embodiment in accordance with the present invention.

In the step S3, the lead frame 100 with the three dimensional lead structure 101 is transferred from the bending work unit to the resin molding unit, so that a resin molding process is taken place by the resin molding unit to form the insulating base 110 which supports the three-dimensional lead structure 101. FIG. 24 is a fragmentary plan view illustrative of the lead frame 100 having the three-dimensional original form of the lead structure 101 with the insulating base 110. The lead frame 100 with the three dimensional lead structure 101 is set in molding dies for taking place a molding process with an electrically insulating resin. A pair of the molding dies move in opposite directions which are parallel to the plan of the lead frame 100 and perpendicular to a longitudinal direction of the lead frame 100 without causing any physical interference with the lead frame 100, so that the paired molding dies sandwich the flange 102, thereby to form a cavity in one side of the flange 102, while the island 103 is positioned in the opposite side thereto.

An electrically insulating resin is injected into a cavity defined by the paired molding dies which sandwich the flange 102 for carrying out the resin molding process, whereby the insulating base 110 of the electrically insulating resin material is formed on the one side of the flange 102. The insulating base 110 has the generally flat cylinder shape with the orientation flat. The flange 102 is present on the surface of the insulating base 110. The insulating base 110 provides a sufficient-mechanical strength to the flange 102. Further, the insulating base 110 supports the single center lead 104 and the plural side leads 105a, 105b and 105c, so that the single center lead 104 and the plural side leads 105a, 105b and 105c are electrically separated by the insulating base 110 from each other and from the flange 102, wherein each of the single center lead 104 and the plural side leads 105a, 105b and 105c has an inner projecting part which projects from the one surface of the insulating base 110 toward the same side as the island 103 and also an outer projecting part which projects from the opposite surface of the insulating base 110 toward the opposite side to the island 103. One face of the flange 120 is in contact directly with the one face of the insulating base 110, while the opposite face of the flange 120 is exposed.

Figure 25:
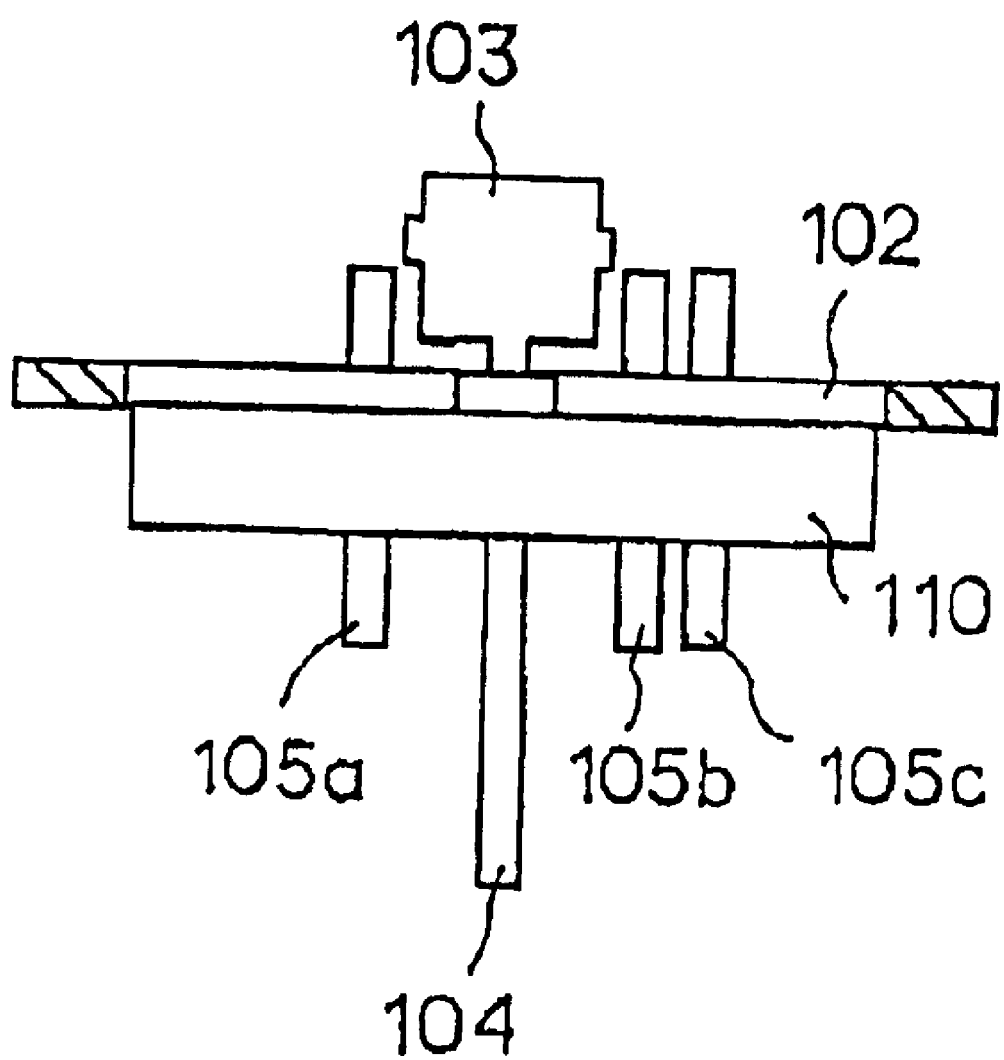
FIG. 25 is a fragmentary plan view illustrative of the lead frame having the three-dimensional original form of the lead structure with the insulating base after the temporary connection parts are cut off or removed in the fourth embodiment in accordance with the present invention.

In the step S4, the lead frame 100 is further transferred from the resin molding unit to the cutting unit, so that the temporary connection parts 107 are cut off or removed from the three-dimensional lead structure 101 supported on the insulating base 110. FIG. 25 is a fragmentary plan view illustrative of the lead frame 100 having the three-dimensional original form of the lead structure 101 with the insulating base 110 after the temporary connection parts 107 are cut off or removed. The plural side leads 105a, 105b and 105c are mechanically and electrically separated from the island 103, while the plural side leads 105a, 105b and 105c remain supported by the insulating base 110. The single center lead 104 remains connected with the island 103 and also connected through the connection parts 106 to the flange 102.

Figure 26:
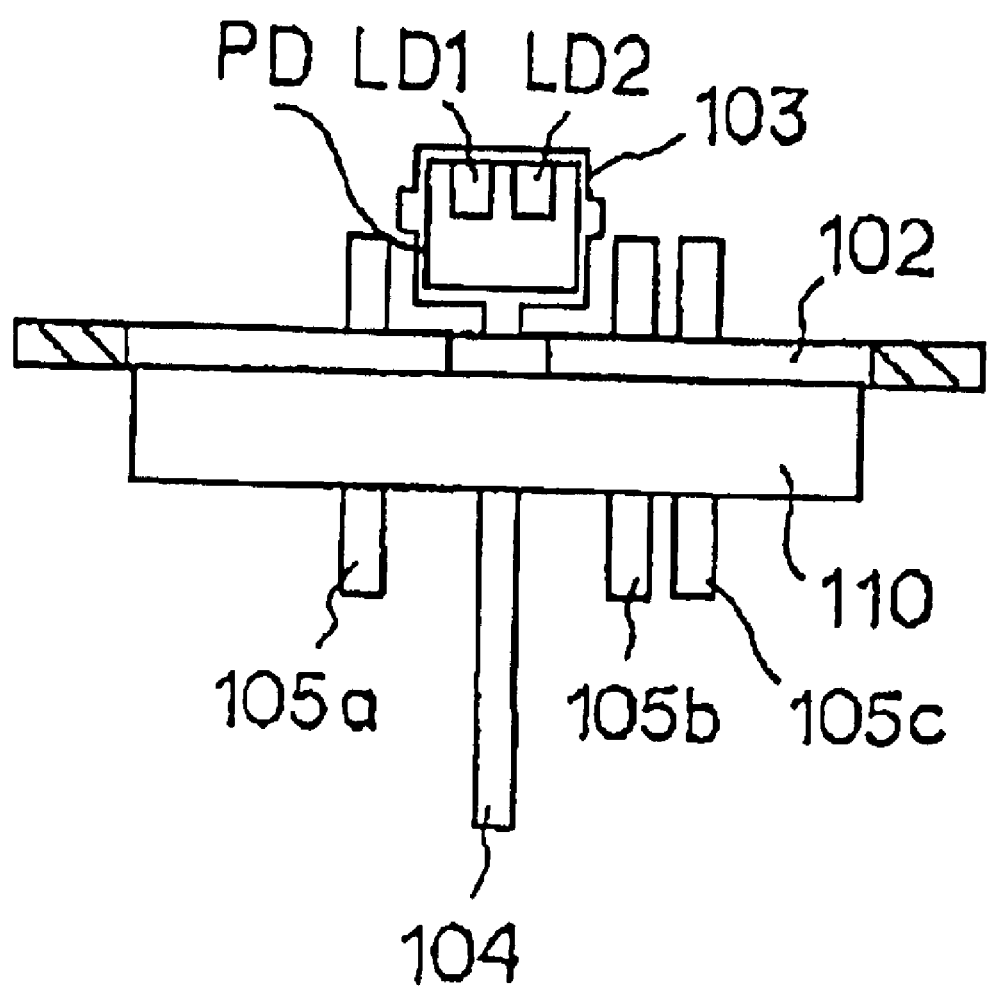
FIG. 26 is a fragmentary plan view illustrative of the three-dimensional form of the lead structure engaged within the lead frame, wherein the laser diodes and the single photo-diode are mounted on the island in the fourth embodiment in accordance with the present invention.

In the step S5, the lead frame 100 is further transferred from the cutting unit to the die-bonding unit, so that the laser diodes LD1 and LD2 and the single photo-diode PD are mounted by the die-bonding unit onto the island 103 of the three-dimensional original form of the lead structure 101 engaged within the lead frame 100. FIG. 26 is a fragmentary plan view illustrative of the three-dimensional form of the lead structure 101 engaged within the lead frame 100, wherein the laser diodes LD1 and LD2 and the single photo-diode PD are mounted on the island 103. The photo-diode PD is directly mounted on the island 103, and the laser diodes LD1 and LD2 are mounted on the photo-diode PD. In this embodiment, the die-boning process is taken place using a hard soldering material for reducing a heat resistance.

In the step S6, the lead frame 100 is further transferred from the die-bonding unit to the wire-bonding unit, so that the laser diodes LD1 and LD2 and the photo-diode PD are wire-bonded through metal wirings to the plural side leads 105*a*, 105*b* and 105*c* The plural side leads 105*a*, 105*b* and 105*c* extend in the same plan as the island 103. This allows the existent wire-bonding technique to be applied. The laser diode LD1 is electrically connected to the inner projecting part of the side lead 105*a* through a metal wiring 111 by a wire-bonding process. The laser diode LD2 is also electrically connected to the inner projecting part of the side lead 105*c* through another metal wiring 111 by the wire-bonding process. The single photo-diode PD is also electrically connected to the inner projecting part of the side lead 105*b* through still another metal wiring 111 by the wire-bonding process.

In the step S7, the lead frame 100 with a plurality of the lead structure 101 is further transferred from the wire-bonding unit to the separating unit, so that a plurality of the lead structure 101 are separated from the frame 100A of the lead frame 100. The temporary supporting connections 108 are cut off or removed from the lead frame 100, so that the plural lead structures 101 are separated from the frame 100A of the lead frame 100.

In the step S8, the lead frame 100 is transferred from the separating unit into the cap mounting unit, so that the cap 120 is mounted or adhered by the cap mounting unit onto the lead structure 101 with the insulating base 110 as separated from the frame 100A of the lead frame 100, thereby to form a plurality of semiconductor laser device assembly as separated from the frame 100A of the lead frame 100. The cap 120 may have a cylinder shape with an opening side periphery which is aligned to the inside of the periphery of the insulating base 110, so that the opening side periphery of the cap 120 is adhered to the inside of the periphery of the flange 102 via an adhesive, whereby the periphery of the flange 102 or the periphery of the insulating base 110 is present outside the cap 120. The cap 120 also has an opening window 121 which has a circle-shape. The opening window 121 allows transmissions of the laser beams emitted from the laser diodes LD1 and LD2.

In the step S9, the plural semiconductor laser device assemblies are transferred from the separating unit to the unloader unit, so that a plurality of the semiconductor laser device assembly is unloaded or picked up from the unloader unit.

As described above, in accordance with the fabrication processes of the present invention, the lead frame 100 including the plural lead structures 101 is subjected to the sequential batch-processes, for example, the die-bonding process, the bending process, the resin-molding process, the cutting process, the wire-bonding process and the separating process, while each of the plural lead structures 101 is then subjected to the cap-mounting process. The above sequential batch-processes are taken place by using alignment holes of the lead frame 100 for carrying the lead frame and positioning the lead structures 101. This allows an almost automated batch-assembling process for assembling the semiconductor laser devices. This automated batch-assembling process realizes a desired increase in the productivity of the semiconductor laser device of the high quality or the high performances.

Further, the die-bonding process is taken place after the cutting process and before the wire-bonding process, so that the bending process and the cutting process are taken place in the absence of the laser diodes LD1 and LD2 and the photo diode PD, for the purpose of avoiding any damage to the laser diodes LD1 and LD2 and the photo diode PD through those bending and cutting processes. This may further improve the yield.

The assembled semiconductor laser device has a can-shaped package. This allows applications of the semiconductor laser device to a variety of the existent optical equipments.

Further, the assembled semiconductor laser device has the above-described single-united lead structure which comprises the island 103, the single center lead 104, the connection parts 106 and the flange 102. The single-united lead structure is processed from the single metal plate or sheet through the above-described sequential batch-processes. Namely, the island 103, the single center lead 104, the connection parts 106 and the flange 102 are in the single-united from. This single-united from provides an effective heat radiation path. For example, a heat generated by the laser diodes LD1 and LD2 may be conducted through the island 103, the inner projecting part of the single center lead 104, the connection parts 106 and the flange 102 to the cap 120, from which the conducted heat is radiated.

Furthermore, the island 103 and the flange 102 are in the single-united form. This makes it easy to realize a highly accurate relative-positioning of the laser diodes LD1 and LD2 with reference to the flange 102. A peripheral surface of the flange 102 is made into contact directly with a reference plane of the optical equipment for mounting the assembled semiconductor laser device on the optical equipment. This realizes a highly accurate positioning of the semiconductor laser device with reference to a position of the light source of the optical equipment.

In this embodiment, the lead frame 100 is subjected to the bending process for bending a part of the two-dimensional original form of the lead structure 101 to form the three-dimensional lead structure 101. A metal material for the lead frame 100 or the lead structure 101 should be selected in consideration of preventing any disconnection or break at the bent part of the lead structure 101. Tibial examples of the available metal materials for the lead structure 101 or the lead frame 100 may include, but not limited to, 42-alloy, aluminum, and aluminum alloys, in addition to copper.

The respective shapes and dimensions of the lead frame 100, the flange 102, the island 103, the single center lead 104, and the plural side leads 105*a*, 105*b* and 105*c* are optional.

The cap 120 may optionally have a condensing lens on the opening window 121 to seal an inner space of the cap 120.

The semiconductor laser device may optionally be free of any cap.

One or more optical semiconductor elements mounted on the island 103 should not be limited to the photo-diode PD and the laser diodes LD.

Fifth Embodiment:

A fifth embodiment according to the present invention will be described in detail with reference to the drawings. The semiconductor laser device of this embodiment has the same structure as that in the first embodiment and shown in FIG. 4, except for the lead structure 101. Namely, the semiconductor laser device includes the insulating base 110, the lead structure 101, the first and second laser diodes LD1 and LD2, the photo-diode PD and the cap 120. The resin base 110 may have the generally disk shape or the flat cylinder shape with the orientation flat which is parallel to the first horizontal direction. The insulating base 110 serves to support the lead structure 101 or provides the mechanical strength to the lead structure 101, and also provide the electrical insulation to the lead structure 101. The insulating base 110 may comprise the insulation resin material. The insulating base 110 may be formed by the molding process.

The lead structure 101 is formed from the metal plate or the metal sheet through either the press working process or the etching process. The metal plate or the metal sheet are proceeded to form a lead frame, from which the lead structure 101 is cut.

The lead structure 101 comprises the flange 102, the island 103, the single center lead 104, the plural side leads 105*a*, 105*b*, 105*c* and 105*d* and the connection parts 107, wherein the connection parts 107 provide multi-connections among the flange 102, the island 103 and the side leads 105*a*, 105*b*, 105*c* and 105*d*. The connection parts 107 are permanent which remain in the semiconductor laser device assembly. The flange 102, the island 103, the single center lead 104, the plural side leads 105*a*, 105*b*, 105*c* and 105*d* and the connection parts 107 comprise a single united part of the lead structure 101. Namely, the flange 102, the island 103, the single center lead 104, the plural side leads 105*a*, 105*b*, 105*c* and 105*d* and the connection parts 107 are unitary formed and made of the same conductive material such as a metal.

Figure 27:
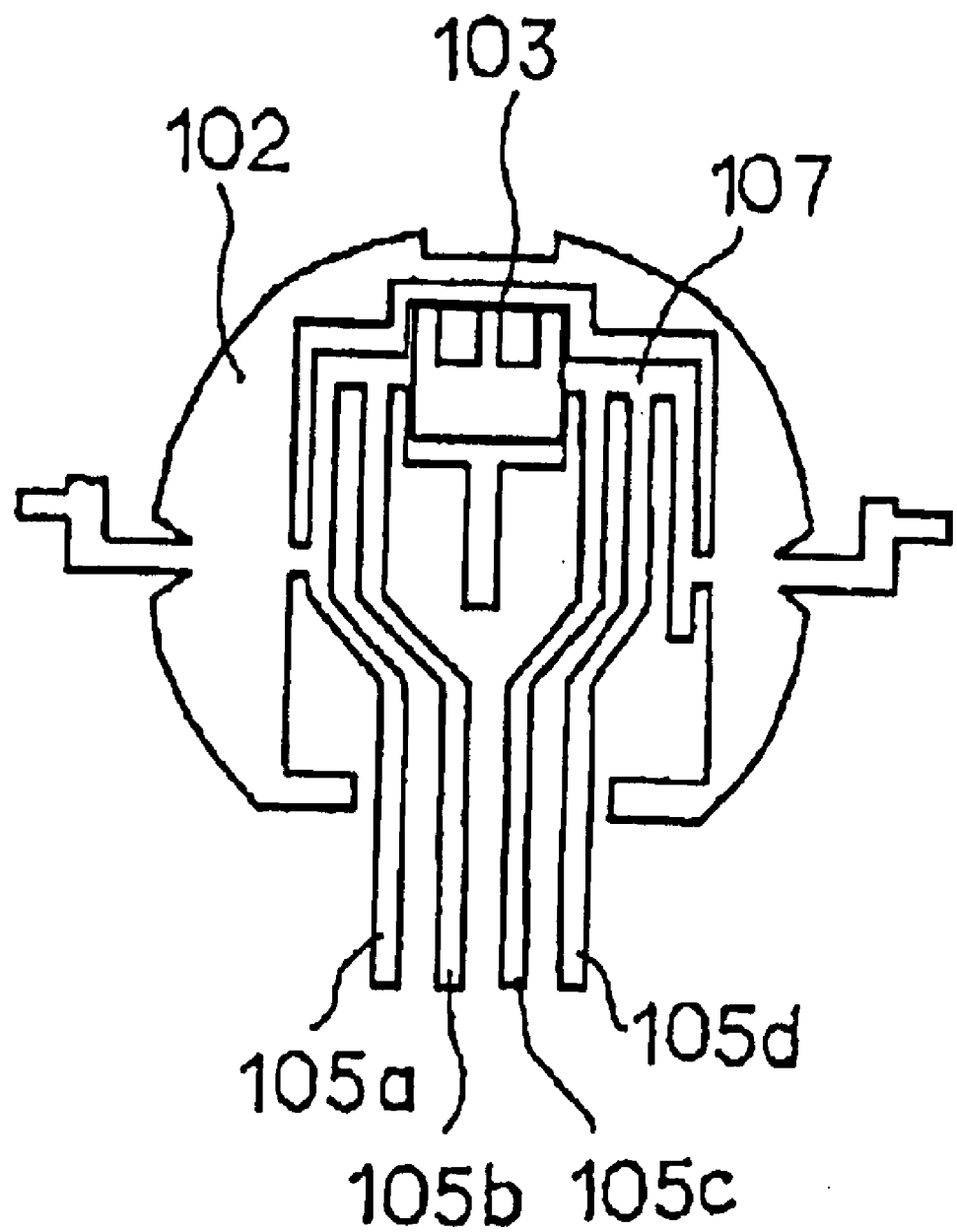
FIG. 27 is a fragmentary plan view of a modified lead structure engaged with the lead frame in the fifth embodiment in accordance with the present invention.

The above-described semiconductor laser device 1 may be fabricated as follows. The above unique structure of the semiconductor laser device 1 allows batch-fabrication-processes for a plurality of the semiconductor laser device 1 by using a lead frame. FIG. 27 is a fragmentary plan view of a modified lead structure 101 engaged with the lead frame. This lead frame is different from that in the first embodiment. A lead frame extends in a two-dimensional space. The lead frame may be formed through a press-working process or an etching process from a metal plate or a metal sheet. The lead frame includes a frame and an alignment of plural original forms of the above-described lead structure 101, each of which is supported by the frame via temporary supporting connections 108 which connects the original form of the lead structure 101 to the frame. The original form of the lead structure 101 also extends in the two-dimensional space.

The original form of the lead structure 101 is the same as that in the first embodiment, except for the above-described multi-connection parts 107. Namely, the original form of the lead structure 101 includes the flange 102, the island 103, the single center lead 104, the plural side leads 105*a*, 105*b*, 105*c* and 105*d*, and the multi-connection parts 107. The original form of the lead structure 101 of the two-dimensional structure is deformed into the three-dimensional structure as shown in FIG. 4.

The fabrication apparatus for fabricating the semiconductor laser devices include plural units which perform respective processes as follows. The fabrication apparatus includes a loader unit which supplies the lead frame, a part of which is shown in FIG. 27. In a step S1, the lead frame is loaded by the loader unit to the fabrication apparatus.

Figure 31:
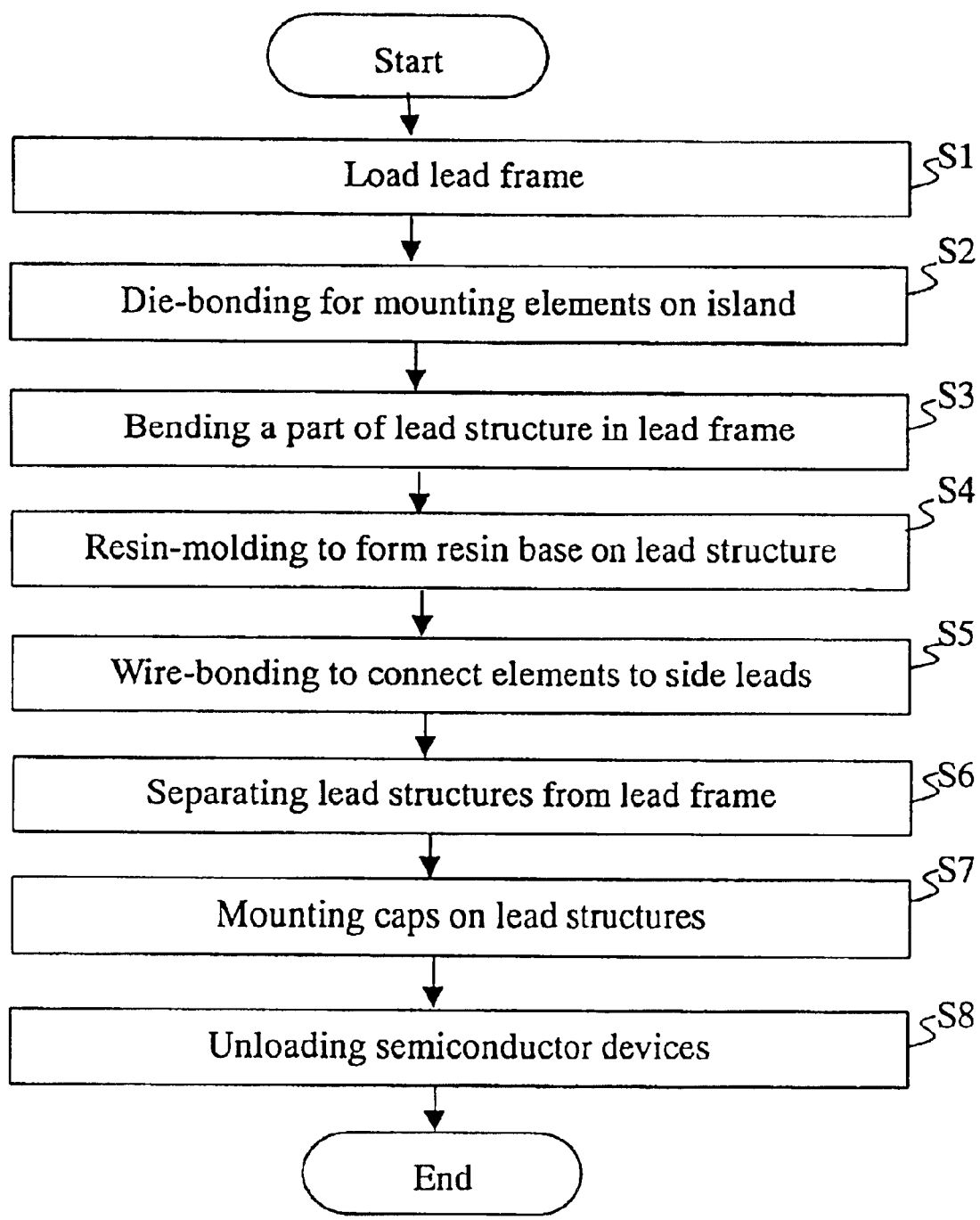
FIG. 31 is a flow chart illustrative of fabrication processes for the semiconductor laser device in the fifth embodiment in accordance with the present invention.

FIG. 31 is a flow chart illustrative of fabrication processes for the semiconductor laser device. The fabrication apparatus also includes a die-bonding unit taking place a die-bonding process for mounting the laser diodes LD1 and LD2 and the single photo-diode PD onto the island 103 of the original form of the leads structure 101 engaged within the lead frame. In a step S2, the laser diodes LD1 and LD2 and the single photo-diode PD are mounted by the die-bonding unit onto the island 103 of the original form of the lead structure 101 engaged within the lead frame.

The fabrication apparatus also includes a bending work unit for bending a part of the original form of the lead structure 101 mounted with the laser diodes LD1 and LD2 and the single photo-diode PD to form a three-dimensional lead structure 101. In a step S3, a part of the original form of the lead structure 101 mounted with the laser diodes LD1 and LD2 and the single photo-diode PD is bent by the bending work unit to form a three-dimensional lead structure 101.

The fabrication apparatus also includes a resin molding unit for taking place a resin molding process to form the insulating base 110 which supports the three-dimensional lead structure 101. In a step S4, a resin molding process is taken place by the resin molding unit to form the insulating base 110 which supports the three-dimensional lead structure 101.

The fabrication apparatus also includes a wire-bonding unit for taking place a wire-bonding process for connecting the laser diodes LD1 and LD2 and the photo-diode PD through metal wirings to the plural side leads 105*a*, 105*b*, 105*c* and 105*d*. In a step S5, the laser diodes LD1 and LD2 and the photo-diode PD are wire-bonded by the wire-bonding unit through metal wirings to the plural side leads 105*a*, 105*b*, 105*c* and 105*d*.

The fabrication apparatus also includes a separating unit for separating the three-dimensional lead structure 101 with the wire-bondings from the frame of the lead frame. In a step S6, the three-dimensional lead structure 101 with the wire-bondings are separated by the separating unit from the frame of the lead frame.

The fabrication apparatus also includes a cap mounting unit for mounting and adhering the cap 120 onto the lead structure 101 as separated from the lead of the lead frame, thereby to form a semiconductor laser device assembly. In a step S7, the cap 120 is mounted or adhered by the cap mounting unit onto the lead structure 101 with the insulating base 110 as separated from the frame of the lead frame, thereby to form a semiconductor laser device assembly.

The fabrication apparatus also includes an unloader unit for unloading or picking up the semiconductor laser device assembly from the fabrication apparatus. In a step S8, the semiconductor laser device assembly is unloaded or picked up by the unloader unit from the fabrication apparatus.

The above sequential processes will be described again but more details with reference to drawings.

In the step S1, the lead frame shown in FIG. 27 is loaded by the loader unit to the die-bonding unit.

In the step S2, the lead frame is further transferred from the loader unit to the die-bonding unit, so that the laser diodes LD1 and LD2 and the single photo-diode PD are mounted by the die-bonding unit onto the island 103 of the three-dimensional original form of the lead structure 101 engaged within the lead frame. The photo-diode PD is directly mounted on the island 103, and the laser diodes LD1 and LD2 are mounted on the photo-diode PD. In this embodiment, the die-boning process is taken place using a hard soldering material for reducing a heat resistance.

Figure 28:
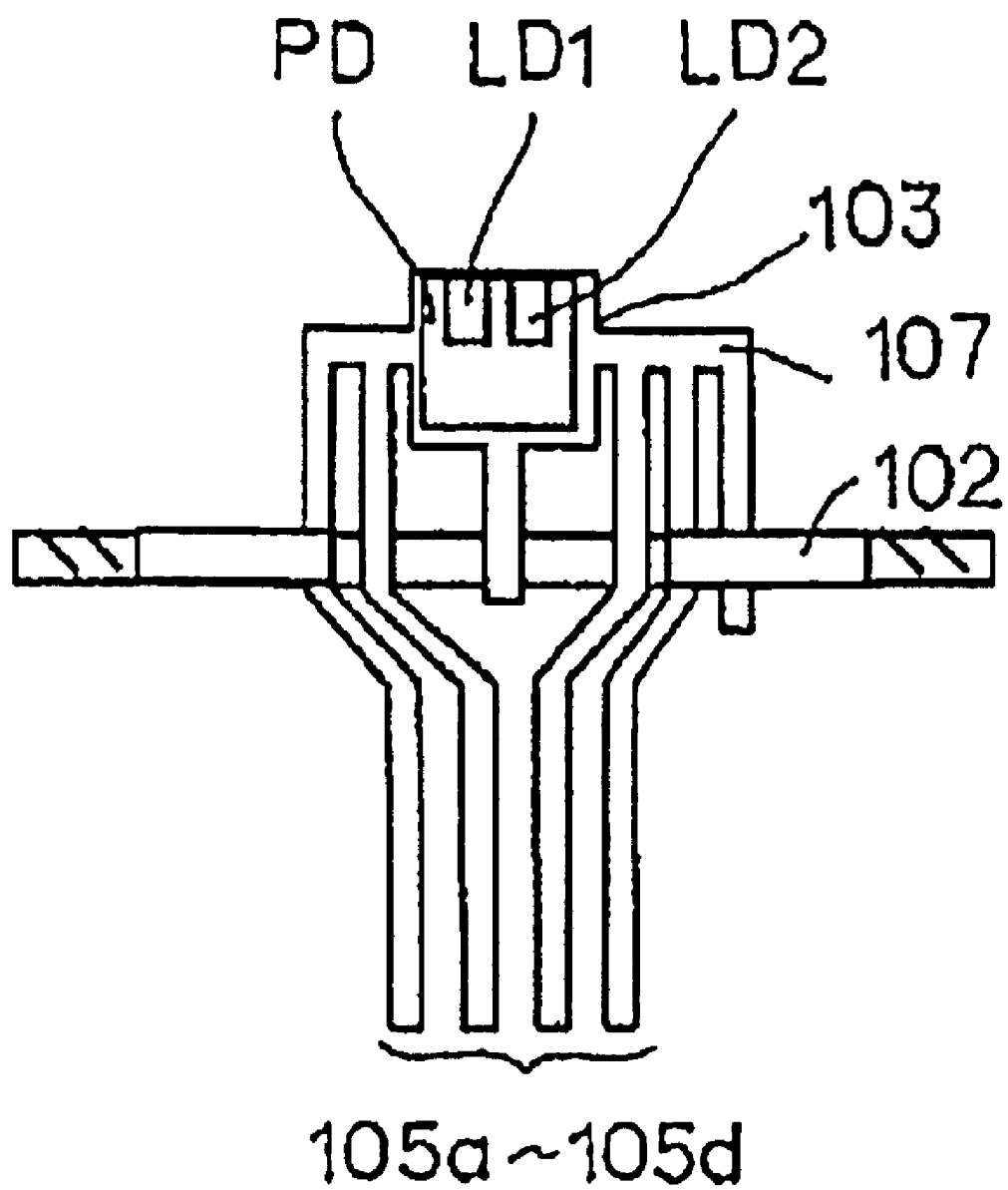
FIG. 28 is a fragmentary plan view illustrative of the lead frame having the three-dimensional original form of the lead structure in the fifth embodiment in accordance with the present invention.

In the step S3, the lead frame is transferred from the die-bonding unit to the bending work unit, so that a part of the original form of the lead structure 101 mounted with the laser diodes LD1 and LD2 and the single photo-diode PD is bent by the bending work unit to form a three-dimensional lead structure 101. FIG. 28 is a fragmentary plan view illustrative of the lead frame having the three-dimensional original form of the lead structure 101. The bending work unit twists the temporary supporting connections 108 by a right angle and also bends boundaries between the second and third parts of the multi-connection parts 107 by the right angle, so that the flange 102 and the first and second parts of the multi-connection parts 107 become extending in a plan vertical to the plan of the lead frame, while the island 103, the single center lead 104, the plural side leads 105a, 105b, 105c and 105d, the third parts of the connection parts 107 remain extending in the same plan as the lead frame.

Figure 29:
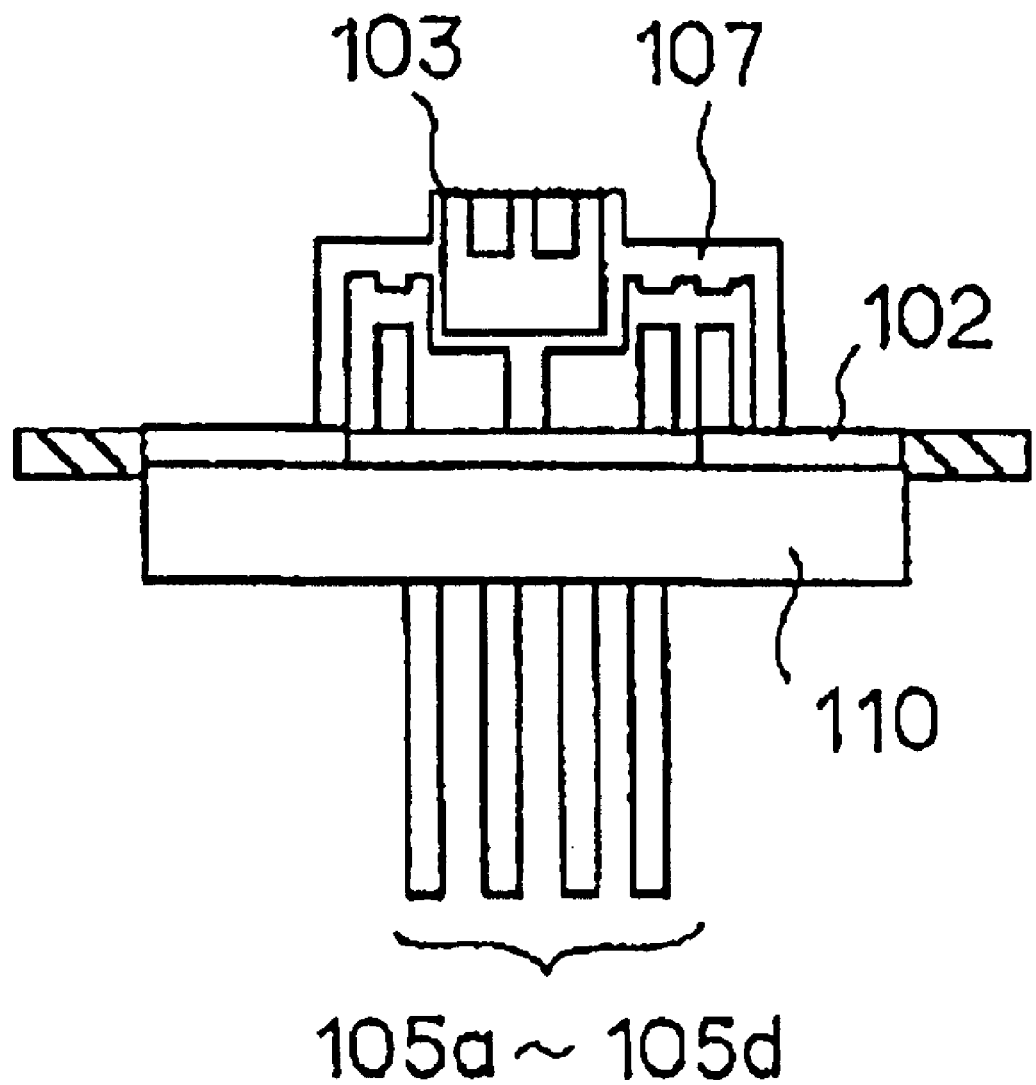
FIG. 29 is a fragmentary plan view illustrative of the lead frame having the three-dimensional original form of the lead structure with the insulating base in the fifth embodiment in accordance with the present invention.

In the step S4, the lead frame with the three dimensional lead structure 101 is transferred from the bending work unit to the resin molding unit, so that a resin molding process is taken place by the resin molding unit to form the insulating base 110 which supports the three-dimensional lead structure 101. FIG. 29 is a fragmentary plan view illustrative of the lead frame having the three-dimensional original form of the lead structure 101 with the insulating base 110. The lead frame with the three dimensional lead structure 101 is set in molding dies for taking place a molding process with an electrically insulating resin. A pair of the molding dies move in opposite directions which are vertical to the plan of the lead frame and perpendicular to a longitudinal direction of the lead frame without causing any physical interference with the lead frame, so that the paired molding dies sandwich the flange 102, thereby to form a cavity in one side of the flange 102, while the island 103 is positioned in the opposite side thereto.

An electrically insulating resin is injected into a cavity defined by the paired molding dies which sandwich the flange 102 for carrying out the resin molding process, whereby the insulating base 110 of the electrically insulating resin material is formed on the one side of the flange 102. The insulating base 110 has the generally flat cylinder shape with the orientation flat. The flange 102 is present on the surface of the insulating base 110. The insulating base 110 provides a sufficient mechanical strength to the flange 102. Further, the insulating base 110 supports the single center lead 104 and the plural side leads 105a, 105b, 105c and 105d, so that the single center lead 104 and the plural side leads 105a, 105b, 105c and 105d are electrically separated by the insulating base 110 from each other and from the flange 102, wherein each of the single center lead 104 and the plural side leads 105a, 105b, 105c and 105d has an inner projecting part which projects from the one surface of the insulating base 110 toward the same side as the island 103 and also an outer projecting part which projects from the opposite surface of the insulating base 110 toward the opposite side to the island 103. One face of the flange 120 is in contact directly with the one face of the insulating base 110, while the opposite face of the flange 120 is exposed.

In the step S5, the lead frame is further transferred from the molding unit to the wire-bonding unit, so that the laser diodes LD1 and LD2 and the photo-diode PD are wire-bonded through metal wirings to the plural side leads 105a, 105b, 105c and 105d. The plural side leads 105a, 105b, 105c and 105d extend in the same plan as the island 103. This allows the existent wire-bonding technique to be applied. The laser diode LD1 is electrically connected to the inner projecting part of the side lead 105a through a metal wiring 111 by a wire-bonding process. The laser diode LD2 is also electrically connected to the inner projecting part of the side lead 105c through another metal wiring 111 by the wire-bonding process. The single photo-diode PD is also electrically connected to the inner projecting part of the side lead 105b through still another metal wiring 111 by the wire-bonding process.

In the step S6, the lead frame with a plurality of the lead structure 101 is further transferred from the wire-bonding unit to the separating unit, so that a plurality of the lead structure 101 are separated from the frame of the lead frame. The temporary supporting connections 108 are cut off or removed from the lead frame, so that the plural lead structures 101 are separated from the frame of the lead frame.

Figure 30:
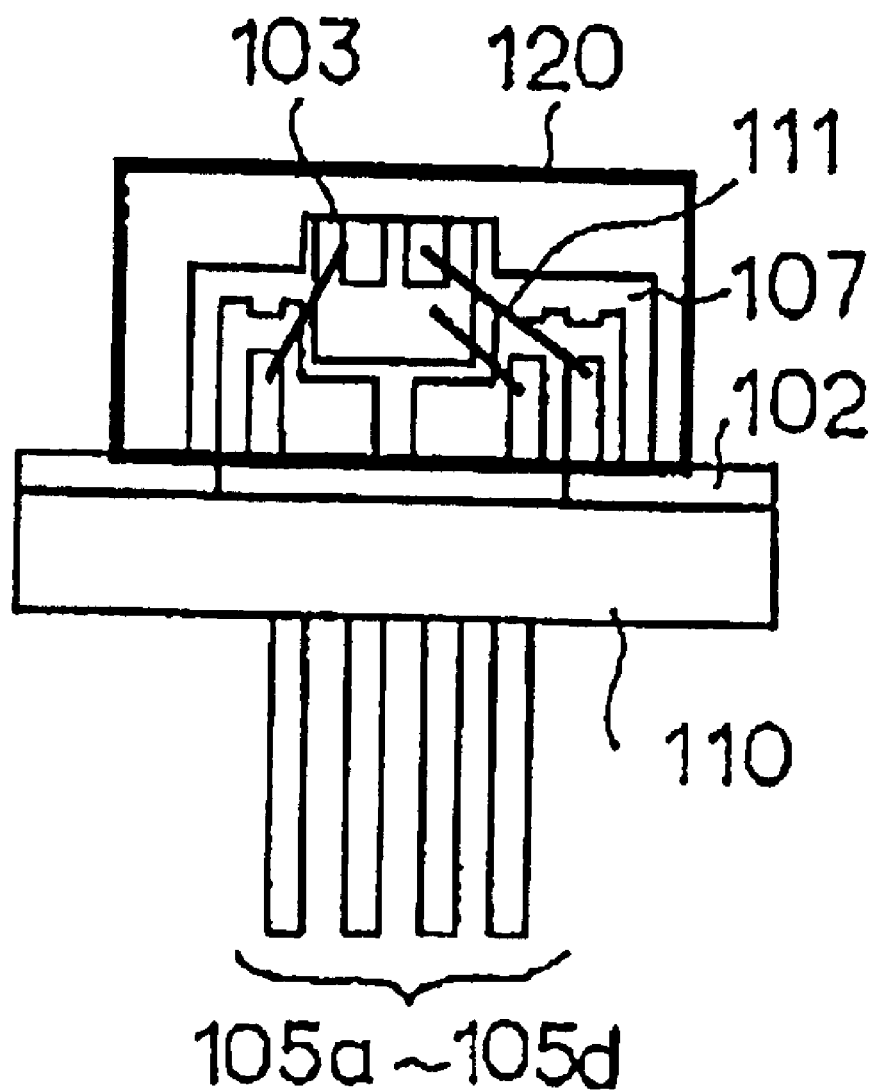
FIG. 30 is one side view of the semiconductor laser device assembly in the fifth embodiment in accordance with the present invention.

In the step S7, the lead frame is transferred from the separating unit into the cap mounting unit, so that the cap 120 is mounted or adhered by the cap mounting unit onto the lead structure 101 with the insulating base 110 as separated from the frame of the lead frame, thereby to form a plurality of semiconductor laser device assembly as separated from the frame of the lead frame. FIG. 30 is one side view of the semiconductor laser device assembly. The cap 120 may have a cylinder shape with an opening side periphery which is aligned to the inside of the periphery of the insulating base 110, so that the opening side periphery of the cap 120 is adhered to the inside of the periphery of the flange 102 via an adhesive, whereby the periphery of the flange 102 or the periphery of the insulating base 110 is present outside the cap 120. The cap 120 also has an opening window 121 which has a circle-shape. The opening window 121 allows transmissions of the laser beams emitted from the laser diodes LD1 and LD2.

In the step S8, the plural semiconductor laser device assemblies are transferred from the separating unit to the unloader unit, so that a plurality of the semiconductor laser device assembly is unloaded or picked up from the unloader unit.

As described above, in accordance with the fabrication processes of the present invention, the lead frame including the plural lead structures 101 is subjected to the sequential batch-processes, for example, the die-bonding process, the bending process, the resin-molding process, the cutting process, the wire-bonding process and the separating process, while each of the plural lead structures 101 is then subjected to the cap-mounting process. The above sequential batch-processes are taken place by using alignment holes of the lead frame for carrying the lead framend positioning the lead structures 101. This allows an almost automated batch-assembling process for assembling the semiconductor laser devices. This automated batch-assembling process realizes a desired increase in the productivity of the semiconductor laser device of the high quality or the high performances.

Further, no cutting process is carried out. This reduces the number of the fabrication processes.

The above multi-connection parts 107 allow four side leads 105a, 105b, 105c and 105d extending generally in parallel to each other at almost the same pitch. This structure increases the flexibility or freedom of mounting the semiconductor laser device onto the optical equipment.

The assembled semiconductor laser device has a can-shaped package. This allows applications of the semiconductor laser device to a variety of the existent optical equipments.

Further, the assembled semiconductor laser device has the above-described single-united lead structure which comprises the island 103, the single center lead 104, the side leads 105a, 105b, 105c and 105d, the multi-connection parts 107 and the flange 102. The single-united lead structure is processed from the single metal plate or sheet through the above-described sequential batch-processes. Namely, the island 103, the single center lead 104, the side leads 105a, 105b, 105c and 105d, the connection parts 107 and the flange 102 are in the single-united from. This single-united from provides an effective heat radiation path. For example, a heat generated by the laser diodes LD1 and LD2 may be conducted through the island 103, the inner projecting part of the single center lead 104, the side leads 105a, 105b, 105c and 105d, the connection parts 107 and the flange 102 to the cap 120, from which the conducted heat is radiated.

Furthermore, the island 103 and the flange 102 are in the single-united form. This makes it easy to realize a highly accurate relative-positioning of the laser diodes LD1 and LD2 with reference to the flange 102. A peripheral surface of the flange 102 is made into contact directly with a reference plane of the optical equipment for mounting the assembled semiconductor laser device on the optical equipment. This realizes a highly accurate positioning of the semiconductor laser device with reference to a position of the light source of the optical equipment.

In this embodiment, the lead frame is subjected to the bending process for bending a part of the two-dimensional original form of the lead structure 101 to form the three-dimensional lead structure 101. A metal material for the lead frame or the lead structure 101 should be selected in consideration of preventing any disconnection or break at the bent part of the lead structure 101. Typical examples of the available metal materials for the lead structure 101 or the lead frame may include, but not limited to, 42-alloy, aluminum, and aluminum alloys, in addition to copper.

The respective shapes and dimensions of the lead frame, the flange 102, the island 103, the single center lead 104, and the plural side leads 105a, 105b, 105c and 105d are optional.

The cap 120 may optionally have a condensing lens on the opening window 121 to seal an inner space of the cap 120.

The semiconductor laser device may optionally be free of any cap.

One or more optical semiconductor elements mounted on the island 103 should not be limited to the photo-diode PD and the laser diodes LD.

Sixth Embodiment:

A sixth embodiment according to the present invention will be described in detail with reference to the drawings. The semiconductor laser device of this embodiment has the same structure as that in the first embodiment and shown in FIG. 4, except that the laser diodes LD1 and LD2 are mounted on a heat sink H on the island 103, while the photo-diode PD is mounted on the flange 102. Namely, the semiconductor laser device includes the insulating base 110, the lead structure 101, the first and second laser diodes LD1 and LD2, the heat sink H, the photo-diode PD and the cap 120. The heat sink H may comprise a metal material. The laser diodes LD1 and LD2 may be bonded to the heat sink H by using a hard solder. The photo-diode PD is mounted on the flange 102 in the different process from the above process for bonding the laser diodes LD1 and LD2 onto the heat sink H.

The resin base 110 may have the generally disk shape or the flat cylinder shape with the orientation flat which is parallel to the first horizontal direction. The insulating base 110 serves to support the lead structure 101 or provides the mechanical strength to the lead structure 101, and also provide the electrical insulation to the lead structure 101. The insulating base 110 may comprise the insulation resin material. The insulating base 110 may be formed by the molding process.

The lead structure 101 is formed from the metal plate or the metal sheet through either the press working process or the etching process. The metal plate or the metal sheet are proceeded to form a lead frame, from which the lead structure 101 is cut.

The lead structure 101 comprises the flange 102, the island 103, the single center lead 104, the plural side leads 105a, 105b and 105c and the connection parts 106. The flange 102, the island 103, the single center lead 104 and the connection parts 106 comprise a single united part of the lead structure 101. Namely, the flange 102, the island 103, the single center lead 104 and the connection parts 106 are unitary formed and made of the same conductive material such as a metal. Detailed descriptions of the respective structures of the flange 102, the island 103, the single center lead 104, the plural side leads 105a, 105b and 105c and the connection parts 106 are the same as made in the first embodiment.

The above-described semiconductor laser device 1 may be fabricated as follows. The above unique structure of the semiconductor laser device 1 allows batch-fabrication-processes for a plurality of the semiconductor laser device 1 by using a lead frame as shown in FIG. 5.

The original form of the lead structure 101 is the same as shown in FIG. 5 in the first embodiment. Namely, the original form of the lead structure 101 includes the flange 102, the island 103, the single center lead 104, the plural side leads 105a, 105b and 105c, and the connection parts 106, and further temporary connection parts 107. The original form of the lead structure 101 of the two-dimensional structure is deformed into the three-dimensional structure as shown in FIG. 4.

Figure 32:
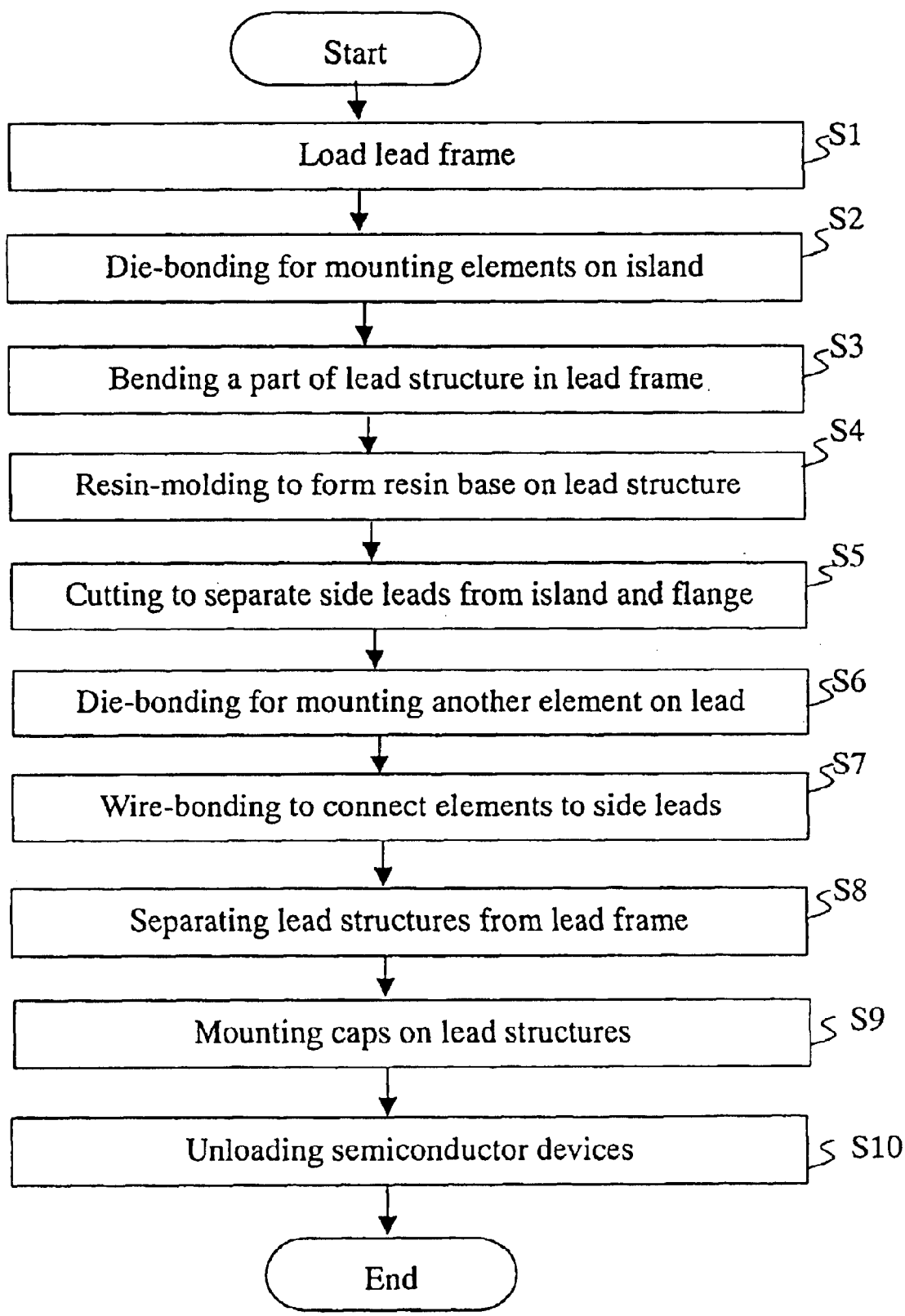
FIG. 32 is a flow chart illustrative of fabrication processes for the semiconductor laser device of the sixth embodiment in accordance with the present invention.

FIG. 32 is a flow chart illustrative of fabrication processes for the semiconductor laser device of the sixth embodiment in accordance with the present invention. The fabrication apparatus for fabricating the semiconductor laser devices also include plural units which perform respective processes as follows. The fabrication apparatus includes a loader unit which supplies the lead frame 100. In a step S1, the lead frame 100 is loaded by the loader unit to the fabrication apparatus.

The fabrication apparatus also includes a die-bonding unit taking place a die-bonding process for mounting the heat sink H onto the island 103 of the original form of the lead structure 101 engaged within the lead frame 100, and further mounting the single photo-diode PD on the flange 102. In a step S2, the laser diodes LD1 and LD2 are mounted via a hard solder by the die-bonding unit onto the heat sink H mounted on the island 103 of the original form of the lead structure 101 engaged within the lead frame 100. In a step S6, the single photodiode PD is also mounted by the die-bonding unit on the single center lead 104 via a conductive resin adhesive such as an Ag-paste.

The fabrication apparatus also includes a bending work unit for bending a part of the original form of the lead structure 101 mounted with the laser diodes LD1 and LD2 to form a three-dimensional lead structure 101. In a step S3, a part of the original form of the lead structure 101 mounted with the laser diodes LD1 and LD2 is bent by the bending work unit to form a three-dimensional lead structure 101.

The fabrication apparatus also includes a resin molding unit for taking place a resin molding process to form the insulating base 110 which supports the three-dimensional lead structure 101. In a step S4, a resin molding process is taken place by the resin molding unit to form the insulating base 110 which supports the three-dimensional lead structure 101.

The fabrication apparatus also includes a cutting unit for cutting off or removing the temporary connection parts 107 from the three-dimensional lead structure 101 supported on the insulating base 110, so that the plural side leads 105a, 105b and 105c are separated from the island 103. In a step S5, the temporary connection parts 107 are cut off or removed by the cutting unit from the three-dimensional lead structure 101 supported on the insulating base 110, so that the plural side leads 105a, 105b and 105c are separated from the island 103.

The fabrication apparatus also includes a wire-bonding unit for taking place a wire-bonding process for connecting the laser diodes LD1 and LD2 and the photo-diode PD through metal wirings to the plural side leads 105a, 105b and 105c. In a step S7, the laser diodes LD1 and LD2 and the photo-diode PD are wire-bonded by the wire-bonding unit through metal wirings to the plural side leads 105a, 105b and 105c.

The fabrication apparatus also includes a separating unit for separating the three-dimensional lead structure 101 with the wire-bondings from the frame 100A of the lead frame 100. In a step S8, the three-dimensional lead structure 101 with the wire-bondings are separated by the separating unit from the frame 100A of the lead frame 100.

The fabrication apparatus also includes a cap mounting unit for mounting and adhering the cap 120 onto the lead structure 101 engaged with the lead 100A of the lead frame 100, thereby to form a semiconductor laser device assembly. In a step S9, the cap 120 is mounted or adhered by the cap mounting unit onto the lead structure 101 with the insulating base 110 as separated from the frame 100A of the lead frame 100, thereby to form a semiconductor laser device assembly.

The fabrication apparatus also includes an unloader unit for unloading or picking up the semiconductor laser device assembly from the fabrication apparatus. In a step S10, the semiconductor laser device assembly is unloaded or picked up by the unloader unit from the fabrication apparatus.

The above sequential processes will be described again but more details with reference to drawings.

In the step S1, the lead frame 100 shown in FIG. 5 is loaded by the loader unit to the die-bonding unit.

In the step S2, the heat sink H is mounted by the die-bonding unit onto the island 103 of the two-dimensional original form of the lead structure 101 engaged within the lead frame 100. The laser diodes LD1 and LD2 are also mounted by the die-bonding unit onto the heat sink H. In this embodiment, the die-boning process is taken place using a hard soldering material for reducing a heat resistance.

In the step S3, the lead frame 100 is transferred from the die-boning unit to the bending work unit, so that a part of the original form of the lead structure 101 mounted with the laser diodes LD1 and LD2 is bent by the bending work unit to form a three-dimensional lead structure 101. The bending work unit twists the temporary supporting connections 108 by a right angle and also bends boundaries between the second and third parts of the connection parts 106 by the right angle, so that the flange 102 and the first and second parts of the connection parts 106 become extending in a plan vertical to the plan of the lead frame 100, while the island 103, the single center lead 104, the plural side leads 105a, 105b and 105c, the third parts of the connection parts 106 and the temporary connection parts 107 remain extending in the same plan as the lead frame 100.

Figure 33:
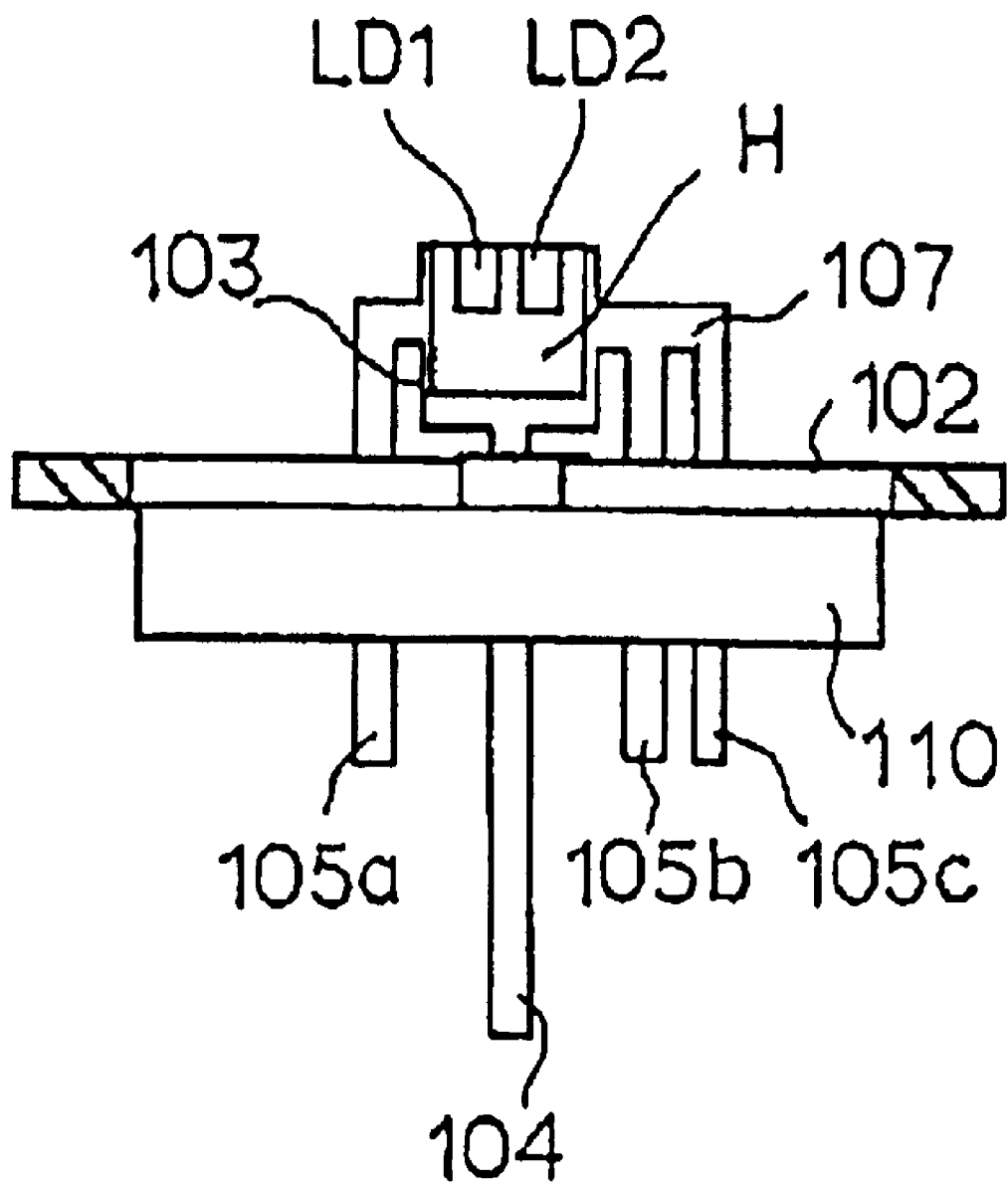
FIG. 33 is a fragmentary plan view illustrative of the three-dimensional original form of the lead structure with the insulating base, which is engaged with the lead frame in the sixth embodiment in accordance with the present invention.

In the step S4, the lead frame 100 with the three dimensional lead structure 101 is transferred from the bending work unit to the resin molding unit, so that a resin molding process is taken place by the resin molding unit to form the insulating base 110 which supports the three-dimensional lead structure 101. FIG. 33 is a fragmentary plan view illustrative of the three-dimensional original form of the lead structure 101 with the insulating base 110, which is engaged with the lead frame 100. The lead frame 100 with the three dimensional lead structure 101 is set in molding dies for taking place a molding process with an electrically insulating resin. A pair of the molding dies move in opposite directions which are parallel to the plan of the lead frame 100 and perpendicular to a longitudinal direction of the lead frame 100 without causing any physical interference with the lead frame 100, so that the paired molding dies sandwich the flange 102, thereby to form a cavity in one side of the flange 102, while the island 103 is positioned in the opposite side thereto.

An electrically insulating resin is injected into a cavity defined by the paired molding dies which sandwich the flange 102 for carrying out the resin molding process, whereby the insulating base 110 of the electrically insulating resin material is formed on the one side of the flange 102. The insulating base 110 has the generally flat cylinder shape with the orientation flat. The flange 102 is present on the surface of the insulating base 110. The insulating base 110 provides a sufficient mechanical strength to the flange 102. Further, the insulating base 110 supports the single center lead 104 and the plural side leads 105a, 105b and 105c, so that the single center lead 104 and the plural side leads 105a, 105b and 105c are electrically separated by the insulating base 110 from each other and from the flange 102, wherein each of the single center lead 104 and the plural side leads 105a, 105b and 105c has an inner projecting part which projects from the one surface of the insulating base 110 toward the same side as the island 103 and also an outer projecting part which projects from the opposite surface of the insulating base 110 toward the opposite side to the island 103. One face of the flange 120 is in contact directly with the one face of the insulating base 110, while the opposite face of the flange 120 is exposed.

Figure 34:
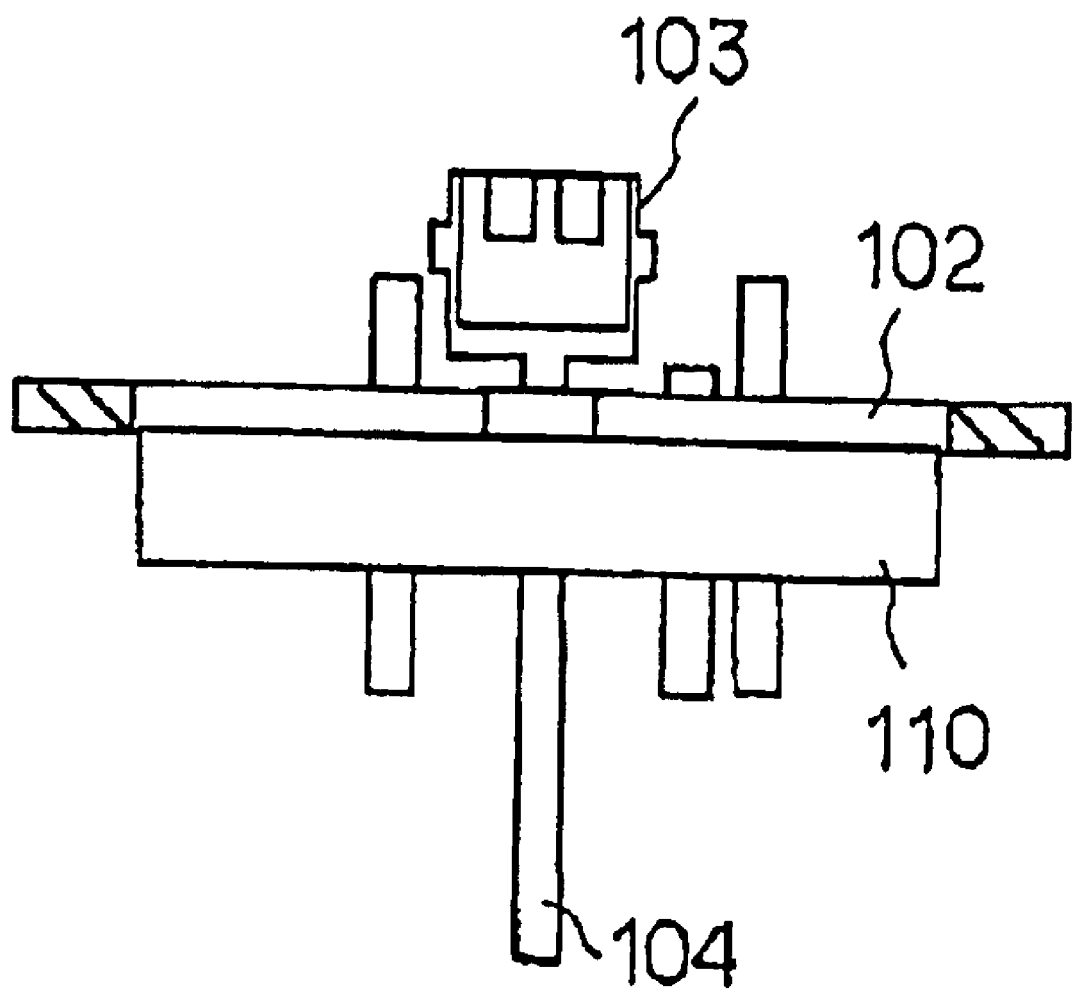
FIG. 34 is a fragmentary plan view illustrative of the three-dimensional original form of the lead structure engaged with the lead frame, wherein the side leads are separated from the island in the sixth embodiment in accordance with the present invention.

In the step S5, the lead frame 100 is further transferred from the resin molding unit to the cutting unit, so that the temporary connection parts 107 are cut off or removed from the three-dimensional lead structure 101 supported on the insulating base 110. FIG. 34 is a fragmentary plan view illustrative of the three-dimensional original form of the lead structure 101 engaged with the lead frame 100, wherein the side leads 105a, 105b and 105c are separated from the island 103. The plural side leads 105a, 105b and 105c are mechanically and electrically separated from the island 103, while the plural side leads 105a, 105b and 105c remain supported by the insulating base 110. The single center lead 104 remains connected with the island 103 and also connected through the connection parts 106 to the flange 102.

Figure 35:
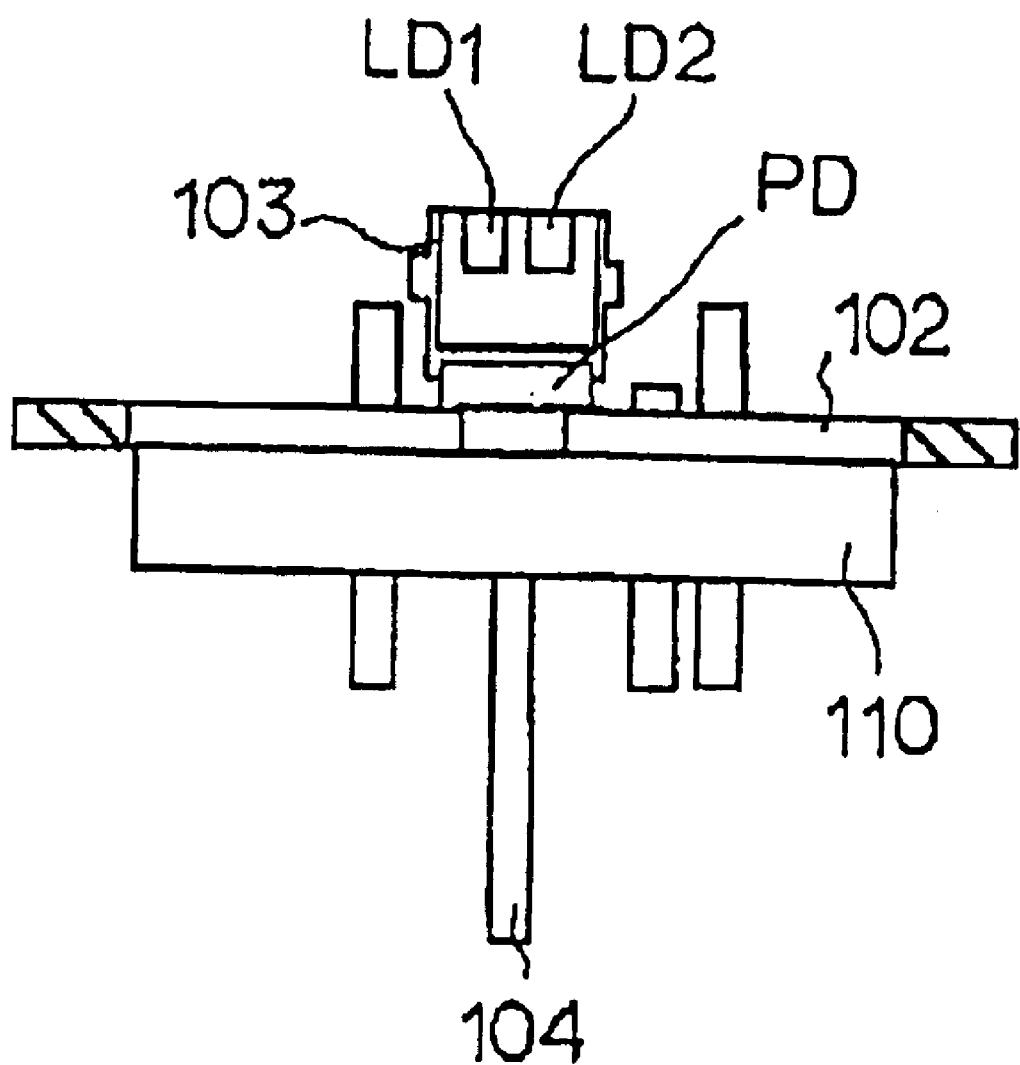
FIG. 35 is a fragmentary plan view illustrative of the three-dimensional original form of the lead structure with the photo-diode, which is engaged with the lead frame in the sixth embodiment in accordance with the present invention.

In the step S6, the lead frame 100 is further transferred from the cutting unit to the die-bonding unit, so that the single photo-diode PD is also mounted by the die-bonding unit on the single center lead 104 via a conductive resin adhesive such as an Ag-paste. FIG. 35 is a fragmentary plan view illustrative of the three-dimensional original form of the lead structure 101 with the photo-diode PD, which is engaged with the lead frame 100. It is optionally possible that an angled conductive plate is mounted directly on the single center lead 104, so that the single photo-diode PD is mounted on the angled conductive plate for reducing a returned light.

Figure 36:
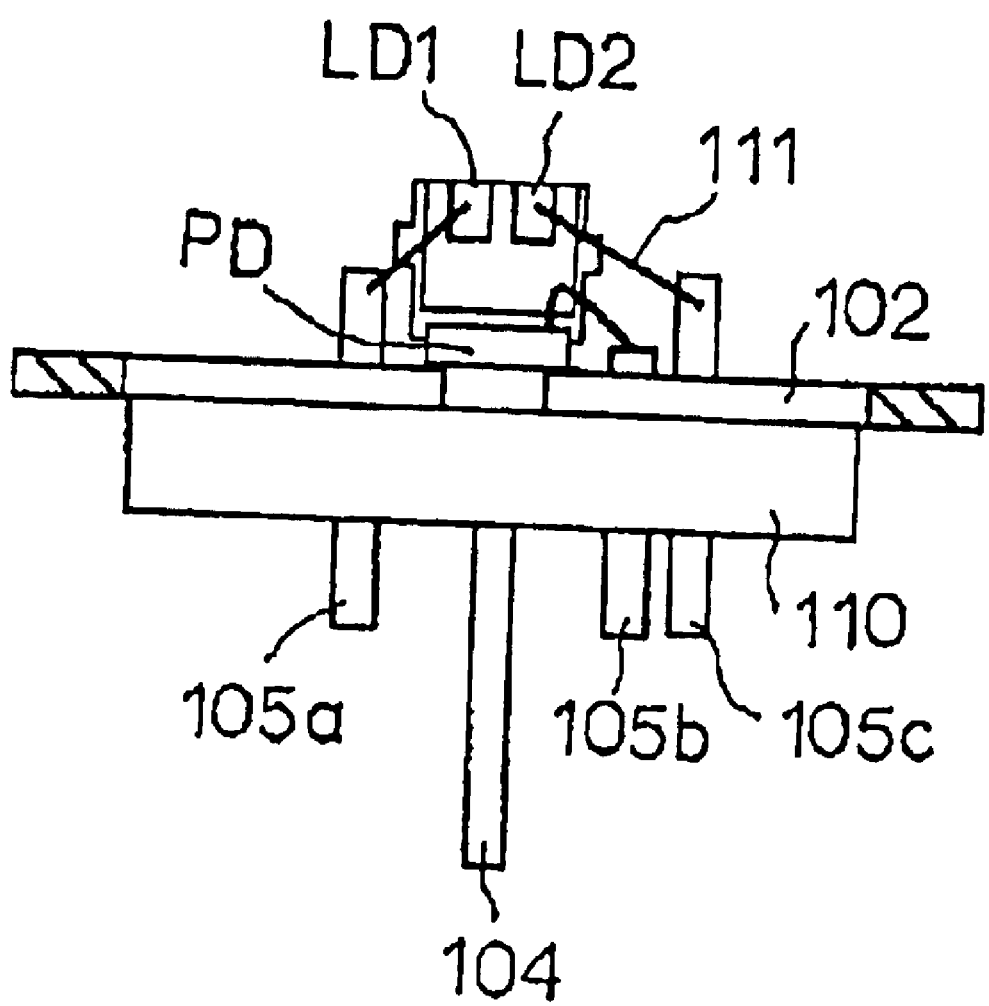
FIG. 36 is a fragmentary plan view illustrative of the three-dimensional original form of the lead structure with the wire-bondings, which is engaged with the lead frame in the sixth embodiment in accordance with the present invention.

In the step S7, the lead frame 100 is further transferred from the die-bonding unit to the wire-bonding unit, so that the laser diodes LD1 and LD2 and the photo-diode PD are wire-bonded through metal wirings to the plural side leads 105a, 105b and 105c. FIG. 36 is a fragmentary plan view illustrative of the three-dimensional original form of the lead structure 101 with the wire-bondings, which is engaged with the lead frame 100. The plural side leads 105a, 105b and 105c extend in the same plan as the island 103. This allows the existent wire-bonding technique to be applied. The laser diode LD1 is electrically connected to the inner projecting part of the side lead 105a through a metal wiring 111 by a wire-bonding process. The laser diode LD2 is also electrically connected to the inner projecting part of the side lead 105c through another metal wiring 111 by the wire-bonding process. The single photo-diode PD is also electrically connected to the inner projecting part of the side lead 105b through still another metal wiring 111 by the wire-bonding process.

In the step S8, the lead frame 100 is further transferred from the wire-bonding unit to the separating unit, so that a plurality of the three-dimensional lead structure 101 are separated from the frame 100A of the lead frame 100. The temporary supporting connections 108 are cut off or removed from the lead frame 100, so that the plural three-dimensional lead structures 101 are separated from the frame 100A of the lead frame 100.

In the step S9, the plural three-dimensional lead structures 101 are transferred into the cap mounting unit, so that the cap 120 is mounted or adhered by the cap mounting unit onto each of the plural three-dimensional lead structures 101 as separated from the frame 100A of the lead frame 100, thereby to form a plurality of semiconductor laser device assembly separated from the frame 100A of the lead frame 100. The cap 120 may have a cylinder shape with an opening side periphery which is aligned to the inside of the periphery of the insulating base 110, so that the opening side periphery of the cap 120 is adhered to the inside of the periphery of the flange 102 via an adhesive, whereby the periphery of the flange 102 or the periphery of the insulating base 110 is present outside the cap 120. The cap 120 also has an opening window 121 which has a circle-shape. The opening window 121 allows transmissions of the laser beams emitted from the laser diodes LD1 and LD2.

In the step S9, the plural semiconductor laser device assemblies are transferred from the cap-mounting unit to the unloader unit, so that a plurality of the semiconductor laser device assembly is unloaded or picked up from the unloader unit.

As described above, in accordance with the fabrication processes of the present invention, the lead frame 100 including the plural lead structures 101 is subjected to the sequential batch-processes, for example, the die-bonding process, the bending process, the resin-molding process, the cutting process, the wire-bonding process, and the separating process. This allows an automated batch-assembling process for assembling the semiconductor laser devices. This automated batch-assembling process realizes a desired increase in the productivity of the semiconductor laser device of the high quality or the high performances.

The laser diodes LD1 and LD2 are mounted on the heat sink H which is mounted on the island 103. The presence of the heat sink H promotes a heat radiation from the laser diodes LD1 and LD2.

Further, the angled conductive plate is also mounted on the single center lead 104, so that the photo-diode PD is mounted on the angled conductive plate for reducing the returned light, thereby improving the light-receiving efficiency of the photo-diode PD. Optionally, the die-bonding or mounting of the photo-diode PD may be carried out before the above cutting process.

The assembled semiconductor laser device has a can-shaped package. This allows applications of the semiconductor laser device to a variety of the existent optical equipments.

Further, the assembled semiconductor laser device has the above-described single-united lead structure which comprises the island 103, the single center lead 104, the connection parts 106 and the flange 102. The single-united lead structure is processed from the single metal plate or sheet through the above-described sequential batch-processes. Namely, the island 103, the single center lead 104, the connection parts 106 and the flange 102 are in the single-united from. This single-united from provides an effective heat radiation path. For example, a heat generated by the laser diodes LD1 and LD2 may be conducted through the island 103, the inner projecting part of the single center lead 104, the connection parts 106 and the flange 102 to the cap 120, from which the conducted heat is radiated.

Furthermore, the island 103 and the flange 102 are in the single-united form. This makes it easy to realize a highly accurate relative-positioning of the laser diodes LD1 and LD2 with reference to the flange 102. A peripheral surface of the flange 102 is made into contact directly with a reference plane of the optical equipment for mounting the assembled semiconductor laser device on the optical equipment. This realizes a highly accurate positioning of the semiconductor laser device with reference to a position of the light source of the optical equipment.

In this embodiment, the lead frame 100 is subjected to the bending process for bending a part of the two-dimensional original form of the lead structure 101 to form the three-dimensional lead structure 101. A metal material for the lead frame 100 or the lead structure 101 should be selected in consideration of preventing any disconnection or break at the bent part of the lead structure 101. Typical examples of the available metal materials for the lead structure 101 or the lead frame 100 may include, but not limited to, 42-alloy, aluminum, and aluminum alloys, in addition to copper.

The respective shapes and dimensions of the lead frame 100, the flange 102, the island 103, the single center lead 104, and the plural side leads 105a, 105b and 105c are optional.

The cap 120 may optionally have a condensing lens on the opening window 121 to seal an inner space of the cap 120.

The semiconductor laser device may optionally be free of any cap.

One or more optical semiconductor elements mounted on the island 103 should not be limited to the photo-diode PD and the laser diodes LD.

Seventh Embodiment:

A seventh embodiment according to the present invention will be described in detail with reference to the drawings. The semiconductor light receiving device of this embodiment has the same structure as that in the first embodiment and shown in FIG. 4, except for the lead structure 101 and the absence of the laser diodes LD1 and LD2. Namely, the semiconductor light receiving device includes the insulating base 110, the lead structure 101, the photo-diode PD and the cap 120. The resin base 110 may have the generally disk shape or the flat cylinder shape with the orientation flat which is parallel to the first horizontal direction. The insulating base 110 serves to support the lead structure 101 or provides the mechanical strength to the lead structure 101, and also provide the electrical insulation to the lead structure 101. The insulating base 110 may comprise the insulation resin material. The insulating base 110 may be formed by the molding process.

The lead structure 101 is formed from the metal plate or the metal sheet through either the press working process or the etching process. The metal plate or the metal sheet are proceeded to form a lead frame 100-3, from which the lead structure 101 is cut.

The lead structure 101 comprises the flange 102, the island 103, and the paired side leads 105e and 105f. The flange 102, the island 103, and the paired side leads 105e and 105f comprise a single united part of the lead structure 101. Namely, the flange 102, the island 103, and the paired side leads 105e and 105f are unitary formed and made of the same conductive material such as a metal.

Figure 37:
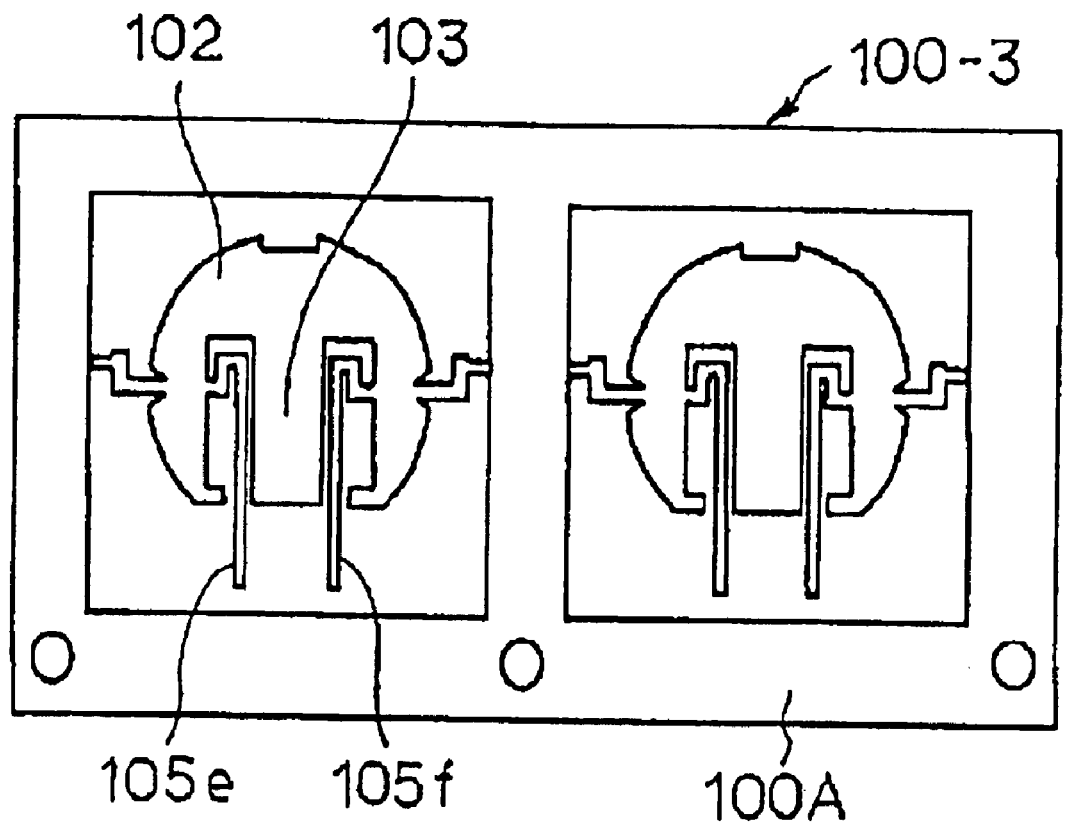
FIG. 37 is a fragmentary plan view of a modified lead structure engaged with the lead frame in the seventh embodiment in accordance with the present invention.

The above-described semiconductor light receiving device 1 may be fabricated as follows. The above unique structure of the semiconductor light receiving device 1 allows batch-fabrication-processes for a plurality of the semiconductor light receiving device 1 by using a lead frame 100-3. FIG. 37 is a fragmentary plan view of a modified lead structure 101 engaged with the lead frame 100-3. This lead frame 100-3 is different from that in the first embodiment. A lead frame 100-3 extends in a two-dimensional space. The lead frame 100-3 may be formed through a press-working process or an etching process from a metal plate or a metal sheet. The lead frame 100-3 includes a frame and an alignment of plural original forms of the above-described lead structure 101, each of which is supported by the frame via temporary supporting connections 108 which connects the original form of the lead structure 101 to the frame. The original form of the lead structure 101 also extends in the two-dimensional space.

The original form of the lead structure 101 includes the flange 102, the island 103, and the paired side leads 105e and 105f. The original form of the lead structure 101 of the two-dimensional structure is deformed into the three-dimensional structure.

The fabrication apparatus for fabricating the semiconductor light receiving devices include plural units which perform respective processes as follows. The fabrication apparatus includes a loader unit which supplies the lead frame 100-3, a part of which is shown in FIG. 37. In a step S1, the lead frame 100-3 is loaded by the loader unit to the fabrication apparatus.

The fabrication apparatus also includes a die-bonding unit taking place a die-bonding process for mounting the single photo-diode PD onto the island 103 of the original form of the lead structure 101 engaged within the lead frame 100-3. In a step S2, the single photo-diode PD is mounted by the die-bonding unit onto the island 103 of the original form of the lead structure 101 engaged within the lead frame 100-3.

The fabrication apparatus also includes a bending work unit for bending a part of the original form of the lead structure 101 mounted with the single photo-diode PD to form a three-dimensional lead structure 101. In a step S3, a part of the original form of the lead structure 101 mounted with the single photo-diode PD is bent by the bending work unit to form a three-dimensional lead structure 101.

The fabrication apparatus also includes a resin molding unit for taking place a resin molding process to form the insulating base 110 which supports the three-dimensional lead structure 101. In a step S4, a resin molding process is taken place by the resin molding unit to form the insulating base 110 which supports the three-dimensional lead structure 101.

The fabrication apparatus also includes a cutting unit for cutting off one of the side leads 105e and 105f from the island 103, so that the side lead 105f is separated from the island 103. In a step S5, one of the side leads 105e and 105f is cut off or removed by the cutting unit from the island 103, so that the side lead 105f is separated from the island 103.

The fabrication apparatus also includes a wire-bonding unit for taking place a wire-bonding process for connecting the photo-diode PD through a metal wiring to the side lead 105f. In a step S6, the single photo-diode PD is electrically connected to the inner projecting part of the side lead 105f through still another metal wiring 111 by the wire-bonding process.

The fabrication apparatus also includes a separating unit for separating the three-dimensional lead structure 101 with the wire-bondings from the frame of the lead frame 100-3. In a step S7, the three-dimensional lead structure 101 with the wire-bondings are separated by the separating unit from the frame of the lead frame 100-3.

The fabrication apparatus also includes a cap mounting unit for mounting and adhering the cap 120 onto the lead structure 101 as separated from the lead of the lead frame 100-3, thereby to form a semiconductor light receiving device assembly. In a step S8, the cap 120 is mounted or adhered by the cap mounting unit onto the lead structure 101 with the insulating base 110 as separated from the frame of the lead frame 100-3, thereby to form a semiconductor light receiving device assembly.

The fabrication apparatus also includes an unloader unit for unloading or picking up the semiconductor light receiving device assembly from the fabrication apparatus. In a step S9, the semiconductor light receiving device assembly is unloaded or picked up by the unloader unit from the fabrication apparatus.

The above sequential processes will be described again but more details with reference to drawings.

In the step S1, the lead frame 100-3 shown in FIG. 37 is loaded by the loader unit to the die-bonding unit.

Figure 38:
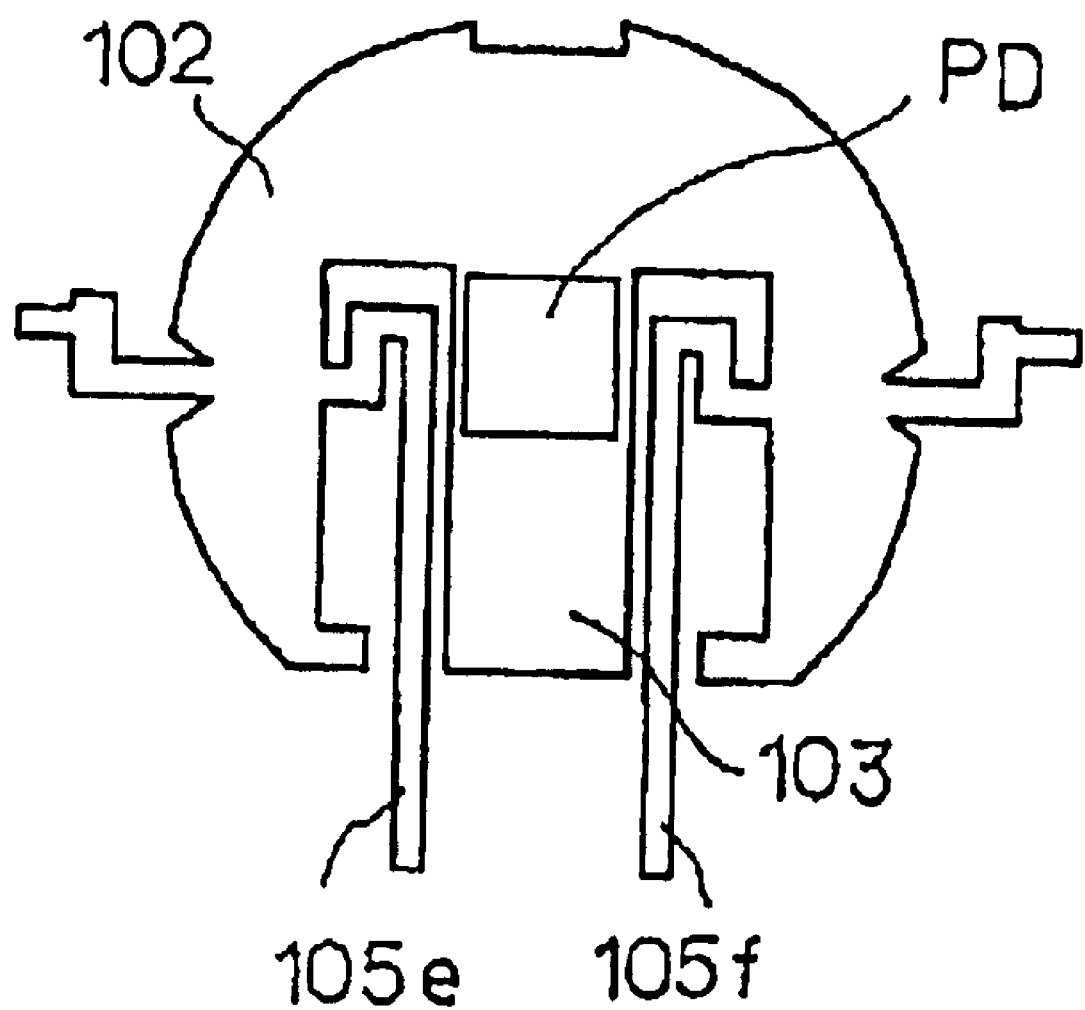
FIG. 38 is a fragmentary plan view of the lead structure mounted with the photodiode and engaged with the lead frame in the seventh embodiment in accordance with the present invention.

In the step S2, the lead frame 100-3 is further transferred from the loader unit to the die-bonding unit, so that the single photo-diode PD is mounted by the die-bonding unit onto the island 103 of the three-dimensional original form of the lead structure 101 engaged within the lead frame 100-3. FIG. 38 is a fragmentary plan view of the lead structure 101 mounted with the photo-diode PD and engaged with the lead frame 100-3. The photo-diode PD is directly mounted on the island 103. In this embodiment, the die-boning process is taken place using a hard soldering material for reducing a heat resistance.

Figure 39:
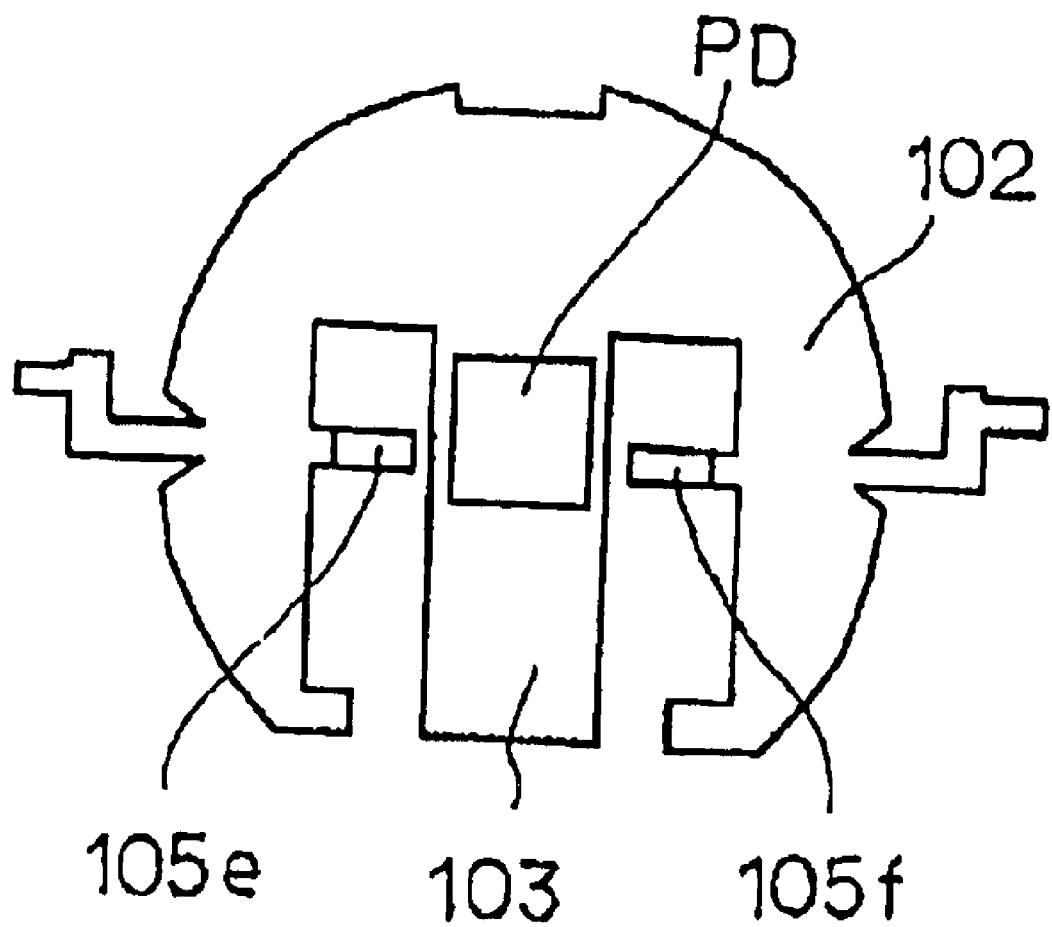
FIG. 39 is a fragmentary plan view of the lead structure mounted with the photo-diode and engaged with the lead fame in the seventh embodiment in accordance with the present invention.

In the step S3, the lead frame 100-3 is transferred from the die-bonding unit to the bending work unit, so that a part of the original form of the lead structure 101 mounted with the single photo-diode PD is bent by the bending work unit to form a three-dimensional lead structure 101. FIG. 39 is a fragmentary plan view of the lead structure 101 mounted with the photo-diode PD and engaged with the lead frame 100-3. The bending work unit bends the side leads 105e and 105f by the right angle, so that the paired side leads 105e and 105f become extending in a plan vertical to the plan of the lead frame 100-3, while flange 102 and the island 103 remain extending in the same plan as the lead frame 100-3.

Figure 40:
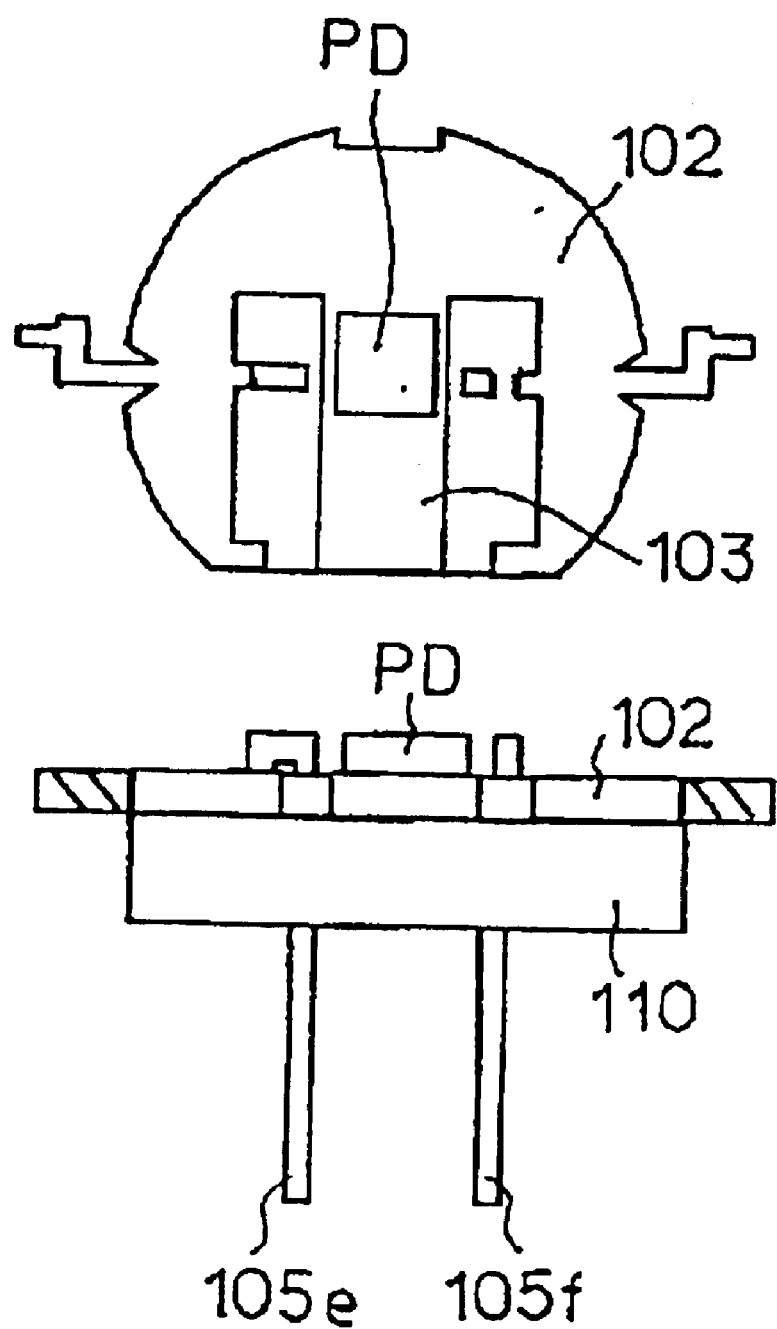
FIG. 40 is a fragmentary plan view illustrative of the lead structure with the insulating base and engaged with the lead frame in the seventh embodiment in accordance with the present invention.

In the step S4, the lead frame 100-3 with the three dimensional lead structure 101 is transferred from the bending work unit to the resin molding unit, so that a resin molding process is taken place by the resin molding unit to form the insulating base 110 which supports the three-dimensional lead structure 101. FIG. 40 is a fragmentary plan view illustrative of the lead structure 101 with the insulating base 110 and engaged with the lead frame 100-3. The lead frame 100-3 with the three dimensional lead structure 101 is set in molding dies for taking place a molding process with an electrically insulating resin. A pair of the molding dies move in opposite directions which are vertical to the plan of the lead frame 100-3 and perpendicular to a longitudinal direction of the lead frame 100-3 without causing any physical interference with the lead frame 100-3, so that the paired molding dies sandwich the flange 102, thereby to form a cavity in one side of the flange 102, while the island 103 is positioned in the opposite side thereto.

An electrically insulating resin is injected into a cavity defined by the paired molding dies which sandwich the flange 102 for carrying out the resin molding process, whereby the insulating base 110 of the electrically insulating resin material is formed on the one side of the flange 102. The insulating base 110 has the generally flat cylinder shape with the orientation flat. The flange 102 is present on the surface of the insulating base 110. The insulating base 110 provides a sufficient mechanical strength to the flange 102. Further, the insulating base 110 supports the paired side leads 105*e* and 105*f*, so that the paired side leads 105*e* and 105*f* are electrically separated by the insulating base 110 from each other and from the flange 102, wherein each of the paired side leads 105*e* and 105*f* has an inner projecting part which projects from the one surface of the insulating base 110 toward the same side as the island 103 and also an outer projecting part which projects from the opposite surface of the insulating base 110 toward the opposite side to the island 103. One face of the flange 120 is in contact directly with the one face of the insulating base 110, while the opposite face of the flange 120 is exposed.

In the step S5, the lead frame 100-3 is further transferred from the molding unit to the cutting unit, so that one of the side leads 105*e* and 105*f* is cut off or removed by the cutting unit from the island 103, so that the side lead 105*f* is separated from the island 103.

Figure 41:
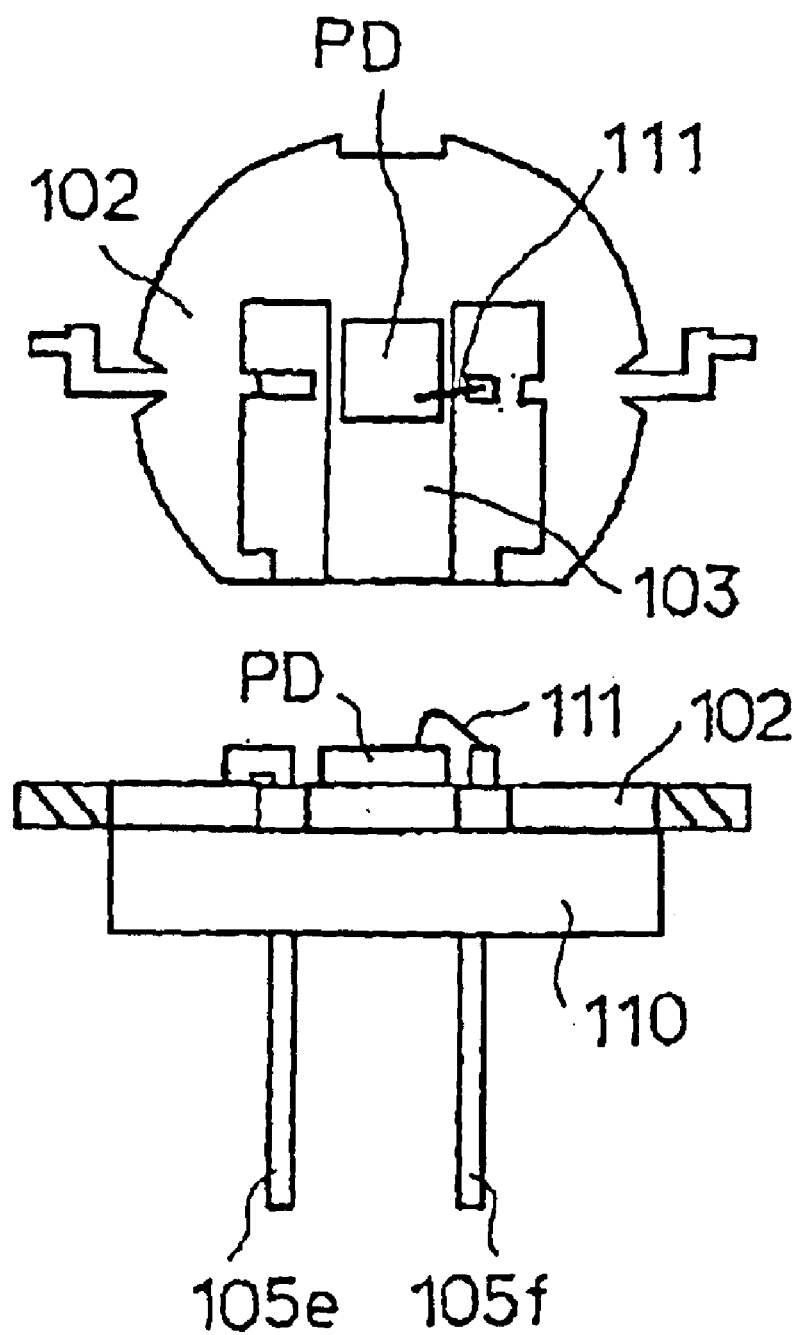
FIG. 41 is a fragmentary plan view illustrative of the lead structure with the wire-bonding between the photodiode and the side lead and engaged with the lead frame in the seventh embodiment in accordance with the present invention.

In the step S6, the lead frame 100-3 is further transferred from the cutting unit to the wire-bonding unit, so that the photo-diode PD is wire-bonded through a metal wiring to the side lead 105*f*. FIG. 41 is a fragmentary plan view illustrative of the lead structure 101 with the wire-bonding between the photo-diode PD and the side lead 105*f* and engaged with the lead frame 100-3. The single photo-diode PD is electrically connected to the inner projecting part of the side lead 105*f* through still another metal wiring 111 by the wire-bonding process.

In the step S7, the lead frame 100-3 with a plurality of the lead structure 101 is further transferred from the wire-bonding unit to the separating unit, so that a plurality of the lead structure 101 are separated from the frame of the lead frame 100-3. The temporary supporting connections 108 are cut off or removed from the lead frame 100-3, so that the plural lead structures 101 are separated from the frame of the lead frame 100-3.

Figure 42:
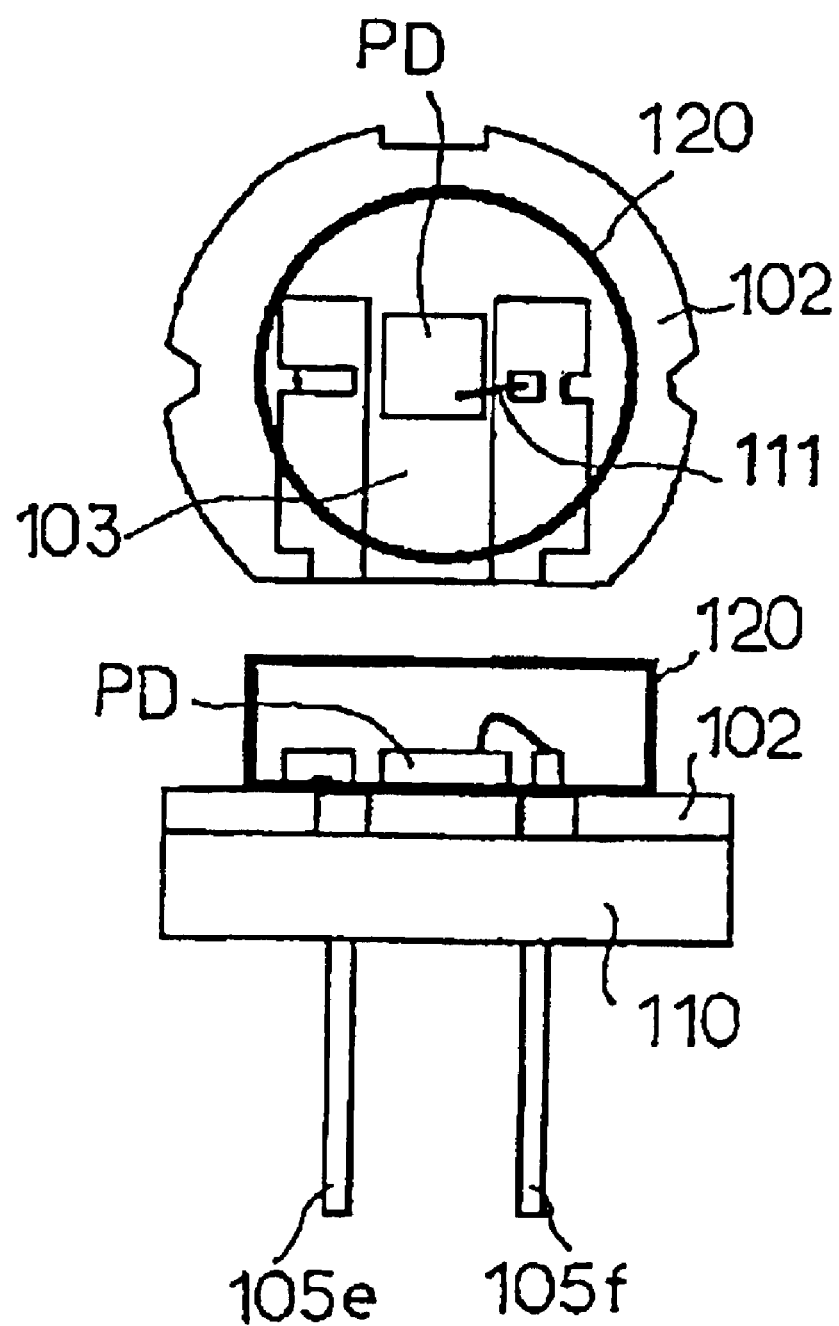
FIG. 42 is one side view of the semiconductor light receiving device assembly in the seventh embodiment in accordance with the present invention.

In the step S8, the lead frame 100-3 is transferred from the separating unit into the cap mounting unit, so that the cap 120 is mounted or adhered by the cap mounting unit onto the lead structure 101 with the insulating base 110 as separated from the frame of the lead frame 100-3, thereby to form a plurality of semiconductor light receiving device assembly as separated from the frame of the lead frame 100-3. FIG. 42 is one side view of the semiconductor light receiving device assembly. The cap 120 may have a cylinder shape with an opening side periphery which is aligned to the inside of the periphery of the insulating base 110, so that the opening side periphery of the cap 120 is adhered to the inside of the periphery of the flange 102 via an adhesive, whereby the periphery of the flange 102 or the periphery of the insulating base 110 is present outside the cap 120. The cap 120 also has an opening window 121 which has a circle-shape.

In the step S9, the plural semiconductor light receiving device assemblies are transferred from the separating unit to the unloader unit, so that a plurality of the semiconductor light receiving device assembly is unloaded or picked up from the unloader unit.

As described above, in accordance with the fabrication processes of the present invention, the lead frame 100-3 including the plural lead structures 101 is subjected to the sequential batch-processes, for example, the die-bonding process, the bending process, the resin-molding process, the cutting process, the wire-bonding process and the separating process, while each of the plural lead structures 101 is then subjected to the cap-mounting process. The above sequential batch-processes are taken place by using alignment holes of the lead frame 100-3 for carrying the lead frame 100-3nd positioning the lead structures 101. This allows an almost automated batch-assembling process for assembling the semiconductor light receiving devices. This automated batch-assembling process realizes a desired increase in the productivity of the semiconductor light receiving device of the high quality or the high performances.

The assembled semiconductor light receiving device has a can-shaped package. This allows applications of the semiconductor light receiving device to a variety of the existent optical equipments.

Further, the assembled semiconductor light receiving device has the above-described single-united lead structure which comprises the island 103, the side lead 105*e* and the flange 102. The single-united lead structure is processed from the single metal plate or sheet through the above-described sequential batch-processes. Namely, the island 103, the side lead 105*e*, and the flange 102 are in the single-united from.

Furthermore, the island 103 and the flange 102 are in the single-united form. This makes it easy to realize a highly accurate relative-positioning of the photodiode PD with reference to the flange 102. A peripheral surface of the flange 102 is made into contact directly with a reference plane of the optical equipment for mounting the assembled semiconductor light receiving device on the optical equipment. This realizes a highly accurate positioning of the semiconductor light receiving device with reference to a position of the light source of the optical equipment.

In this embodiment, the lead frame 100-3 is subjected to the bending process for bending a part of the two-dimensional original form of the lead structure 101 to form the three-dimensional lead structure 101. A metal material for the lead frame 100-3 or the lead structure 101 should be selected in consideration of preventing any disconnection or break at the bent part of the lead structure 101. Typical examples of the available metal materials for the lead structure 101 or the lead frame 100-3 may include, but not limited to, 42-alloy, aluminum, and aluminum alloys, in addition to copper.

The respective shapes and dimensions of the lead frame 100-3, the flange 102, the island 103, and the paired side leads 105*e* and 105*f* are optional.

The cap 120 may optionally have a condensing lens on the opening window 121 to seal an inner space of the cap 120.

The semiconductor light receiving device may optionally be free of any cap.

One or more optical semiconductor elements mounted on the island 103 should not be limited to the photo-diode PD.
Eighth Embodiment:

An eighth embodiment according to the present invention will be described in detail with reference to the drawings. A small-size semiconductor laser device of this embodiment has the same structure as that in the first embodiment and shown in FIG. 4, except that the flange 102 has an opening side. Namely, the small-size semiconductor laser device includes the insulating base 110, the lead structure 101, the photo-diode PD and the cap 120. The resin base 110 may have the generally disk shape or the flat cylinder shape with the orientation flat which is parallel to the first horizontal direction. The insulating base 110 serves to support the lead structure 101 or provides the mechanical strength to the lead structure 101, and also provide the electrical insulation to the lead structure 101. The insulating base 110 may comprise the insulation resin material. The insulating base 110 may be formed by the molding process.

The lead structure 101 is formed from the metal plate or the metal sheet through either the press working process or the etching process. The metal plate or the metal sheet are proceeded to form a lead frame 100-4, from which the lead structure 101 is cut.

Figure 43:
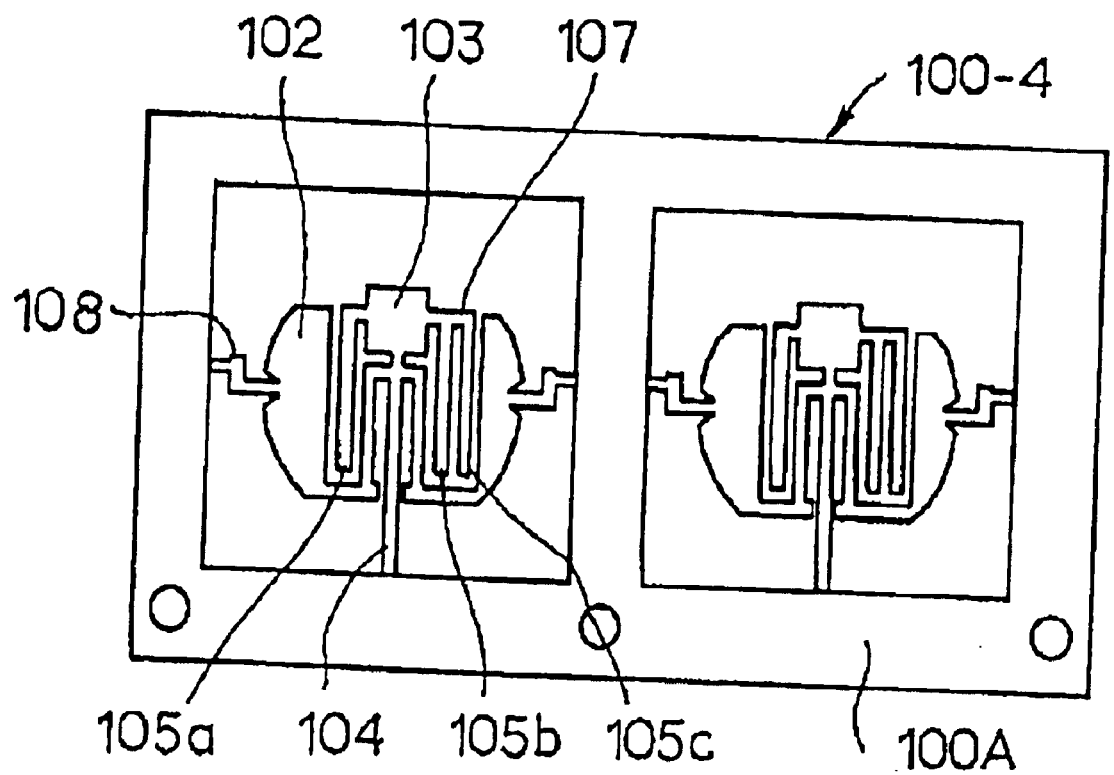
FIG. 43 is a fragmentary plan view illustrative of a lead frame including a plurality of lead structures in the eighth embodiment in accordance with the present invention.

The lead structure 101 comprises a flange 102, an island 103, a single center lead 104, plural side leads 105a, 105b and 105c and connection parts 106. The flange 102, the island 103, the single center lead 104 and the connection parts 106 comprise a single united part of the lead structure 101. Namely, the flange 102, the island 103, the single center lead 104 and the connection parts 106 are unitary formed and made of the same conductive material such as a metal. The flange 102 has an opening side, in which the island 103 is not surrounded by the flange 102. FIG. 43 is a fragmentary plan view illustrative of a lead frame 100-4 including a plurality of lead structures 101.

The two laser diodes LD1 and LD2 and the single photo-diode PD are mounted on the island 103 by die-bonding processes. The laser diode LD1 is electrically connected to the inner projecting part of the side lead 105a through a metal wiring by a wire-bonding process. The laser diode LD2 is also electrically connected to the inner projecting part of the side lead 105c through another metal wiring by the wire-bonding process. The single photo-diode PD is also electrically connected to the inner projecting part of the side lead 105b through still another metal wiring by the wire-bonding process. In this embodiment, the two laser diodes LD1 and LD2 are mounted on the single photo-diode PD which is mounted on the island 103. The two laser diodes LD1 and LD2 emit laser beams different in wavelength from each other. For example, the laser diode LD1 emits a laser beam for a CD, while the laser diode LD2 emits another laser beam for a DVD. The photo-diode PD receives the laser beams emitted from the two laser diodes LD1 and LD2 for monitoring the same.

The cap 120 is provided over the upper surface of the insulating base 110 for covering the lead structure 101 over the insulating base 110. The cap 120 may have a rectangle shape.

The above-described small-size semiconductor laser device 1 may be fabricated as follows. The above unique structure of the small-size semiconductor laser device 1 allows batch-fabrication-processes for a plurality of the small-size semiconductor laser device 1 by using a lead frame 100-4. This lead frame 100-4 is different from that in the first embodiment. A lead frame 100-4 extends in a two-dimensional space. The lead frame 100-4 may be formed through a press-working process or an etching process from a metal plate or a metal sheet. The lead frame 100-4 includes a frame and an alignment of plural original forms of the above-described lead structure 101, each of which is supported by the frame via temporary supporting connections 108 which connects the original form of the lead structure 101 to the frame. The original form of the lead structure 101 also extends in the two-dimensional space.

The original form of the lead structure 101 includes the flange 102, the island 103, the single center lead 104, the plural side leads 105a, 105b and 105c, and the connection parts 106, and further temporary connection parts 107 which connect the plural side leads 105a, 105b and 105c to the island 103 but only when the lead structure 101 is engaged with the lead frame 100-4. The original form of the lead structure 101 of the two-dimensional structure is deformed into the three-dimensional structure. The island 103 is positioned on the open side of the flange 102. The single center lead 104 extends from the bottom side of the island 103 to one side of the frame 100A of the lead frame 100-4. The connection parts 106 connect two ends of the flange 102 to the single center lead 104. The temporary connection parts 107 connect the plural side leads 105a, 105b and 105c to the island 103. The plural side leads 105a, 105b and 105c extend in parallel to each other and also to the single center lead 104. The plural side leads 105a, 105b and 105c are terminated so as to form a gap or a distance from the first parts of the connection parts 106. The flange 102 is connected to or supported by the lead frame 100-4 through a pair of the temporary supporting connections 108, each of which has a generally crank-shape. After the lead structure 101 of the three-dimensional structure is established over the insulating base 110, then the temporary connection parts 107 are then cut or removed from the lead structure 101, so that the plural side leads 105a, 105b and 105c are separated from the island 103. As well illustrated in FIG. 43, the original form of the lead structure 101 is just the two-dimensional pattern.

The fabrication apparatus for fabricating the small-size semiconductor laser devices include plural units which perform respective processes as follows. The fabrication apparatus includes a loader unit which supplies the lead frame 100-4, a part of which is shown in FIG. 43. In a step S1, the lead frame 100-4 is loaded by the loader unit to the fabrication apparatus.

The fabrication apparatus also includes a die-bonding unit taking place a die-bonding process for mounting the laser diodes LD1 and LD2 and the single photo-diode PD onto the island 103 of the original form of the lead structure 101 engaged within the lead frame 100-4. In a step S2, the laser diodes LD1 and LD2 and the single photo-diode PD are mounted by the die-bonding unit onto the island 103 of the original form of the lead structure 101 engaged within the lead frame 100-4.

The fabrication apparatus also includes a bending work unit for bending a part of the original form of the lead structure 101 mounted with the laser diodes LD1 and LD2 and the single photo-diode PD to form a three-dimensional lead structure 101. In a step S3, a part of the original form of the lead structure 101 mounted with the laser diodes LD1 and LD2 and the single photo-diode PD is bent by the bending work unit to form a three-dimensional lead structure 101.

The fabrication apparatus also includes a resin molding unit for taking place a resin molding process to form the insulating base 110 which supports the three-dimensional lead structure 101. In a step S4, a resin molding process is taken place by the resin molding unit to form the insulating base 110 which supports the three-dimensional lead structure 101.

The fabrication apparatus also includes a cutting unit for cutting off or removing the temporary connection parts 107 from the three-dimensional lead structure 101 supported on the insulating base 110, so that the plural side leads 105a, 105b and 105c are separated from the island 103. In a step S5, the temporary connection parts 107 are cut off or removed by the cutting unit from the three-dimensional lead structure 101 supported on the insulating base 110, so that the plural side leads 105a, 105b and 105c are separated from the island 103.

The fabrication apparatus also includes a wire-bonding unit for taking place a wire-bonding process for connecting the laser diodes LD1 and LD2 and the photo-diode PD through metal wirings to the plural side leads 105a, 105b and 105c. In a step S6, the laser diodes LD1 and LD2 and the photo-diode PD are wire-bonded by the wire-bonding unit through metal wirings to the plural side leads 105a, 105b and 105c.

The fabrication apparatus also includes a separating unit for separating the three-dimensional lead structure 101 with the wire-bondings from the frame 100A of the lead frame 100-4. In a step S7, the three-dimensional lead structure 101 with the wire-bondings are separated by the separating unit from the frame 100A of the lead frame 100-4.

The fabrication apparatus also includes a cap mounting unit for mounting and adhering the cap 120 onto the separated lead structure 101 with the insulating base 110, thereby to form a semiconductor laser device assembly. In a step S8, the cap 120 is mounted or adhered by the cap mounting unit onto the lead structure 101 with the insulating base 110 as separated from the frame 100A of the lead frame 100-4, thereby to form a semiconductor laser device assembly.

The fabrication apparatus also includes an unloader unit for unloading or picking up the semiconductor laser device assembly from the fabrication apparatus. In a step S9, the semiconductor laser device assembly is unloaded or picked up by the unloader unit from the fabrication apparatus.

The above sequential processes will be described again but more details with reference to drawings.

In the step S1, the lead frame 100-4 shown in FIG. 43 is loaded by the loader unit to the die-bonding unit.

In the step S2, the laser diodes LD1 and LD2 and the single photo-diode PD are mounted by the die-bonding unit onto the island 103 of the two-dimensional original form of the lead structure 101 engaged within the lead frame 100-4. The photo-diode PD is directly mounted on the island 103, and the laser diodes LD1 and LD2 are mounted on the photo-diode PD. In this embodiment, the die-boning process is taken place using a hard soldering material for reducing a heat resistance.

Figure 44:
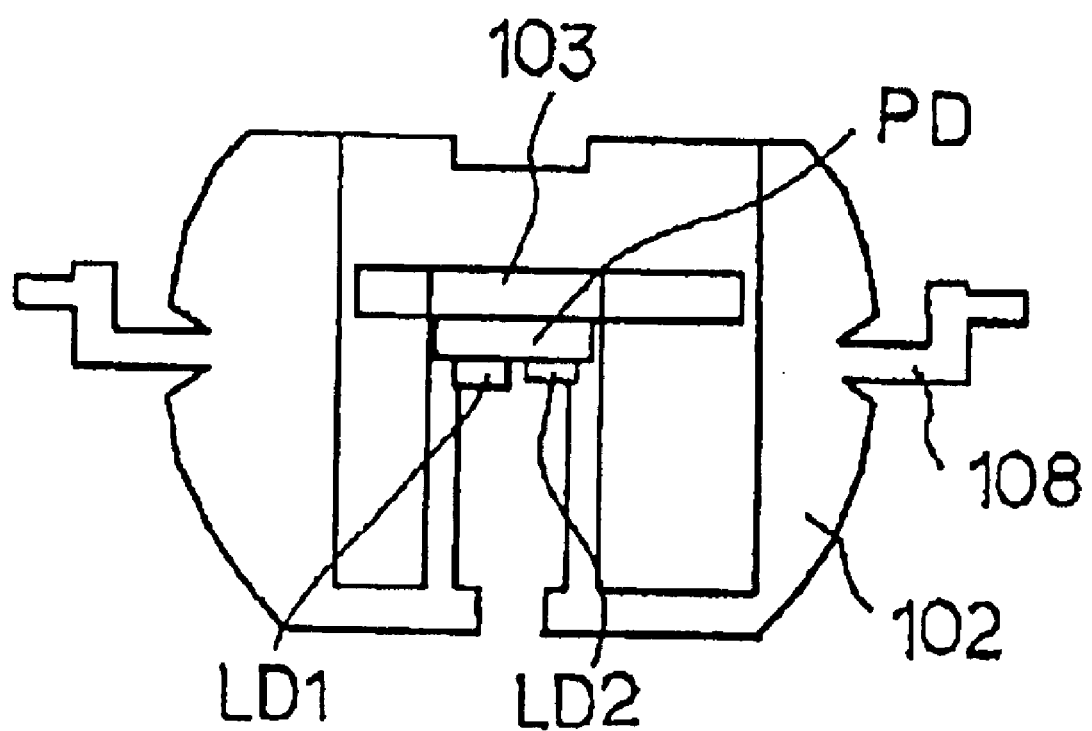
FIG. 44 is a fragmentary plan view illustrative of the lead frame having the three-dimensional original form of the lead structure in the eighth embodiment in accordance with the present invention.

In the step S3, the lead frame 100-4 is transferred from the die-boning unit to the bending work unit, so that a part of the original form of the lead structure 101 mounted with the laser diodes LD1 and LD2 and the single photo-diode PD is bent by the bending work unit to form a three-dimensional lead structure 101. FIG. 44 is a fragmentary plan view illustrative of the lead frame 100-4 having the three-dimensional original form of the lead structure 101. The bending work unit bends boundaries between the second and third parts of the connection parts 106 by the right angle, so that the island 103, the single center lead 104, the plural side leads 105a, 105b and 105c, the third parts of the connection parts 106 and the temporary connection parts 107 become extending in a plan vertical to the plan of the lead frame 100-4, while the flange 102 and the first and second parts of the connection parts 106 remain extending in the same plan as the lead frame 100-4.

In the step S4, the lead frame 100-4 with the three dimensional lead structure 101 is transferred from the bending work unit to the resin molding unit, so that a resin molding process is taken place by the resin molding unit to form the insulating base 110 which supports the three-dimensional lead structure 101. The lead frame 100-4 with the three dimensional lead structure 101 is set in molding dies for taking place a molding process with an electrically insulating resin.

An electrically insulating resin is injected into a cavity defined by the paired molding dies which sandwich the flange 102 for carrying out the resin molding process, whereby the insulating base 110 of the electrically insulating resin material is formed on the one side of the flange 102. The insulating base 110 has the generally flat cylinder shape with the orientation flat. The flange 102 is present on the surface of the insulating base 110. The insulating base 110 provides a sufficient mechanical strength to the flange 102. Further, the insulating base 110 supports the single center lead 104 and the plural side leads 105a, 105b and 105c, so that the single center lead 104 and the plural side leads 105a, 105b and 105c are electrically separated by the insulating base 110 from each other and from the flange 102, wherein each of the single center lead 104 and the plural side leads 105a, 105b and 105c has an inner projecting part which projects from the one surface of the insulating base 110 toward the same side as the island 103 and also an outer projecting part which projects from the opposite surface of the insulating base 110 toward the opposite side to the island 103. One face of the flange 120 is in contact directly with the one face of the insulating base 110, while the opposite face of the flange 120 is exposed.

In the step S5, the lead frame 100-4 is further transferred from the resin molding unit to the cutting unit, so that the temporary connection parts 107 are cut off or removed from the three-dimensional lead structure 101 supported on the insulating base 110. The plural side leads 105a, 105b and 105c are mechanically and electrically separated from the island 103, while the plural side leads 105a, 105b and 105c remain supported by the insulating base 110. The single center lead 104 remains connected with the island 103 and also connected through the connection parts 106 to the flange 102.

In the step S6, the lead frame 100-4 is further transferred from the cutting unit to the wire-bonding unit, so that the laser diodes LD1 and LD2 and the photo-diode PD are wire-bonded through metal wirings to the plural side leads 105a, 105b and 105c. FIG. 11 is a fragmentary plan view illustrative of the lead frame 100-4 having the three-dimensional original form of the lead structure 101 with the insulating base 110 and the wire-bondings. The plural side leads 105a, 105b and 105c extend in the same plan as the island 103. This allows the existent wire-bonding technique to be applied. The laser diode LD1 is electrically connected to the inner projecting part of the side lead 105a through a metal wiring 111 by a wire-bonding process. The laser diode LD2 is also electrically connected to the inner projecting part of the side lead 105c through another metal wiring 111 by the wire-bonding process. The single photo-diode PD is also electrically connected to the inner projecting part of the side lead 105b through still another metal wiring 111 by the wire-bonding process.

In the step S7, the lead frame 100-4 is further transferred from the wire-bonding unit to the separating unit, so that the three-dimensional lead structure 101 with the wire-bondings and the insulating base 110 are separated from the frame 100A of the lead frame 100-4. The temporary supporting connections 108 are cut off or removed from the lead frame 100-4, so that the three-dimensional lead structure 101 with the wire-bondings and the insulating base 110 are separated from the frame 100A of the lead frame 100-4. The foregoing descriptions have focused onto only one of the lead structures 101 engaged with the lead frame 100-4, even the plural lead structures 101 are concurrently formed in the above batch-processes.

Figure 45:
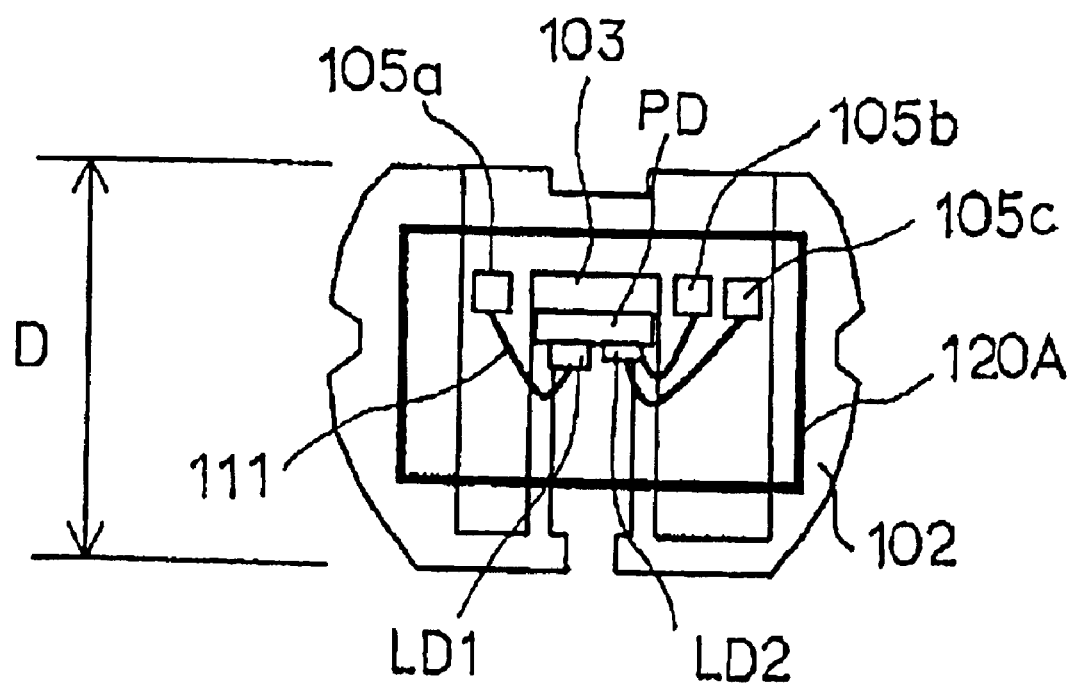
FIG. 45 is a plane view of the semiconductor laser device assembly in the eighth embodiment in accordance with the present invention.

In the step S8, each of the plural lead structures 101 is transferred into the cap mounting unit, so that the cap 120 is mounted or adhered by the cap mounting unit onto the lead structure 101 with the insulating base 110 as separated from the frame 100A of the lead frame 100-4, thereby to form a semiconductor laser device assembly. FIG. 45 is a plane view of the semiconductor laser device assembly. The cap 120 is provided over the upper surface of the insulating base 110 for covering the lead structure 101 over the insulating base 110.

In the step S9, the optical semiconductor laser device assembly is transferred from the cap mounting unit to the unloader unit, so that the semiconductor laser device assembly is unloaded or picked up from the unloader unit.

As described above, in accordance with the fabrication processes of the present invention, the lead frame 100-4 including the plural lead structures 101 is subjected to the sequential batch-processes, for example, the die-bonding process, the bending process, the resin-molding process, the cutting process, the wire-bonding process and the separating process, while each of the plural lead structures 101 is then subjected to the cap-mounting process. The above sequential batch-processes are taken place by using alignment holes of the lead frame 100-4 for carrying the lead frame and positioning the lead structures 101. This allows an almost automated batch-assembling process for assembling the semiconductor laser devices. This automated batch-assembling process realizes a desired increase in the productivity of the semiconductor laser device of the high quality or the high performances.

The flange 102 has the modified shape which has the open side, in which the island 103 is positioned when the lead structure 101 is in the two-dimensional form and engaged in the lead frame 100-4. This modified shape has a reduced dimension D or a reduced width as shown in FIG. 45. This provides a flexibility or freedom to the height of the box-shaped case, in which the semiconductor laser is provided.

Optionally, it is possible to bend the leads to the direction parallel to the plane of the flange 102, so as to realize a thin semiconductor laser device.

Although the invention has been described above in connection with several preferred embodiments therefor, it will be appreciated that those embodiments have been provided solely for illustrating the invention, and not in a limiting sense. Numerous modifications and substitutions of equivalent materials and techniques will be readily apparent to those skilled in the art after reading the present application, and all such modifications and substitutions are expressly understood to fall within the true scope and spirit of the appended claims.

What is claimed is:

1. A semiconductor device including: an insulating base; and a lead structure which further includes:
   a flange supported on a first surface of said insulating base;
   at least a first type lead supported by said insulating base;
   at least an island for mounting at least a semiconductor element thereon, and said semiconductor element being electrically connected to said at least first type lead; and
   at least a connection part extending between said at least island and said flange,
   wherein said flange, said at least connection part, and said at least island comprise a single united part of said lead structure, and
   wherein said flange, said at least connection part, said at least island, and said at least first type lead comprise a same conductive material.

2. The semiconductor device as claimed in claim 1, wherein said at least first type lead extends in a first plane which is different from a second plane, in which said flange extends.

3. The semiconductor device as claimed in claim 1, wherein said at least island extends in a first plane which is different from a second plane, in which said flange extends.

4. The semiconductor device as claimed in claim 1, wherein said at least first type lead and said at least island extend in a first plane which is different from a second plane, in which said flange extends.

5. The semiconductor device as claimed in claim 4, further including at least a second type lead which extends from said at least island,
   wherein said at least second type lead, said flange, said at least connection part, and said at least island comprise a single united part of said lead structure, and
   wherein said at least second type lead, said flange, said at least connection part, said at least island, and said at least first type lead comprise a same conductive material.

6. The semiconductor device as claimed in claim 5, wherein said at least second type lead, said at least first type lead, and said at least island extend in said first plane.

7. The semiconductor device as claimed in claim 6, wherein said first plane is generally vertical to said second plane.

8. The semiconductor device as claimed in claim 7, wherein each of said at least first type lead and said at least second type lead completely penetrates said insulating base, so that each of said at least first type lead and said at least second type lead has an inner projecting part which projects from said first surface of said insulating base and an outer projecting part which projects from a second surface of said insulating base.

9. The semiconductor device as claimed in claim 8, wherein said inner projection part of said at least second type lead extends from one side of said at least island, and said inner projection part of said at least first type lead is wire-bonded to said at least semiconductor element mounted on said at least island.

10. The semiconductor device as claimed in claim 9, wherein said flange has a peripheral shape which comprises a modified circle with a single straight side.

11. The semiconductor device as claimed in claim 9, wherein said flange has a peripheral shape which comprises a modified circle with two straight sides which are positioned at diametrically opposite sides.

12. The semiconductor device as claimed in claim 9, further including a cap having a peripheral edge which is positioned inside of a peripheral region of said flange.

13. The semiconductor device as claimed in claim 12, wherein said at least semiconductor device is an optical semiconductor device, and said cap has a window on an optical axis of said optical semiconductor device for allows a transmission of light from or to said optical semiconductor device.

14. The semiconductor device as claimed in claim 13, wherein said cap has a cylinder shape.

15. The semiconductor device as claimed in claim 13, wherein said cap has a half cylinder shape.

16. The semiconductor device as claimed in claim 1, wherein said insulating base comprises a resin material, and said lead structure comprises a metal material.

17. The semiconductor device as claimed in claim 1, wherein said at least semiconductor element includes at least one of a light emitting diode, a laser diode and a photo-diode.

18. A semiconductor device including: an insulating base; and a three-dimensional lead structure which has been processed from a two-dimensional lead structure comprising a single electrically conductive plate, and said three-dimensional lead structure further including:
   a flange supported on a first surface of said insulating base;
   at least a first type lead supported by said insulating base;

at least an island for mounting at least a semiconductor element thereon, and said semiconductor element being electrically connected to said at least first type lead; and at least a connection part extending between said at least island and said flange, wherein said flange, said at least connection part, and said at least island comprise a single united part of said lead structure, wherein said flange, said at least connection part, said at least island, and said at least first type lead comprise a same conductive material, and wherein said at least first type lead and said at least island extend in a first plane which is different from a second plane, in which said flange extends.

19. The semiconductor device as claimed in claim 18, further including at least a second type lead which extends from said at least island, wherein said at least second type lead, said flange, said at least connection part, and said at least island comprise a single united part of said lead structure, and wherein said at least second type lead, said flange, said at least connection part, said at least island, and said at least first type lead comprise a same conductive material.

20. The semiconductor device as claimed in claim 19, wherein said at least second type lead, said at least first type lead, and said at least island extend in said first plane.

21. The semiconductor device as claimed in claim 20, wherein said first plane is generally vertical to said second plane.

22. The semiconductor device as claimed in claim 21, wherein each of said at least first type lead and said at least second type lead completely penetrates said insulating base, so that each of said at least first type lead and said at least second type lead has an inner projecting part which projects from said first surface of said insulating base and an outer projecting part which projects from a second surface of said insulating base.

23. The semiconductor device as claimed in claim 22, wherein said inner projection part of said at least second type lead extends from one side of said at least island, and said inner projection part of said at least first type lead is wire-bonded to said at least semiconductor element mounted on said at least island.

24. A lead frame including: a frame; and a plurality of lead structure which further includes:

a flange;

at least a first type lead;

at least an island; and at least a connection part extending between said at least island and said flange, wherein said flange, said at least connection part, said at least island, and said at least first type lead comprise a single united pattern of a same conductive material.

25. A method of forming a lead structure supported by an insulating base of a semiconductor device, and said lead structure which further includes:

a flange supported on a first surface of said insulating base;

at least a first type lead supported by said insulating base;

at least an island for mounting at least a semiconductor element thereon, and said semiconductor element being electrically connected to said at least first type lead; and at least a connection part extending between said at least island and said flange, wherein said flange, said at least connection part, said at least island, and said at least first type lead are processed from a single two-dimensional united lead pattern of a same conductive material, which is supported in a lead frame.

26. A method of forming a semiconductor device, including the steps of:

forming a lead frame which includes a plurality of lead structures, each of which includes a flange, an island, plural leads and at least a connection part;

mounting at least one semiconductor element on said island;

bending said lead structures so that said plural leads extend in a first plane generally vertical to a second plane in which said flange extends;

forming an insulating base in contact with one face of said flange, whereby said plural leads are supported by said insulating base, and each of said plural leads having an inner projecting part which projects from a first surface of said insulating base and an outer projecting part which projects from a second surface of said insulating base;

separating at least one of said plural leads from said island and said flange;

wire-bonding said semiconductor element to said inner projecting part of said separated one of said plural leads; and separating said lead structures with said insulating bases from said lead frame.

27. The method as claimed in claim 26, wherein said insulating base is formed by a resin molding process.

28. The method as claimed in claim 26, further including the step of:

mounting a cap on each of said lead structure with said insulating base after said separating step.

29. The method as claimed in claim 26, further including the step of:

mounting caps on said lead structures with said insulating bases engaged with said lead frame before said separating step.

30. A method of forming a semiconductor device, including the steps of:

forming a lead frame which includes a plurality of lead structures, each of which includes a flange, an island, plural leads and at least a connection part;

bending said lead structures so that said plural leads extend in a first plane generally vertical to a second plane in which said flange extends;

mounting at least one semiconductor element on said island;

forming an insulating base in contact with one face of said flange, whereby said plural leads are supported by said insulating base, and each of said plural leads having an inner projecting part which projects from a first surface of said insulating base and an outer projecting part which projects from a second surface of said insulating base;

separating at least one of said plural leads from said island and said flange;

wire-bonding said semiconductor element to said inner projecting part of said separated one of said plural leads; and separating said lead structures with said insulating bases from said lead frame.

31. The method as claimed in claim 30, wherein said insulating base is formed by a resin molding process.

32. The method as claimed in claim 30, further including the step of:

mounting a cap on each of said lead structure with said insulating base after said separating step.

33. The method as claimed in claim 30, further including the step of:

mounting caps on said lead structures with said insulating bases engaged with said lead frame before said separating step.

* * * * *